United States Patent [19]

Terada et al.

[11] Patent Number: 5,297,096
[45] Date of Patent: Mar. 22, 1994

[54] NONVOLATILE SEMICONDUCTOR MEMORY DEVICE AND DATA ERASING METHOD THEREOF

[75] Inventors: Yasushi Terada; Takeshi Nakayama; Shinichi Kobayashi; Yoshikazu Miyawaki; Masanori Hayashikoshi; Tomoshi Futatsuya, all of Hyogo, Japan

[73] Assignee: Mitsubishi Denki Kabushiki Kaisha, Tokyo, Japan

[21] Appl. No.: 711,547

[22] Filed: Jun. 7, 1991

[30] Foreign Application Priority Data

Jun. 15, 1990 [JP] Japan ................... 2-158358
May 30, 1991 [JP] Japan ................... 3-127873

[51] Int. Cl.⁵ ............................ G11C 11/40
[52] U.S. Cl. ..................... 365/218; 365/185; 365/189.07; 365/900
[58] Field of Search ............ 365/218, 185, 189.07, 365/900, 230.01, 230.03

[56] References Cited

U.S. PATENT DOCUMENTS

| | | | |
|---|---|---|---|
| 4,811,294 | 3/1989 | Kobayashi et al. | 365/48 |
| 4,905,195 | 2/1990 | Fukuda | 365/189.05 |
| 5,053,990 | 10/1991 | Kreifels et al. | 365/218 |
| 5,065,364 | 11/1991 | Atwood et al. | 365/900 |
| 5,095,461 | 3/1992 | Miyakawa et al. | 365/900 |
| 5,122,985 | 6/1992 | Santin | 365/218 |
| 5,172,338 | 12/1992 | Mehrotra et al. | 365/900 |

OTHER PUBLICATIONS

Seki et al., "An 80ns 1Mb Flash Memory with On-Chip Erase/Erase-Verify Controller", Digest of Technical Papers, 1990 IEEE International Solid-State Circuits Conference (Feb. 14, 1990), pp. 60-61.
Chen et al., "Subbreakdown Drain Leakage Current in MOSFET", IEEE Electron Device Letters, vol. ED-L-8, No. 11 (Nov. 1987), pp. 515-517.
Kume et al., "A Flash-Erase EEPROM Cell with an Asymmetric Source and Drain Structure", IEEE Technical Digest, IEDM (1987) 25.8, pp. 560-563.
Kynett et al., "All In-System Reprogrammable 32KK8 CMOS Flash Memory", IEEE Journal of Solid-State Circuits, vol. 23, No. 5 (Oct. 1988), pp. 1157-1163.
Kynett et al., "A 90-ns One-Million Erase/Program Cycle 1-Mbit Flash Memory", IEEE Journal of Solid-State Circuits, vol. 24, No. 5 (Oct. 1989), pp. 1259-1264.

Primary Examiner—Timothy P. Callahan
Attorney, Agent, or Firm—Lowe, Price, LeBlanc & Becker

[57] ABSTRACT

A flash EEPROM including a memory cell array divided into first and second blocks. Erase pulse applying circuits for applying erase pulses to memory cells and erase verifying circuits for erase-verifying the memory cells are provided one for each of those two blocks. The erase pulse applying circuit and the erase verifying circuit provided corresponding to the first block operate separately from the erase pulse applying circuit and the erase verifying circuit provided corresponding to the second block. The erase pulse applying circuits are each controlled by their corresponding erase verifying circuits. That is, each erase verifying circuit enables its corresponding erase pulse applying circuit only when detecting a memory cell in which a data erase is incomplete in the corresponding block.

55 Claims, 24 Drawing Sheets

FIG.18
(a) OUTPUT OF HIGH VOLTAGE PULSE SOURCE 700
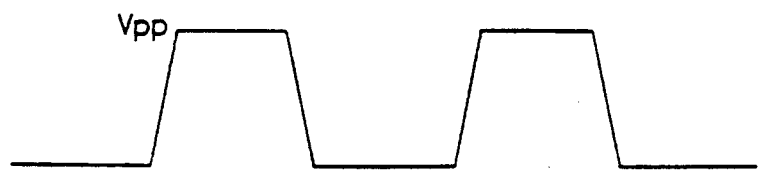
(b) ADDRESS SIGNAL (LEAST SIGNIFICANT BIT)
(c) ERASE PULSE TO SUB-ARRAYS 1a, 1b
(d) ERASE PULSES TO SUB-ARRAYS 1c, 1d

NONVOLATILE SEMICONDUCTOR MEMORY DEVICE AND DATA ERASING METHOD THEREOF

BACKGROUND OF THE INVENTION

1. Field of the Invention

The present invention relates generally to nonvolatile semiconductor memory devices and, more particularly, to a nonvolatile semiconductor memory device in which data can electrically be written and erased.

2. Description of the Background Art

There are two types of semiconductor memory devices: the one is a volatile memory such as a DRAM (Dynamic Random Access Memory), an SRAM (Static Random Access Memory) and the like, and the other is a nonvolatile memory. Storage data of a volatile memory are all erased when a power supply is OFF. Storage data of a nonvolatile memory are, however, not erased even if the power supply is OFF. As a representative of nonvolatile semiconductor memory devices, there is a PROM (programmable read only memory). The PROM is a semiconductor memory device in which information is written by a user. As one type of the PROM, there is an EEPROM (electrically erasable and programmable ROM) in which written information can electrically be erased so that information can be rewritten any times. An EEPROM in which storage data of all memory cells can be erased in block is called a flash EEPROM.

FIG. 21 is a schematic block diagram showing a fundamental structure of a conventional flash EEPROM. With reference to FIG. 21, the flash EEPROM includes a memory array 1, a row decoder 4, a Y gate 2 and a column decoder 5.

Memory array 1 includes a plurality of memory cells MC arranged in matrix in the directions of rows and columns. Each of memory cells MC is connected to a corresponding bit line 30 and a corresponding word line 50 in memory array 1. A FAMOS (floating-gate avalanche injection MOS) transistor capable of storing charges in a floating gate is employed in each memory cell MC.

FIG. 22 is a cross-sectional view showing structure of a FAMOS transistor. With reference to FIG. 22, the FAMOS transistor includes a control gate 200, a floating gate 210, N type regions 220 and 230 formed on a P type substrate 240, and an insulator layer 250. Floating gate 210 is formed on P type substrate 240 to bridge N type regions 220 and 230, with insulator layer 250 interposed therebetween. Control gate 200 is formed on floating gate 210 with insulator layer 250 interposed therebetween. Control gate 200 and floating gate 210 are both formed of polysilicon. Insulator layer 250 is formed of an oxide film such as $SiO_2$ or the like. Oxide film 250 formed between P type substrate 240 and floating gate 210 has such a small thickness as of normally approximately 100 Å. Control gate 200 is connected to a corresponding word line 50 in FIG. 21. The one N type region 220 of the two N type regions is connected as a drain of this MOS transistor to a corresponding bit line 30 in FIG. 21. The other N type region 230 is connected as a source of the MOS transistor to a source line 80 which is common to all memory cells MC in FIG. 21. P type substrate 240 is grounded.

In data writing, high voltage pulses of 12 V or less are applied to control gate 200 and drain 220 via word line 50 and bit line 30, respectively. Source 230 is grounded via source line 80. When the high voltage pulses are applied to drain 220, and source 230 is grounded, avalanche breakdown is caused, so that hot electrons are generated in the vicinity of the interface between drain 220 and P type substrate 240. Accordingly, an electric current flows in drain 220. Since the high voltage pulses are also applied to control gate 200, the hot electrons $\ominus$ are accelerated by an electric field from control gate 200 and then injected into floating gate 210 through thin oxide film 250 formed between floating gate 210 and P type substrate 240.

The electrons injected into floating gate 220 cannot escape therefrom because floating gate 210 is electrically insulated by oxide film 250. Thus, the electrons once injected into floating gate 210 do not leak out from floating gate 210 but stored therein for a long time even after a power supply is cut off. The state where the electrons are stored in floating gate 210 corresponds to data "0", and the state where no electrons are stored in floating gate 210 corresponds to data "1". Therefore, storage data of memory cells MC are held even after the power supply is cut off. If the electrons are stored in floating gate 210, a threshold voltage of the MOS transistor is raised due to the electric field from the stored electrons. That is, no inversion layer is produced in a channel region unless control gate 200 is supplied with a higher voltage than the voltage enabling an inversion layer to be formed in the channel region when no electrons are stored in floating gate 210.

In erasing of the storage data, a high voltage is applied to source 230 via source line 80, and control gate 200 is grounded via word line 50. This causes a high electric field having a higher potential on source 230 to be applied to a portion between floating gate 210 and source 230. As a result, a tunnel phenomenon occurs in oxide film 250 insulating floating gate 210 and source 230 from each other, so that a current (tunnel current) flows between floating gate 210 and source 230. That is, the electrons leak out from floating gate 210 to source 230 through oxide film 250. Accordingly, the electrons stored in floating gate 210 are removed, so that the threshold voltage of the MOS transistor is lowered. Since source line 80 is commonly connected to respective sources of memory cells MC, as shown in FIG. 21, the storage data of all memory cells MC in memory array 1 are erased in block.

In data reading, control gate 200 and drain 220 are supplied with a supply voltage (normally 5 V) and a voltage relatively close to the supply voltage via corresponding word line 50 and bit line 30, respectively. Source 230 is grounded via source line 80. If no electrons are stored in floating gate 210 (i.e., if storage data is "1"), the threshold voltage of the MOS transistor is low, so that a channel is produced between source 230 and drain 220 in response to the supply voltage applied to control gate 200. If the electrons are stored in floating gate 210 (i.e., if storage data is "0"), however, the threshold voltage of the MOS transistor is high, so that no channel occurs between source 230 and drain 220 even if the supply voltage is applied to control gate 200. Accordingly, the MOS transistor constituting the memory cell, in which the storage data is "1", is turned on in data reading, so that a current flows from corresponding bit line 30 to source line 80. Since the MOS transistor constituting the memory cell, in which the storage data is "0", is in an OFF state even in data reading, no current flows from corresponding bit line 30 to source line 80. Thus, in data reading, a sense amplifier detects whether or not the current flows through a bit line corresponding to the memory cell, from which data is to be read. A determination is made as to whether the storage data is "1" or "0", based on a result of this detection.

If a potential to be applied to bit line 30 in data reading is too high, a high electric field is applied to oxide film 250 formed between floating gate 210 and drain 220, and hence the electrons stored in floating gate 210 are drawn to the drain 220 side. Thus, the potential to be applied to bit line 30 is approximately 1-2 V. Therefore, a small current flows through the memory cell, in which the storage data is "1" in data reading. Thus, a current sense amplifier is employed to detect this small current.

With reference to FIG. 21 again, address input terminals A0-AK receive an externally applied address signal. This address signal serves to instruct which one of memory cells MC in memory array 1 data is to be read from or written in. An address buffer 6 buffers an applied address signal to apply the buffered address signal to a row decoder 4 and a column decoder 5.

An input/output buffer 9 is connected to input/output terminals I/O$_0$-I/O$_N$ for receiving input data and output data. Input/output buffer 9 applies write data which is externally applied to input/output terminals I/O$_0$-I/O$_N$ to a write circuit 7. Further, input/output buffer 9 provides data supplied from a sense amplifier 8 to input/output terminals I/O$_0$-I/O$_N$ as read data.

Write circuit 7 supplies a voltage corresponding to the write data applied from input/output buffer 9 to a Y gate 2. Sense amplifier 8 detects an output of Y gate 2 and, in response to a result of the detection, supplies a signal voltage corresponding to data "0" or "1" as read data to input/output buffer 9.

Row decoder 4 responds to the address signal from address buffer 6 to select one of word lines 50 in memory array 1. Column decoder 5 responds to the address signal from address buffer 6 to select one of bit lines 30 in memory array 1.

A control circuit 140 controls Y gate 2, column decoder 5, write circuit 7, address buffer 6, input/output buffer 9 and sense amplifier 8 so that they can perform an operation corresponding to each mode.

A terminal T$_{PP}$ is supplied with an external high voltage V$_{PP}$. A terminal T$_{CC}$ is supplied with an external supply voltage V$_{CC}$ of a normal level. A switch circuit 400 selectively outputs to predetermined circuitry one of the high voltage V$_{PP}$ and supply voltage V$_{CC}$ applied respectively to terminals T$_{PP}$ and T$_{CC}$.

Switch circuit 400 is controlled by control circuit 140 to supply the high voltage V$_{PP}$ from terminal T$_{PP}$ to row decoder 4 in data writing. Further, switch circuit 400 is controlled by control circuit 140 to apply the supply voltage V$_{CC}$ to row decoder 4 in data reading. Switch circuit 400 is further controlled by control circuit 140 to supply the high voltage V$_{PP}$ to a source line switch 3 in data erasing.

In data writing, Y gate 2 supplies the voltage applied from write circuit 7 to a bit line selected by column decoder 5. Specifically, if write data is "0", Y gate 2 supplies the high voltage V,, to the selected bit line. If the write data is "1", Y gate 2 holds a potential on the selected bit line at a ground potential. In data writing, row decoder 4 supplies the high voltage V$_{PP}$ from high voltage switch circuit 400 to a selected word line. In data writing, source line switch 3 applies the ground potential to source line 80. Therefore, if the write data is "0", the electrons generated by avalanche breakdown are injected only into floating gate 210 of a memory transistor (a selected memory transistor) located at the cross-over point between the word line selected by row decoder 4 and the bit line selected by column decoder 5. If the write data is "1", however, no electrons are injected into floating gate 210 since the voltage of control gate 200 is not boosted in the selected memory transistor.

In data reading, row decoder 4 supplies a supply voltage V$_{CC}$ applied from switch circuit 400, which is lower than the above-described high voltage V$_{PP}$, to the selected word line. In data writing, Y gate 2 supplies a low voltage of 1-2 V to the bit line selected by column decoder 5. In data reading, source line switch 3 applies a ground potential to source line 80 like the case in data writing. Accordingly, if storage data of the selected memory transistor is "1", a current flows from the selected bit line through drain 220, the channel region and source 230 of the selected memory cell to source line 80. If the storage data of the selected memory transistor is "0", the selected memory transistor is not turned on in response to a gate voltage of approximately 5 V, so that no current flows through the selected bit line. Y gate 2 supplies a supply voltage to the selected bit line and also electrically connects only the selected bit line to sense amplifier 8. This enables sense amplifier 8 to detect whether the current flowing through the selected bit line exists or not.

In data erasing, Y gate 2 maintains all bit lines 30 in memory array 1 at a lower potential (ground potential). Row decoder 4 supplies the ground potential to all word lines 50 in memory array 1, in data erasing. Source line switch 3 converts the high voltage V$_{PP}$ applied from switch circuit 400 into a pulse signal, to apply the pulse signal to source line 80. Therefore, in data erasing, a tunnel phenomenon occurs in each of all memory cells MC in memory array 1, so that the electrons stored in floating gate 210 of the memory transistor, in which the storage data is "0", are removed from floating gate 210. Accordingly, when the data erasing is completed, the storage data of all memory cells MC in memory array 1 are "1".

It is assumed in the following description that the supply potential and the ground potential correspond to a logic high level (or the H level) and a logic low level (or the L level), respectively.

As described in the foregoing, in the EEPROM, data erasing is carried out by forcing the bending of an energy band between floating gate 210 and source 230 so as to make electrons to tunnel from floating gate 210 to source 230, with a high voltage applied between control gate 200 and source 230 of the memory transistor in data erasing. Thus, the amount of electrons drawn out from floating gate 210 varies depending on the magnitude of a high voltage to be applied to source line 80, the time period in which the high voltage is applied (i.e., the pulse width of high voltage pulses), the thickness of oxide film 250 existing between floating gate 210 and source 230, the thickness of oxide film 250 existing between floating gate 210 and control gate 200, and the like.

There are irregularities in manufacture of memory transistors constituting memory array 1. Because of the irregularities, the thickness of oxide film 250, the form of control gate 200 and floating gate 210, the length of the channel region, and the like are not completely uniformed in all memory transistors. It is actually difficult to simultaneously set the storage data of all memory cells MC in memory array 1 to "1" by the above-described collective erasing, due to the irregularities on manufacture of the memory transistors and other various factors such as some causes in actual circuit configurations. More specifically, in some of the memory transistors, in which the storage data is "0", only the stored electrons are completely removed from floating gate 210 in response to a high voltage applied in collective erasing, whereas in the other memory transistors, a larger amount of electrons than those stored in data writing are drawn out from floating gate 210 in response to the high voltage applied in collective erasing. The phenomenon of the latter case, in which the electrons are excessively drawn out from the floating gate, is called an excess erase.

When an excess erase occurs, floating gate 210 is charged to plus, so that an inversion layer is produced between source 230 and drain 220. This means that this memory transistor is in an ON state even if any potential of 0 V or more is applied to control gate 200. As a result, in data reading, a current flows through a bit line corresponding to this memory transistor despite the fact that the transistor is in a non-selection state. Thus, if a memory cell connected to the bit line corresponding to the memory transistor subjected to the excess erase is selected, read data is "1" even in case where storage data of the selected memory transistor is "0". In data writing, if data "0" is intended to be written in the excess-erased memory cell or the memory cell connected to the same bit line as that of the excess-erased memory cell, a current flows not only through the selected memory cell but also the excess-erased memory cell, so that sufficient avalanche breakdown is not generated in the selected memory cell. Thus, electrons are not sufficiently injected into floating gate 210 of the selected memory cell. Accordingly, if the excessively erased memory cell exists, writing characteristics in data writing deteriorate, and further, data writing is disabled. As described above, the excess erase causes troubles in data reading and data writing.

In order to prevent such an excess erase, the following method is adopted at present. That is, the pulse width of a high voltage pulse (hereinafter referred to as erase pulse) to be applied to source line 80 for data erasing is made smaller. Every time this erase pulse having the shorter pulse width is applied to source 80 once, the storage data of all the memory cells in memory array 1 are read, so as to check whether or not all the storage data of memory cells MC in memory array 1 are "1". If there is even one memory cell in which the storage data is not "1", the erase pulse of the shorter pulse width is again applied to source line 80. The confirmation as to whether or not the storage data of the memory cells are "1" after the erase pulse is applied to source line 80, i.e., whether or not the storage data of the memory cells are completely erased, is called erase verifying. Such erase verification and such application of the erase pulse to source line 80 are repeated until the data erasing is completed with respect to all memory cells MC in memory array 1. FIG. 23 is a block diagram showing configuration of a flash EEPROM in which an excess erase is prevented by such a method. This flash EEPROM is stated in *ISSCC Digest of Technical Papers* (1990), pp. 60-61 and *Electronic Information Communication Society Technical Research Papers* (*May* 21, 1990), pp. 73-77.

With reference to FIG. 23, this flash EEPROM includes an erase control circuit 11 for performing erase verification. Erase control circuit 11 is connected to a source line switch 3, a row decoder 4, a column decoder 5, an address buffer 6, a sense amplifier 8 and a mode control circuit 10. An internal configuration of erase control circuit 11 is shown in detail in FIG. 24. FIG. 25 is a circuit diagram showing the structure of a memory array 1 and Y gate 2 and the connecting relation between memory array 1 and Y gate 2 and peripheral circuits in case where memory array 1 includes 9 memory transistors arranged in matrix of 3 rows and 3 columns by way of example. FIG. 26 is a timing chart showing an operation of this flash EEPROM in data erasing. A description will now be made of the structure and operation of the flash EEPROM mainly in data erasing, with reference to FIGS. 24-26.

With reference to FIG. 24, erase control circuit 26 includes a command signal latch circuit 112, a sequence control circuit 113, a verify voltage generator 114 and a voltage switch 115. Command signal latch circuit 112 receives only a status polling command signal of control signals to be applied from mode control circuit 10, the signal indicating that this flash EEPROM enters in an erase mode. Sequence control circuit 113 is circuitry for controlling the generation of erase pulses and a circuit operation for erase verifying. Verify voltage generator 114 supplies a voltage of 3.4 V lower than a normal supply voltage of 5 V to voltage switch 115. In data writing, voltage switch 115 changes a high voltage $V_{PP}$ (=12 V; FIG. 1(b)) to be supplied to a selected word line and a selected bit line, normal supply voltage $V_{CC}$ (=5 V; FIG. 26(a)) and the voltage of 3.4 V to be supplied from verify voltage generator 114, in data writing, normal data reading and erase verifying, so as to output those changed voltages as outputs. The outputs of voltage switch 115 are applied to row decoder 4, column decoder 5 and sense amplifier 8.

Sequence control circuit 113 includes an address counter 116, an erase/erase verifying control circuit 117, a decoder control circuit 119 and an erase pulse generator 118. Address counter 116 is controlled by command signal latch circuit 112 and erase/erase verifying control circuit 117 so as to output address signals, sequentially designating the memory cells in memory array 1 in the order of address, to address buffer 6 in a data erase mode. Erase/erase verifying control circuit 117 is controlled by command signal latch circuit 112 so as to control verify voltage generator 114, address counter 116, decoder control circuit 119 and erase pulse generator 118 in response to read data applied from sense amplifier 8. Erase pulse generator 118 is controlled by erase/erase verifying control circuit 117 so as to supply, if necessary, erase pulses having a pulse width 10 msec to source line switch 3. Decoder control circuit 119 is controlled by mode control circuit 10 and erase/erase verifying control circuit 117, to instruct row decoder 4 to output a voltage of a logic low level only during the period when erase pulses are generated from erase pulse generator 118.

Mode control circuit 10 performs a mode setting of this flash EEPROM in response to external control signals such as an erase enable signal $\overline{EE}$, a chip enable signal $\overline{CE}$, an output enable signal $\overline{OE}$, a program signal $\overline{PGM}$ and the like. Erase enable signal $\overline{EE}$ is a control signal for enabling/disabling an erasing operation of the flash EEPROM. Chip enable signal $\overline{CE}$ is a control signal for enabling/disabling an operation of this flash EEPROM chip. Output enable signal $\overline{OE}$ is a control signal for enabling/disabling a data output operation of the flash EEPROM. Program signal $\overline{PGM}$ is a control signal for enabling/disabling a data writing operation of the flash EEPROM. All of these erase enable signal $\overline{EE}$, chip enable signal $\overline{CE}$, output enable signal $\overline{OE}$ and program signal $\overline{PGM}$ are low active signals. More specifically, erase enable signal $\overline{EE}$ designates the enabling of an erasing operation when it is at a logic low level. Conversely, this signal designates the disabling of the erasing operation when it is at a logic high level. Chip enable signal $\overline{CE}$ also designates the enabling of a chip operation only when it is at a logic low level. Output enable signal $\overline{OE}$ also designates the enabling of a signal output operation only when it is at a logic low level. Program signal $\overline{PGM}$ also designates the enabling of a writing operation only when it is at a logic low level.

With reference to FIG. 26, when chip enable signal $\overline{CE}$ (FIG. 26(d)) is at a logic low level and thus this flash EEPROM chip is enabled, the flash EEPROM enters in the erase mode if erase enable signal $\overline{EE}$ (FIG. 26(g)) is held at a logic low level for a definite time period $t_{EW}$ (=50 nsec). At this time, output enable signal $\overline{OE}$ (FIG. 26(e)) and program signal $\overline{PGM}$ (FIG. 26(f)) both attain a logic high level so that externally applied data may not be written in memory array 1, and storage data of memory array 1 may not be read out to the outside. Mode control circuit 25 detects that erase enable signal $\overline{EE}$ attains a logic low level for the definite period $t_{EW}$ when output enable signal $\overline{OE}$ and program signal $\overline{PGM}$ are both at a logic high level and chip enable signal $\overline{CE}$ is at a logic low level. In response to this detection, mode control circuit 10 outputs a signal designating the erase mode to command signal latch circuit 112 and decoder control circuit 119.

In the erase mode, data "0" is first written in all the memory cells in memory array 1. A circuit operation for this writing will now be described.

When the erase mode is designated by mode control circuit 10, command signal latch circuit 112 latches an erase mode designating output of mode control circuit 10 and also applies this output to address counter 116 and erase/erase verifying control circuit 117. Address counter 116 responds to the erase mode designating output to start a counting operation to generate an address signal (FIG. 26(c)). Address counter 116 outputs an address signal indicating a subsequent address to the address indicated by the address signal that has been output so far, every time a count value thereof is incremented by one. Thus, the address signal is output from address counter 116 while being incremented each definite time. In the erase mode, address buffer 6 accepts the address signal generated from address counter 116 to apply the same to row decoder 4 and column decoder 5. Erase/erase verifying control circuit 117 responds to the applied erase mode designating output to control row decoder 4, column decoder 5 and write circuit 7. Row decoder 4 is controlled by erase/erase verifying control circuit 117 so as to select a single word line in memory array 1 in response to the address signal accepted by address buffer 6. Column decoder 5 is controlled by erase/erase verifying control circuit 117 so as to select a single bit line in memory array 1 in response to the address signal accepted by address buffer 6.

A description will now be made on the internal structure of memory array 1 and Y gate 2. With reference to FIG. 25, memory transistors MC are each provided in the corresponding cross-over points between word lines WL1-WL3 connected to row decoder 4 and bit lines BL1-BL3 connected to Y gate 2. Each of memory transistors MC has the structure shown in FIG. 22. Respective sources of all memory transistors MC are commonly connected to source line 80 connected with source line switch 3. Y gate 2 includes an I/O line 27 connected to write circuit 7 and sense amplifier 8, and N channel MOS transistors TR1-TR3 provided as transfer gates between I/O line 27 and bit lines BL1-BL3, respectively. Respective gates of transistors TR1-TR3 are connected via different connecting lines Y1-Y3 to column decoder 5. As described above, connecting lines Y1-Y3 each correspond to bit lines BL1-BL3 in the correspondence of one to one.

Row decoder 4 responds to an applied address signal to selectively output a high voltage $V_{PP}$ to any one of word lines WL1-WL3 in memory array 1. Column decoder 5 responds to an applied address signal to selectively apply a voltage of a logic high level to only one of connecting lines Y1-Y3 in Y gate 2. Accordingly, only one of transfer gates TR1-TR3, which is provided corresponding to the selected connecting line, is turned on, so that only one of bit lines BL1-BL3 corresponding to the selected connecting line is electrically connected to I/O line 27.

Write circuit 22 is controlled by erase/erase verifying control circuit 117 so as to apply a high voltage $V_{PP}$ to I/O line 27. I/O line 27 is electrically connected only to the bit line selected by column decoder 5. Thus, the high voltage $V_{PP}$ applied to I/O line 27 is applied only to the selected bit line (one of bit lines BL1-BL3). Source line switch 3 supplies a ground potential to source line 80.

As the result of such a circuit operation, electrons caused by avalanche breakdown are injected into the floating gate only in one memory transistor of memory transistors MC in memory array 1, corresponding to the address signal generated by address counter 116. The address signal applied to address buffer 6 is kept incremented by the counting operation of address counter 11 until all memory transistors MC in memory array 1 are selected. Thus, a selecting operation of row decoder 4 and column decoder 5 brings memory transistors MC in memory array 1 sequentially into a selection state in the order of address, so that the electrons are injected into the floating gate of each memory transistor. As a result, data "0" is written in all memory cells 30 in memory array 1. If the address signal supplied as an output from address counter 116 is incremented up to a final value, the data writing into memory array 1 is completed. With the data writing completed, a circuit operation for data erasing starts. A description will now be made on the circuit operation for data erasing.

First, erase/erase verifying control circuit 117 instructs erase pulse generator 118 to generate erase pulses. In response to this instruction, erase pulse generator 118 applies high voltage pulses having a predetermined pulse width of 10 msec as erase pulses to source line switch 3. Source line switch 3 applies the applied erase pulses to source line 80 of FIG. 25.

At the same time, erase/erase verifying control circuit 117 applies a signal instructing decoder control circuit 119 to start an erasing operation. In response to the applied signal, decoder control circuit 119 supplies as an output a control signal for forcing all outputs of row decoder 4 to attain a logic low level during the period when the decoder control circuit is receiving the erase pulses from erase pulse generator 118. Accordingly, word lines WL1-WL3 of FIG. 25 are supplied with a potential of a logic low level during the period when source line 80 is supplied with high voltage pulses. As a result, the tunnel phenomenon, in which the electrons injected into the floating gate in data writing are drawn out through the insulator layer to the source region, occurs in each of memory transistors MC in memory array 1.

When the application of the high voltage pulses to source line 80 is completed, a verification is made as to whether or not data "0" of all memory cells MC in memory array 1 are erased, according to the application of the high voltage pulses. That is, an erase verifying is carried out. A description will now be given of a circuit operation in erase verifying.

When the generation of the high voltage pulses from erase pulse generator 118 is completed, erase/erase verifying control circuit 117 instructs address counter 116 to start a counting operation and also instructs decoder control circuit 119 to start an erase verifying operation. Further, erase/erase verifying control circuit 117 instructs verify voltage generator 114 to generate/output a voltage of 3.4 V. Address counter 116 generates an address signal in response to the instruction from erase/erase verifying control circuit 117. Decoder control circuit 119 responds to the instruction from erase/erase verifying control circuit 117 to output a control signal for operating row decoder 4 and column decoder 5 in the same manner as in normal data reading. Verify voltage generator 114 responds to the instruction from erase/erase verifying control circuit 117 to supply the voltage of 3.4 V to voltage switch 115.

The address signal generated from address counter 116 is accepted by address buffer 6, to be applied to row decoder 4 and column decoder 5. Voltage switch 115 supplies the voltage of 3.4 V applied from verify voltage generator 114 to row decoder 4 and sense amplifier 8.

Row decoder 4 is controlled by decoder control circuit 119 to supply the voltage of 3.4 V applied from voltage switch 115 to only a single word line of word lines WL1-WL3 in memory array 1, corresponding to the address signal applied from address buffer 6, and hold potentials on the other word lines at a logic low level. Accordingly, the voltage of 3.4 V is applied to the respective control gates of all the memory transistors connected to the selected word line in memory array 1. Column decoder 5 is controlled by decoder control circuit 119 to supply a voltage of a logic high level to only one of connecting lines Y1-Y3 in Y gate 2, corresponding to the address signal applied from address buffer 6, and hold potentials on the other connecting lines at a logic low level. Thus, only one of transfer gates TR1-TR3, corresponding to the selected connecting line, is turned on in Y gate 2. As a result, only the selected bit line of bit lines BL1-BL3 is electrically connected to I/O line 27. Sense amplifier 8 is driven at the voltage of 3.4 V applied from voltage switch 115 to detect a current flowing through I/O line 27. Source line switch 3 grounds source line 80 when no erase pulses are applied from erase pulse generator 118. Thus, in erase verifying, the respective voltages of 3.4 V and 0 V are applied to the control gate and the source of the selected memory transistor in memory array 1.

If no electrons are stored in the floating gate of the selected memory transistor, i.e., if the threshold voltage of the selected memory transistor is lower than a predetermined value, the selected memory transistor is rendered conductive in response to the voltage of 3.4 V applied from row decoder 4. Thus, a current flows from I/O 27 via the selected transfer gate and the selected bit line to source line 80. The predetermined value is set for an average threshold voltage of the memory transistors, in which no data is written. Therefore, if the electrons stored in the floating gate of the selected memory transistor in data writing are completely removed in response to the foregoing erase pulses, the current flows through the selected bit line. If the electrons remain in the floating gate of the selected memory transistor, however, the threshold value of the selected transistor does not fall down to the predetermined value. Thus, the selected memory transistor is not rendered conductive in response to a gate voltage of 3.4 V applied from row decoder 4, so that no current flows through the selected bit line. Thus, if storage data of the selected memory cell is completely erased, a current flows through I/O line 27. Conversely, if the storage data of the memory cell is not completely erased, no current flows through I/O line 27.

Sense amplifier 8 operates in the same manner as in normal data reading, so as to make a determination, based on the presence/absence of the current flowing through I/O line 27, as to whether or not a current flows through the selected bit line. If no current flows through the selected bit line, then sense amplifier 8 applies a signal corresponding to data "0" as read data to erase/erase verifying control circuit 117. Conversely, if a current flows through the selected bit line, sense amplifier 8 applies a signal corresponding to data "0" as read data to erase/erase verifying control circuit 117. Erase/erase verifying control circuit 117 responds to the data applied from sense amplifier 8 being "1" to instruct address counter 116 to increment an address signal. Also, this erase/erase verifying control circuit 117 successively controls verify voltage generator 114 and decoder control circuit 119 in the same manner as so far. Further, this control circuit 117 responds to the data read by sense amplifier 8 being "0" to control erase pulse generator 118 and decoder control circuit 119 like in the previous erase pulse application so that all word lines WL1-WL3 in memory array 1 may be grounded by row decoder 4 and high voltage pulses may be applied to source line 80.

Therefore, if the storage data of the selected memory cell is "1", i.e., if the electrons are completely removed from the floating gate of the selected memory transistor, the address signal generated from address counter 116 is incremented. Then, the storage data of the memory cell corresponding to the incremented address signal is read by sense amplifier 8. Conversely, if the storage data of the selected memory cell is "0", i.e., if the electrons are not completely removed from the floating gate thereof, erase pulses are again applied to all memory transistors MC in memory array 1. As described above, erase/erase verifying control circuit 117 selectively performs, in the erase mode, a control operation for reading data from a new memory cell or a control operation for applying erase pulses again to memory array 1, in response to each of read data applied from sense amplifier 8 after data writing. More specifically, erase/erase verifying control circuit 117 detects the memory cell, in which no data is erased, based on an output of sense amplifier 8 and, in response to this detection, circuit 117 again generates the erase pulses.

Specifically, if the first erase pulse is applied to memory array 1, erase/erase verifying control circuit 117 does not instruct the re-generation of another erase pulse so far as read data applied from sense amplifier 8 is not "0". Thus, data is read in the order of address from memory array 1 after the first erase pulse application until the data read by sense amplifier 8 is "0". Then, when the read data is "0", the second erase pulse is applied to memory array 1 by the control operation of erase/erase verifying control circuit 117. Data is again read from memory array 1 after the second erase pulse application. At this time, since an address signal generated from address counter 116 is not incremented, the data, which is first read after the second erase pulse application, is storage data of the previous memory cell, in which the read data is "0" after the first erase pulse application. If the storage data of this memory cell attains "1" in response to the second erase pulse, erase/erase verifying control circuit 117 increments the address signal, so that data is read from the next address 1. If the data of this memory cell is still "0" even after the second erase pulse application, however, the third erase pulse is applied to memory array 1 by the control operation of erase/erase verifying control circuit 117.

As in the foregoing manner, after the first erase pulse is applied to memory array 1, the storage data of the memory cell is sequentially read in the order of address, and the data reading is interrupted at the time when the memory cell, in which the data is not completely erased in response to the first erase pulse, is detected. Then, erase pulses are repetitively applied to memory array 1 until the storage data of this detected memory cell is "1". As a result, when the storage data of the detected memory cell is completely erased, the data reading restarts with an address next to the address of the detected memory cell. Then, such a circuit operation is repeated every time the data to be read is "0" so that the memory cell, in which the data is not completely erased, is detected. Thus, such a process that the address generated from address counter 116 is incremented to a maximal value, so that the reading of data from all memory cells MC in memory array 1 is completed means that the storage data of all memory cells MC in memory array 1 are completely erased.

If the data reading from all memory cells MC is completed, erase/erase verifying control circuit 117 resets latch data of command signal latch circuit 112. The signal latched in command signal latch circuit 112 is output as a status signal. Accordingly, it can be recognized based on a potential of input/output terminal I/O 7 whether or not a circuit operation for data erasing (the application of erase pulses and the erase verifying operation) continues. Specifically, with reference to FIG. 26, after erase enable signal $\overline{EE}$ attains a logic low level for a definite period $t_{EW}$ to enter in the erase mode, chip enable signal $\overline{CE}$ attains a logic low level so as to enable the operation in response to an external signal of this flash EEPROM. Further, output enable signal $\overline{OE}$ attains a logic low level so as to enable the output operation of a signal from input/output terminals I/O 0–I/O 7 of the flash EEPROM, and erase enable signal $\overline{EE}$ attains a logic low level. In response to this, the flash EEPROM enters in a status polling mode in which a signal of a logic low level or a logic high level appears on input/output terminal I/O 7 in accordance with an internal circuit operation. In the status polling mode, the signal appearing on input/output terminal I/O 7 attains a logic low level when the circuit operation for data erase continues, and conversely, it attains a logic high level when the circuit operation for data erase is completed, as shown in FIG. 26(h). In this flash EEPROM, the time required for a series of operations for data erasing including the data writing into all memory cells MC in memory array 1 (erase time) is typically approximately 1 sec, which is the time period $t_{ET}$ from the time when erase enable signal $\overline{EE}$ attains a logic low level for definite period $t_{EW}$ to the time when the signal appearing on input/output terminal I/O 7 attains a logic high level in the status polling mode.

In order to ensure an operation margin in data reading, the voltage to be applied to the control gate and the drain of the memory transistor for data reading should be the voltage of 3.4 V lower than a normal supply voltage of 5 V, in erase verifying. That is, if the data reading in erase verifying is carried out by application of such a high inherent supply voltage as of approximately 5 V to the control gate of the memory transistor, the following disadvantage might occur.

More specifically, in a memory transistor which is not rendered conductive unless a gate voltage is boosted up to approximately 5 V of the inherent supply voltage, data "1" is read in erase verifying, whereas data "0" is read if the supply voltage becomes lower than the inherent level of 5 V in normal data reading. Even if this memory transistor is rendered conductive with its control gate supplied with a voltage lower than the inherent supply voltage, the transistor is not completely turned on, so that only a small amount of current flow through the bit line. This causes an increase in the time period when the data to be read by the sense amplifier becomes correct data "1" corresponding to the storage data of the transistor. That is, the access time in reading is delayed. Thus, the data reading is carried out by application of the voltage lower than the inherent supply voltage to a selected word line so that a determination is made that only a memory transistor, the threshold voltage of which is sufficiently low, is the memory transistor in which data erase is completed, in erase verifying.

Since this flash EEPROM automatically repeats the erase pulse application and the erase verifying operation in the erase mode, it requires no external control signal.

In normal data reading, address buffer 6 accepts externally applied address signals at its address terminals A0–A16 and then applies the same to row decoder 4 and column decoder 5.

As has been described heretofore, the conventional flash EEPROM repeats the cycle in which the erase pulse having a short pulse width is first applied to the memory array, and then the erase verifying is carried out, in order to prevent an excess erase. Thus, if the memory cell, in which data is not completely erased, is detected by the erase verifying operation, the erase pulse is again applied to all the memory cells in the memory array. Accordingly, the erase pulses applied again to the memory array serve to remove the electrons stored in the floating gate in data writing in the memory transistor, in which data is not yet completely erased. Conversely, the applied erase pulses serve to draw out the electrons originally existing in the floating gate therefrom in the memory transistor, in which data is already completely erased. Consequently, when the data erasing is completed with respect to memory cells in which data is less easily erased, an excess erase occurs in memory cells in which data is easily erased.

Larger the differences in easiness of data erasing between the memory cells constituting the memory array are, larger the differences in the number of erase pulses required for a complete erase of data between the memory cells constituting memory array 1 are. There is a case where the erase pulses, which are again applied so as to completely erase the data of the memory cell detected by erase verifying, cannot perform a complete data erase with respect to the memory cell, in which data is less easily erased than the detected memory cell. In this case, the erase pulses are again applied to all the memory cells in the memory array at the time when the memory cell, in which data is less easily erased, is detected by the next erase verifying operation. Therefore, as there are larger differences in easiness of data erasing between the memory cells constituting the memory array, the number of the erase pulses applied to the memory array before the data erasing is completed with respect to the memory cell, in which data is least easily erased (i.e., before the data of all the memory cells in the memory array are completely erased) increases. Thus, it is highly possible that an excess erase occurs in many memory cells when the erasing operation is completed.

The differences in easiness of data erasing between the memory cells constituting one memory array are due to various factors in the manufacture and the circuit configuration of the device, as described above. Such differences increase with an increase in the number of memory cells constituting one memory array. Therefore, a recent increase in the capacity of semiconductor memory devices, i.e., an increase in the number of bits makes the foregoing disadvantage more significant.

Incidentally, when a gate voltage is 0 V in an N channel MOS transistor, an inter-band tunneling phenomenon occurs in an overlapping region of a gate and a drain diffusion region. This phenomenon also occurs in an overlapping region of the gate and a source diffusion region when a source potential is high. The inter-band tunneling occurs When the surface of N type drain and source diffusion regions is in a deep depletion state since the gate voltage is 0 V. If the surface of these N type diffusion regions is in the deep depletion state, then an energy band at the boundary between a substrate and an oxide film beneath the gate curves sharply. Thus, electrons of a valence electron band tunnel to a conduction band in the N type diffusion regions. Holes generated at this time flow into the grounded substrate, while the electrons that have tunneled to the conduction band are focused into the N type diffusion regions. A current generated by the flow of the holes into the substrate becomes a leakage current of this N channel MOS transistor. In data erasing, since a high voltage is applied to source 230 of the memory transistor and control gate 200 is thus grounded, such an inter-band tunneling phenomenon occurs.

Referring again to FIG. 27, it is known that the inter-band tunneling phenomenon occurs at a portion 260 in the vicinity of source 230 at an interface between substrate 240 and oxide film 250, in data erasing. Since substrate 240 is grounded, the holes generated by this phenomenon flow as a leakage current to the substrate 240 side, and the electrons that have tunneled to the conduction band flow to the source 230 side together with the electrons drawn out from floating gate 210. The inter-band tunneling phenomenon in the flash EEPROM is described in the article entitled "Subbreakdown Drain Leakage Current in MOSFET", IEEE Electron Device lett., vol. EDL-8, 1987, pp. 515–517 by J. Chen et al., and the article entitled "A FLASH-ERASE EEPROM CELL WITH AN ASYMMETRIC SOURCE AND DRAIN STRUCTURE", IEEE Tech. Dig. of IEDM 1987, 25. 8, pp. 560–563 by H. Kume et al. According to these documents, a leakage current generated by the inter-band tunneling phenomenon is approximately $10^{-8}$ A for one memory transistor when the potential of source 230 is approximately 10 V. Accordingly, in the case of a 1M bit flash EEPROM, if high voltage pulses of 10 V are applied to source 230 for data erasing, then a leakage current generated in data erasing is 10 mA. This leakage current causes such various problems as heat generation of chips due to an increase in power consumption, and a decrease in supply voltage. In general, the tolerance of such a leakage current is several 10 mA or less. However, with the capacity of semiconductor apparatus having been increased in recent years, the number of memory transistors of a flash EEPROM has been increased, and the capacity of the flash EEPROM has also been increased up to approximately 16M bit at present. In the case of a 16M bit flash EEPROM, for example, if data erasing is carried out in response to high voltage pulses of 10V, then a leakage current developed in data erasing is 10 mA$\times$16, i.e., 160 mA, the value largely exceeding the tolerance. Since a voltage to be applied to source 230 for data erasing is 12 V in practice, the actual magnitude of the leakage current is further larger than that value. In such a circumstance, the leakage current generated in data erasing should be reduced as much as possible.

Even if data erasing utilizing the tunnel phenomenon is carried out without the generation of the leakage current due to the inter-band tunneling phenomenon, a current generated by the drawing of electrons from floating gate 210 to source 230 becomes significantly large in each erase pulse application when a large number of memory cells are data-erased simultaneously. Therefore, from the view point of power consumption, it is desirable that the total amount of the current generated by such electron drawing in each erase pulse application is small.

As described above, with the number of memory cells constituting one memory array increasing, a problem of the increase in power consumption in data erasing becomes remarkable.

SUMMARY OF THE INVENTION

One object of the present invention is to provide a nonvolatile semiconductor memory device in which an excess erase is less liable to occur.

Another object of the present invention is to provide a nonvolatile semiconductor memory device in which there is a small difference in easiness of a data erase between a plurality of memory cells to which erase pulses are simultaneously applied.

A further object of the present invention is to provide a nonvolatile semiconductor memory device in which there are a small number of erase pulses to be applied to a memory array before data of all memory cells in the memory array are completely erased.

A still further object of the present invention is to provide a nonvolatile semiconductor memory device in which an excess erase is less liable to occur in memory cells by repetitive application of erase pulses and repetitive erase verifying.

A still further object of the present invention is to provide a nonvolatile semiconductor memory device in which small power consumption is required in data erasing.

A still further object of the present invention is to provide a nonvolatile semiconductor memory device in which a total amount of current generated by an interband tunneling phenomenon and a tunnel phenomenon is reduced in each application of erase pulses.

In order to accomplish the foregoing objects, a nonvolatile semiconductor memory device in accordance with the present invention includes a memory cell array divided into at least first and second blocks. The first and second blocks each include a plurality of memory cells. Each of these memory cells includes a field effect semiconductor element for enabling data writing by utilizing avalanche breakdown and data erasing by utilizing a tunnel phenomenon. The nonvolatile semiconductor memory device in accordance with the present invention further includes first high voltage applying circuitry for collectively applying high voltages for causing a tunnel phenomenon to all the memory cells included in the first block in order to achieve a data erase, second high voltage applying circuitry for collectively applying high voltages for causing the tunnel phenomenon to all the memory cells included in the second block in order to achieve the data erase, circuitry for simultaneously or time-sequentially reading storage data of the memory cells included in the first block and storage data of the memory cells included in the second block in order to achieve erase verifying, and control circuitry responsive to the data read by the reading circuitry for individually enabling or disabling the first and second high voltage applying circuitry.

As described above, the nonvolatile semiconductor memory device in accordance with present invention has such a structure that the memory cell array is divided into at least the first and second blocks, and the circuitry for applying high voltages for causing the tunnel phenomenon are each provided corresponding to the first and second blocks. The nonvolatile semiconductor memory device in accordance with the present invention further includes the circuitry for individually controlling the first high voltage applying circuitry provided corresponding to the first block and the second high voltage applying circuitry provided corresponding to the second block in response to the storage data read from the memory cells included in the first and second blocks. Thus, if the data read from the memory cells included in the first and second blocks represent "defective data-erase", the corresponding high voltage applying circuitry can apply a high voltage for data erasing to only one of the first and second blocks, in which a memory cell of this "defective data-erase" exists.

In addition, if the first and second blocks, the first and second high voltage applying circuitry and the control circuitry are combined into one group, and a plurality of (assumed to be n) such groups are provided for one memory cell array, for example, it is also possible to reduce power consumption in data erasing. That is, if the plurality of these groups are operated time-sequentially, a maximum value of the number of memory cells to which a high voltage for data erasing is simultaneously applied is the number of memory cells obtained when there are data-erase defective memory cells in both the first and second blocks, which value is 1/n of all the memory cells in the memory cell array, in any of the plurality of groups. Accordingly, a current generated by the tunnel phenomenon and the inter-band tunneling phenomenon is reduced in each erase pulse application.

According to a first preferred embodiment, the reading circuitry includes first reading circuitry for reading data individually from all the memory cells included in the first block in response to completion of the application of a high voltage from the first high voltage applying circuitry to all the memory cells included in the first block, and second reading circuitry for reading data individually from all the memory cells included in the second block in response to completion of the application of a high voltage from the second high voltage applying circuitry to all the memory cells included in the second block. The control circuitry includes first control circuitry for controlling the first high voltage applying circuitry to be enabled or disabled in response to the data read from all the memory cells included in the first block by the first reading circuitry, and second control circuitry for controlling the second high voltage applying circuitry to be enabled or disabled in response to the data read from all the memory cells included in the second block by the second reading circuitry. Preferably, the first high voltage applying circuitry includes high voltage pulse generating circuitry for generating a high voltage for a predetermined short period in response to each of the completion of reading of the data from all the memory cells in the first block by the first reading circuitry and the completion of reading of the data from all the memory cells included in the second block by the second reading circuitry, and a first electric path for transmitting an output of the high voltage pulse generating circuitry to all the memory cells included in the first block. Similarly, the second high voltage applying circuitry includes the high voltage pulse generating circuitry, and a second electric path for transmitting the output of the high voltage pulse generating circuitry to all the memory cells included in the second block. In this case, the first control circuitry includes first enable signal generating circuitry responsive to the data read from each of the memory cells in the first block by the first reading circuitry for detecting the incompletion of data erasing with respect to that memory cell, to generate a first enable signal for enabling the first high voltage applying circuitry, a first latch circuit for storing the first enable signal generated by the first enable signal generating circuitry until the data is read from all the memory cells in the first block by the first reading circuitry, and the first activating circuitry for activating the first electric path in response to the first enable signal stored in the first latch circuit and the high voltage generated by the high voltage pulse generating circuitry. Similarly, the second control circuitry includes second enable signal generating circuitry responsive to the data read from each of the memory cells in the second block by the second reading circuitry for detecting the incompletion of data erasing with respect to that memory cell, to generate a second enable signal for enabling the second high voltage applying circuitry, a second latch circuit for storing the second enable signal generated by the second enable signal generating circuitry until the data is read from all the memory cells in the second block by the second reading circuitry, and second activating circuitry for activating the second electric path in response to the second enable signal stored in the second latch circuit and the high voltage generated by the high voltage pulse generating circuitry.

The first activating circuitry includes, for example, a first inverter for receiving as an input, an output of the first latch circuit and provided between the output of the high voltage pulse generating circuitry and ground. Similarly, the second activating circuitry includes, for example, a second inverter for receiving as an input, an output of the second latch circuit and provided between the output of the high voltage pulse generating circuitry and ground. The first electric path includes, for example, a switching element controlled to be rendered conductive or nonconductive in response to an output of the first inverter and provided between the output of the high voltage pulse generating circuitry and all the memory cells in the first block. Similarly, the second electric path includes, for example, a switching element controlled to be rendered conductive or nonconductive in response to an output of the second inverter and provided between the output of the high voltage pulse generating circuitry and all the memory cells in the second block.

According to a second preferred embodiment, the memory cells are arranged in a plurality of rows in the first block, and the memory cells are arranged in a plurality of rows in the second block. The reading circuitry includes first reading circuitry for reading data individually from the memory cells of one row in the first block in response to the completion of application of a high voltage from the first high voltage applying circuitry to all the memory cells included in the first block, and second reading circuitry for reading data individually from the memory cells of one row in the second block in response to the completion of application of a high voltage from the second high voltage applying circuitry to all the memory cells included in the second block. Preferably, the first high voltage applying circuitry includes high voltage pulse generating circuitry for generating a high voltage for a predetermined short period, and a first electric path for transmitting an output of the high voltage pulse generating circuitry to all the memory cells included in the first block. The second high voltage applying circuitry includes the high voltage pulse generating circuitry, and a second electric path for transmitting the output of the high voltage pulse generating circuitry to all the memory cells included in the second block. In order to control the first high voltage applying circuitry, the control circuitry includes a first comparator for making a determination, based on the data read from each of the memory cells of one row in the first block by the first reading circuitry, as to whether or not a data erasing is completed with respect to that memory cell, a first latch circuit responsive to a determination output of "incomplete data-erase" of the first comparator for storing a first enable signal for enabling the first high voltage applying circuitry until data are read from all the memory cells of one row in the first block by the first reading circuitry, and first activating circuitry for activating the first electric path in response to the high voltage generated by the high voltage pulse generating circuitry and the first enable signal stored in the first latch circuit.

In order to control the second high voltage applying circuitry, the control circuitry further includes a second comparator for making a determination, based on the data read from each of the memory cells of one row in the second block by the second reading circuitry, as to whether or not a data erase is completed with respect to that memory cell, a second latch circuit responsive to a determination output of "incomplete data-erase" of the second comparator for storing a second enable signal for enabling the second high voltage applying circuitry until data is read from all the memory cells of one row in the second block by the second reading circuitry, and second activating circuitry for activating the second electric path in response to the high voltage generated by the high voltage pulse generating circuitry and the second enable signal stored in the second latch circuit.

The control circuitry further includes a third latch circuit responsive to each of the determination output of the "incomplete data-erase" of the first comparator and the determination output of the "incomplete data-erase" of the second comparator for storing a third enable signal for enabling the high voltage pulse generating circuitry until the data reading from all the memory cells of one row in the first block by the first reading circuitry is completed and until the data reading from all the memory cells of one row in the second block by the second reading circuitry is completed, and circuitry for enabling the high voltage pulse generating circuitry in response to the third enable signal stored in the third latch circuit when the data reading from all the memory cells of one row in the first block by the first reading circuitry is completed and when the data reading from all the memory cells of one row in the second block by the second reading circuitry is completed.

In the first preferred embodiment, the reading circuitry includes an address counter for generating an internal address signal for selecting a memory cell from which data is to be read, from each of the first and second blocks independently of an external address signal, in a data erase mode. Thus, in the first preferred embodiment, the first control circuitry further includes first internal address control circuitry for controlling the address counter so as to update the internal address signal in response to a storage signal of the first latch circuit, latched when the data reading from all the memory cells in the first block by the first reading circuitry is completed, being not the first enable signal. The second control circuitry further includes internal address control circuitry for controlling the address counter so as to update the internal address signal in response to a storage signal of the second latch circuit, latched when the data reading from all the memory cells in the second block by the reading circuitry is completed, being not the second enable signal.

In the second preferred embodiment, the reading circuitry includes a row address counter for generating an internal row address signal for selecting one of the rows from each of the first and second blocks independently of an external address signal, in the data erase mode, and a column address counter for generating an internal column address signal for sequentially selecting one by one the memory cells arranged in a row corresponding to the internal row address signal, independently of the external address signal, in the data erase mode. Thus, in the second preferred embodiment, the third latch circuit further includes circuitry for controlling the row address counter so as to update the internal row address signal in response to a storage signal of the third latch circuit, latched when the data reading from all the memory cells of one row in the first block by the first reading circuitry is completed and when the data reading from all the memory cells of one row in the second block by the second reading circuitry is completed, being not the third enable signal.

In order to accomplish the foregoing objects, a data erase method of a nonvolatile semiconductor memory device in accordance with the present invention is applied to a nonvolatile semiconductor memory device including a memory cell array having a plurality of memory cells including the above-described field effect semiconductor elements and divided into at least first and second blocks. This data erasing method includes the steps of: collectively applying a high voltage for causing tunnel phenomena to all the memory cells included in the first block in order to achieve data erasing; collectively applying a high voltage for causing the tunnel phenomena to all the memory cells included in the second block in order to achieve the data erasing; reading storage data of all of or a part of the memory cells included in the first block after the application of the high voltage to the first block; reading storage data of all of or a part of the memory cells included in the second block after the application of the high voltage to the second block; and individually and selectively applying a high voltage for causing the tunnel phenomena to all the memory cells included in the first and second blocks in response to the data read by the above reading step.

Since the data erasing method of the nonvolatile semiconductor memory device in accordance with the present invention includes the foregoing steps, a high voltage for data erasing can be applied to both the first and second blocks, only one of the first and second blocks, or alternatively neither of the first and second blocks in response to the data read from the memory cells included in the first and second blocks, to which the high voltage for data erasing is applied.

Therefore, in accordance with the present invention, the memory array is divided into a plurality of blocks, and the erase verifying and the re-application of erase pulses are carried out for each block. Thus, in case where there is a memory cell of defective data-erase exists in any of the blocks, so that an erasing operation of the entire device continues, no erase pulse is applied to the block including no memory cell of defective data-erase. If the memory array is divided into the blocks, the differences in easiness of data erasing between any memory cells in each block are reduced, and hence an excess erase in each block is less liable to occur. Further, if those plurality of blocks are divided into a plurality of groups, and erase/erase verifying for a unit of each block is carried out sequentially one by one group, then power consumption in data erasing can also be reduced. Consequently, a highly reliable nonvolatile semiconductor memory device in which an excess erase is less liable to occur as compared to the convention is provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 18 is a timing chart showing an operation in an erase cycle of the flash EEPROM of FIG. 16;

DESCRIPTION OF THE PREFERRED EMBODIMENTS

Figure 1:
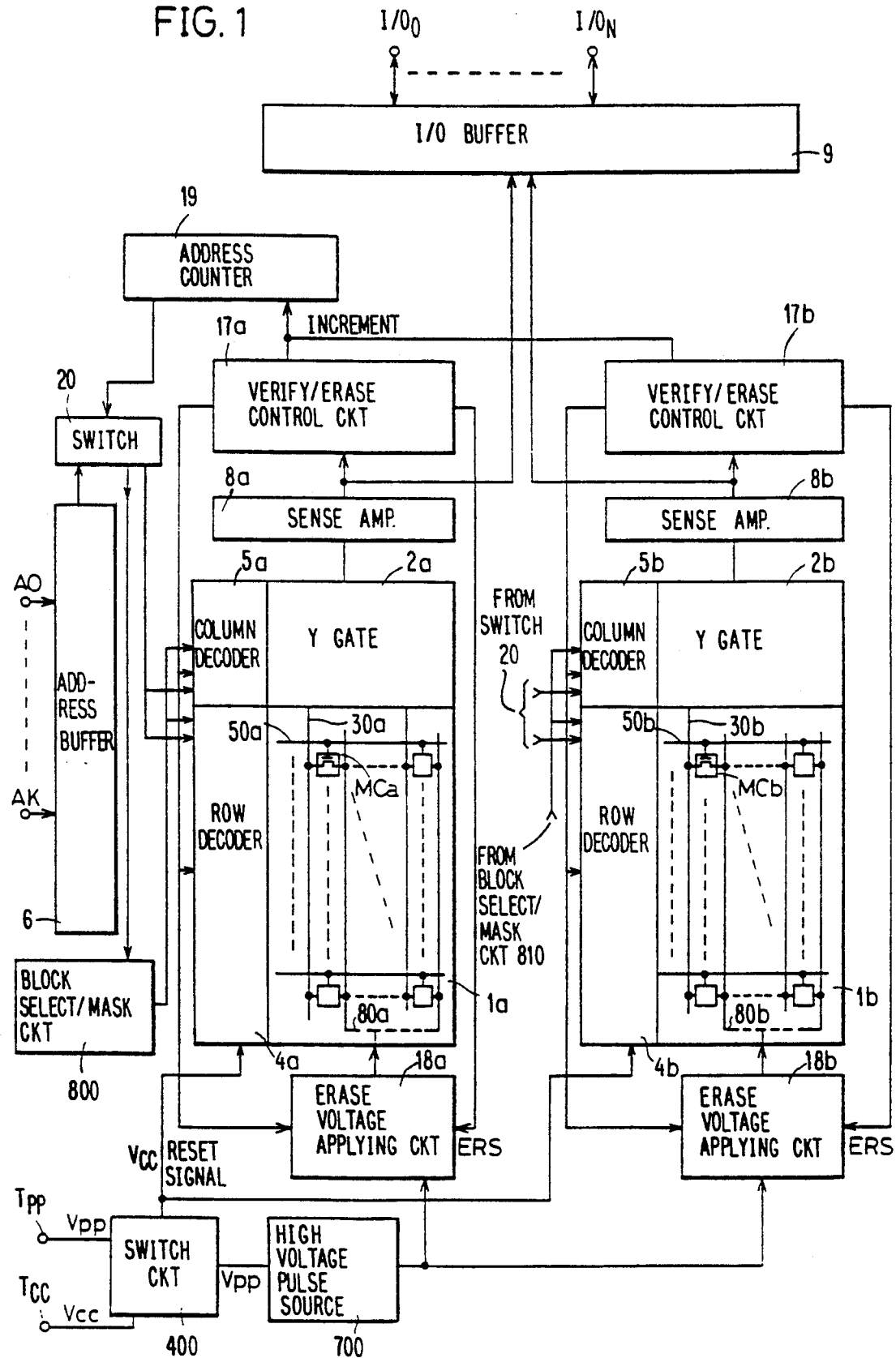
FIG. 1 is a partial schematic block diagram of a flash EEPROM according to one embodiment of the present invention.

FIG. 1 mainly shows a part relating to an erasing operation of a flash EEPROM according to one embodiment of the present invention.

Referring to FIG. 1, this flash EEPROM includes a memory array divided into two sub-arrays 1a and 1b. A row decoder 4a, a Y gate 2a, a column decoder 5a, a sense amplifier 8a, a verifying/erasing control circuit 17a and an erase voltage applying circuit 18a are provided corresponding to memory array 1a. Similarly, a row decoder 4b, a Y gate 2b, a column decoder 5b, a sense amplifier 8b, a verifying/erasing control circuit 17b and an erase voltage applying circuit 18b are provided corresponding to memory array 1b.

Figure 22:
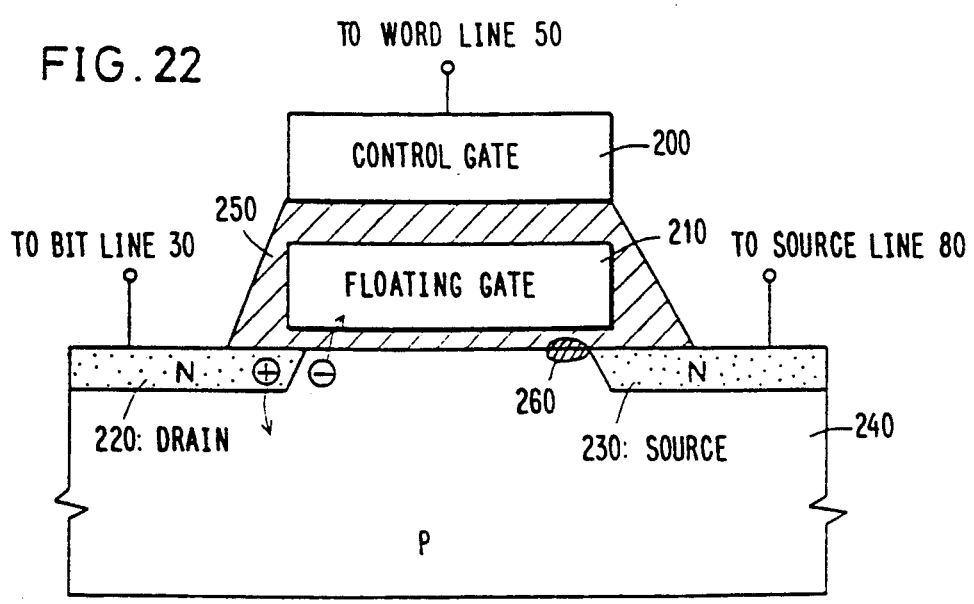
FIG. 22 is a cross-sectional view showing the structure of a conventional memory cell and a memory cell according to the embodiments.

Each of memory arrays 1a and 1b has the same configuration as the conventional. More specifically, in memory array 1a, memory cells MCa each constituted by FAMOS transistors are arranged in matrix in the directions of rows and columns along word lines 50a and bit lines 30a. The transistors each constituting all the memory cells MCa in memory array 1a have their respective sources commonly connected to a source line 80a. Each transistor constituting each memory cell MCa has its control gate and its drain connected to a corresponding word line 50a and corresponding bit line 30a, respectively. Similarly, in memory array 1b, memory cells MCb each constituted by FAMOS transistors are arranged in matrix in the directions of rows and columns along word lines 50b and bit lines 30b. The transistors each constituting all memory cells MCb in memory array 1b have their respective sources commonly connected to a source line 80b. Each memory cell MCb has its control gate and its drain connected to a corresponding word line 50b and corresponding bit line 30b, respectively. The structure of memory cells MCa and MCb is identical to that shown in FIG. 22. Therefore, also in the flash EEPROM according to this embodiment, a data erasing can be carried out by application of high voltage pulses to source lines 80a and 80b and by grounding of word lines 50a and 50b.

Since the operation of row decoder 4a, Y gate 2a, column decoder 5a and sense amplifier 8a for data reading from memory array 1a is the same as the conventional, a description thereof will not be repeated here. Similarly, since the operation of row decoder 4b, Y gate 2b, column decoder 5b and sense amplifier 8b for data reading from memory array 1b is the same as the conventional, a description thereof will not be repeated, either.

In addition to the foregoing circuitry, this flash EEPROM includes a block select/mask circuit 800, an address buffer 6, an input/output buffer 9, an address counter 19 and a switch circuit 20.

Address buffer 6 is connected with external address terminals A0-AK. Input/output buffer 9 is connected with external input/output terminals I/O$_0$-I/O$_N$. In normal data writing, address buffer 6 accepts externally applied address signals through address terminals A0-AK to apply the same to switch circuit 20. Input/output buffer 9 accepts externally applied input data through input/output terminals I/O$_0$-I/O$_N$ in normal data writing and provides output data such as read data from memory arrays 1a and 1b through input/output terminals I/O$_0$-I/O$_N$ in normal data reading. In normal data writing and normal data reading, switch circuit 20 selectively applies an address signal from address buffer 6 out of an output of address buffer 6 and an output of address counter 9 to row decoders 4a and 4b, column decoders 5a and 5b and block select/mask circuit 800. In this embodiment, an address signal includes a row address signal and a column address signal indicating respective addresses of memory cells in a row direction and a column direction, and also a block address signal indicating from which memory cell array memory cells are selected. Row decoders 4a and 4b and column decoders 5a and 5b decode an output of switch circuit 20 and an output of block select/mask circuit 800. In normal data writing and normal data reading, block select/mask circuit 800 applies the block address signal included in the address signal from switch circuit 20 to row decoders 4a and 4b and column decoders 5a and 5b.

Figure 2:
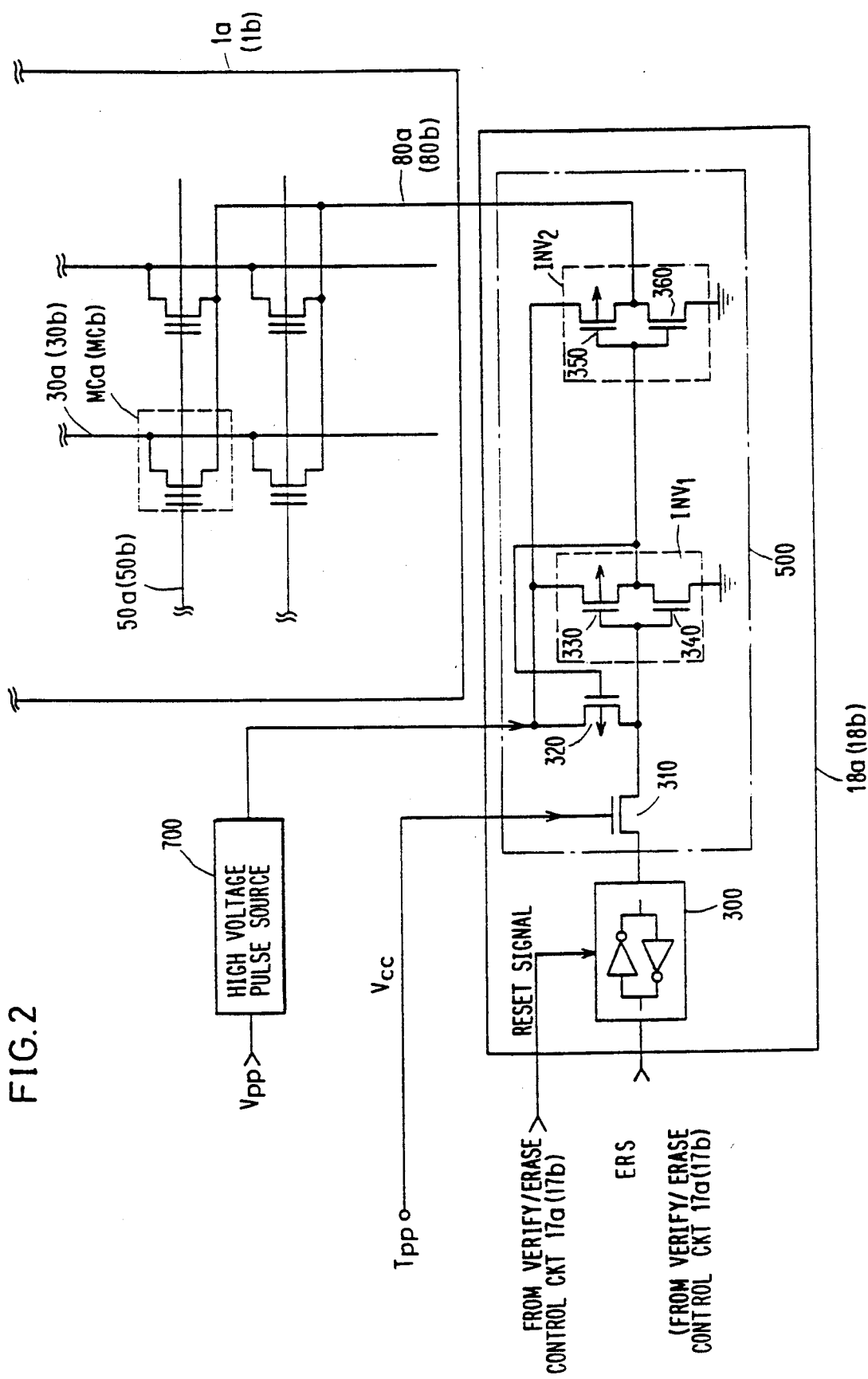
FIG. 2 is a circuit diagram showing a specific example of configuration of an erase voltage applying circuit of FIG. 1.
Figure 4:
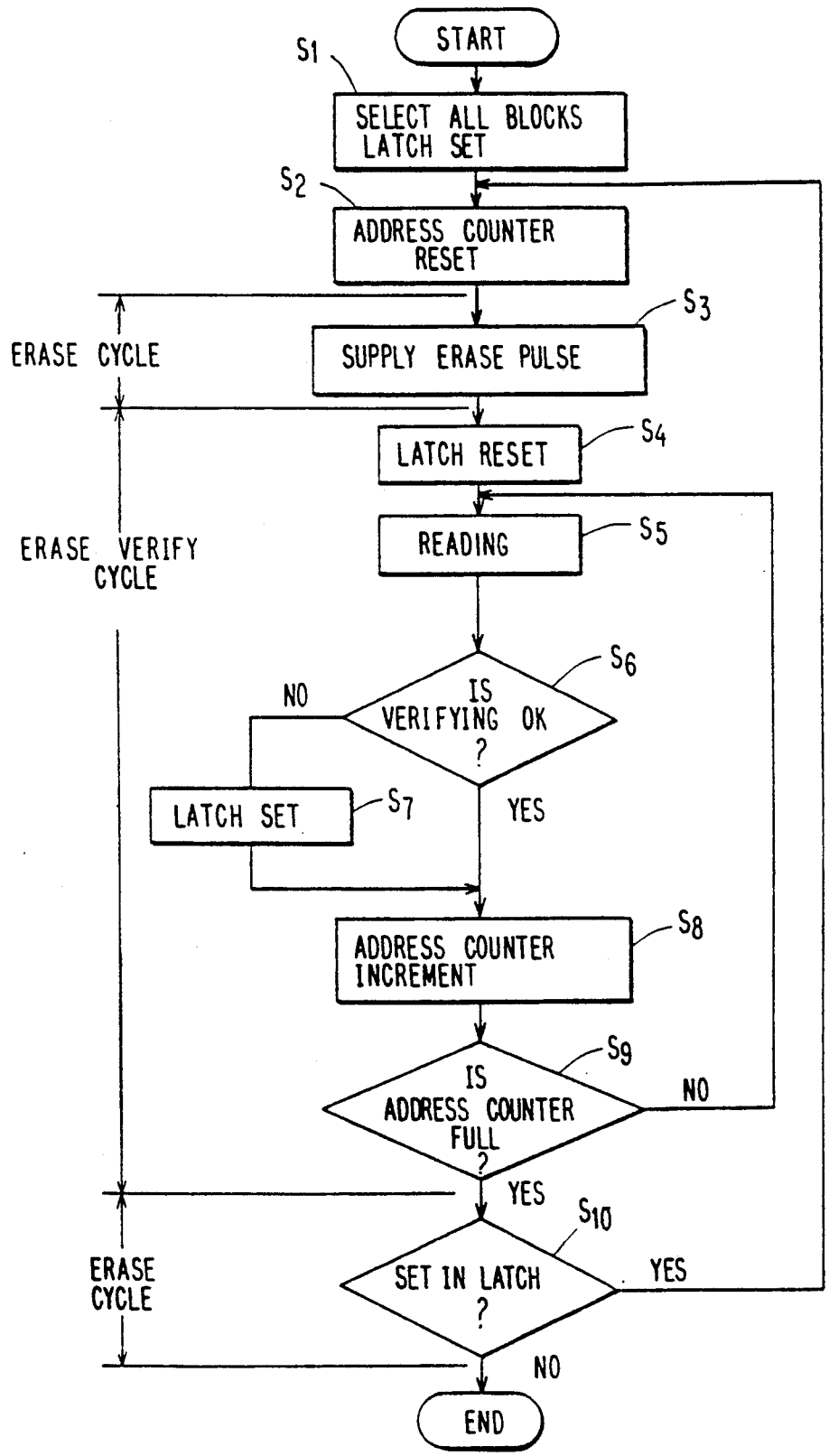
FIG. 4 is an operation flow chart for explaining an operation of the flash EEPROM of FIG. 1 in an erase mode.
Figure 11:
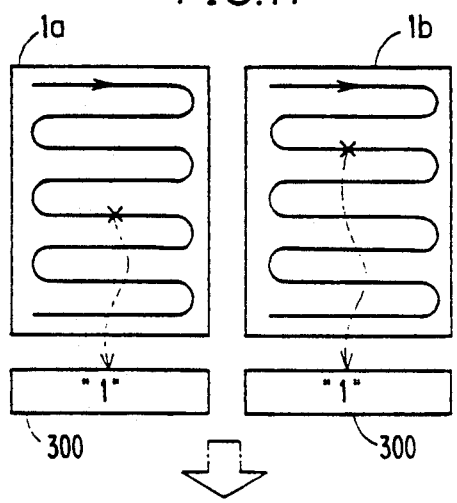
FIG. 11 is a diagram conceptionally showing a data reading method in an erase verify cycle according to the embodiment shown in FIG. 4.

A detailed description will now be given of an operation of this flash EEPROM in a data erase mode, with reference to FIGS. 2, 4 and 11. FIG. 2 is a circuit diagram showing one example of a specific configuration of erase voltage applying circuits 18a and 18b. FIG. 4 is an operation flow chart showing the flow of the operation of the flash EEPROM in the erase mode. FIG. 11 is a diagram conceptually showing a data reading method in the data erase mode of the flash EEPROM according to this embodiment.

Figure 3:
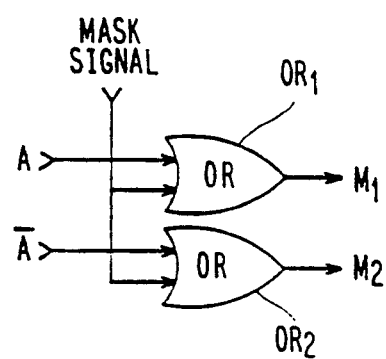
FIG. 3 is a circuit diagram showing an example of a partial structure of a block select/mask circuit 800 of FIG. 1.

When the flash EEPROM enters in the erase mode, address buffer 6 and input/output buffer 9 are inactivated, whereas address counter 19 is activated. The activated address counter 19 can generate an address signal by a counting operation. The address signal generated from address counter 19 is applied to switch circuit 20. In the erase mode, switch circuit 20 applies an output of address counter 19 from those of address counter 19 and address buffer 6 selectively to row decoders 4a and 4b and column decoders 5a and 5b and block select/mask circuit 800. When a count value of address counter 19 indicates the maximum value, the address signal output from address counter 19 indicates final addresses of memory arrays 1a and 1b. In the erase mode, block select/mask circuit 800 converts the block address signal included in the address signal from switch circuit 20 into a signal indicating that memory cells included in memory array 1a and those included in memory array 1b are both selected, and then applies the converted block address signal to row decoders 4a and 4b and column decoders 5a and 5b. FIG. 3 is a circuit diagram showing one example of a circuit (mask circuit) provided in block select/mask circuit 800 for this conversion.

Referring to FIG. 3, the mask circuit includes 2-input OR gates OR1 and OR2. Block address signals A and $\overline{A}$ of complementary logic values are applied to one input terminal of OR gate OR1 and one input terminal of OR gate OR2, respectively. Mask signals are received at the other input terminal of OR gate OR1 and the other input terminal of OR gate OR2. A mask signal potential attains a logic level corresponding to a logic value "0" in normal data writing and normal data reading, while the potential attains a logic level corresponding to a logic value "1" in the data erase mode. Accordingly, in the normal data writing and normal data reading, respective logic values of output signals M1 and M2 of the mask circuit correspond to respective logic values of block address signals A and $\overline{A}$, whereas in the data erase mode, the logic values of output signals M1 and M2 are both the logic value "1" independently of the logic values of block address signals A and $\overline{A}$. In general, a row decoder and a column decoder are constituted by a plurality of logic gates such as a plurality of NAND gates to which a plurality of signals applied as an address signal are input in different combinations. Thus, if the plurality of signals, which are applied as a block address signal from block select/mask circuit 800 to row decoders 4a and 4b and column decoders 5a and 5b, indicate the same logic value, then the selection of word line 50a and bit line 30a from memory cell array 1a by row decoder 4a and column decoder 5a is carried out simultaneously with the selection of word line 50b and bit line 30b from memory cell array 1b by row decoder 4b and column decoder 5b. In the data erase mode, since data are simultaneously read from memory arrays 1a and 1b, erase verifying is carried out simultaneously for memory arrays 1a and 1b.

As described above, in this embodiment, both a block including memory array 1a as a main part and a block including memory array 1b as a main part are first brought into a selection state in the data erase mode (operation step S1 of FIG. 4).

In the erase mode, a cycle in which verifying/erasing control circuits 17a and 17b supply high voltage pulses as erase pulses to erase voltage applying circuits 18a and 18b, respectively (hereinafter referred to as erase cycle) and a cycle in which verifying/erasing control circuits 17a and 17b carry out erase verifying for memory arrays 1a and 1b, respectively (hereinafter referred to as erase verify cycle) are repeated.

In this embodiment, referring to FIG. 11, storage data of all the memory cells are read in the order of addresses (the directions indicated by arrows in the figure) simultaneously from memory arrays 1a and 1b in a single erase verify cycle. Then, at the time when a data-unerased memory cell X is detected by this reading, data "1" indicating that the data-unerased memory cell exists is set in only a latch circuit 300 provided corresponding to a memory array including this data-unerased memory cell.

In the erase verify cycle, a switch circuit 400 supplies a supply voltage $V_{CC}$ from a terminal $T_{CC}$ to row decoder 4a. In the erase cycle, switch circuit 400 supplies a high voltage $V_{PP}$ from a terminal $T_{PP}$ to a high voltage pulse source 700.

In the erase verify cycle, verifying/erasing control circuit 17a controls row decoder 4a and column decoder 5a so that they may operate the same as in normal data reading. Accordingly, row decoder 4a responds to an applied address signal to supply a supply voltage $V_{CC}$ of a logical high level from switch circuit 400 to only a single word line of word lines 50a in memory array 1a. Column decoder 5a responds to an applied address signal to supply the voltage of a logical high level to only a single bit line of bit lines 30a in memory array 1a and also to electrically connect this single bit line to sense amplifier 8a. Similarly, verifying/erasing control circuit 17b controls row decoder 4b and column decoder 5b so that they may operate the same as in normal data reading. Accordingly, row decoder 4b responds to an applied address signal to selectively supply a voltage of a logical high level to only a single word line of word lines 50b in memory array 1b. Column decoder 5b responds to an applied address signal to supply the voltage of a logical high level to only a single bit line of bit lines 30b in memory array 1b and also to electrically connect only this single bit line to sense amplifier 8b. At the same time, verifying/erasing control circuits 17a and 17b each control erase voltage applying circuits 18a and 18b so that high voltage pulses may not be output from erase voltage applying circuits 18a and 18b.

Each of erase voltage applying circuits 18a and 18b has the configuration shown in FIG. 2, for example. Referring to FIG. 2, each of erase voltage applying circuits 18a and 18b includes a latch circuit 300 and a high voltage switch 500. High voltage switch 500 includes an N channel MOS transistor 310 for receiving a supply voltage 5 V at its gate, P channel MOS transistors 320, 330 and 350, and N channel MOS transistors 340 and 360. Transistors 330 and 340 are connected in series between high voltage pulse source 700 and ground, to constitute an inverter INV1. Similarly, transistors 350 and 360 are connected in series between high voltage pulse source 700 and ground, to constitute an inverter INV2. Transistor 320 is connected between high voltage pulse source 700 and an input terminal of inverter INV1. Transistor 320 has its gate connected to an output terminal of inverter INV1. Transistor 310 is connected between an output terminal of latch circuit 300 and the input terminal of inverter INV1. Inverter INV2 is connected between the output terminal of inverter INV1 and source line 80a (80b) of memory array 1a (1b).

Latch circuit 300 latches a data signal applied from verifying/erasing control circuit 17a (17b) of FIG. 1. Further, latch circuit 300 is configured to reset latch data to "0" in response to an external reset signal. In the erase cycle, high voltage pulse source 700 converts a high voltage $V_{PP}$ from switch circuit 400 into a high voltage pulse having a shorter pulse width, to supply the high voltage pulse as an erase pulse, whereas in the erase verify cycle, high voltage pulse source 700 supplies a normal supply voltage as an output. In this embodiment, latch circuit 300 is supplied with a reset signal from verifying/erasing control circuit 17a (17b) at the beginning of the erase verify cycle. Accordingly, an output voltage of latch circuit 300 attains a logical low level corresponding to a logic value "0" (operation step S4 of FIG. 4). Since transistor 310 is constantly in an ON state with its gate receiving supply voltage 5 V, the voltage of a logical low level supplied from latch circuit 300 renders transistor 330 of inverter INV1 conductive. As a result, a voltage of a logical high level supplied from high voltage pulse source 700 is supplied to the output terminal of inverter INV1. This voltage of the output terminal of inverter INV1 is inverted into a ground voltage of a logic low level by inverter INV2 and then supplied to source line 80a (80b). That is, source line 80a (80b) is grounded.

In the case where erase voltage applying circuits 18a and 18b are structured as shown in FIG. 2, if latch circuit 300 is reset by its corresponding verifying/erasing control circuit 17a or 17b at the beginning of the erase verify cycle, source lines 80a and 80b are grounded and do not attain a high potential.

The above-described circuit operation causes data to be simultaneously read from memory arrays 1a and 1b in the erase verify cycle. The data read from memory array 1a is sensed by sense amplifier 8a to be applied to verifying/erasing control circuit 17a. Similarly, the data read from memory array 1b is sensed by sense amplifier 8b to be applied to verifying/erasing control circuit 17b. Verifying/erasing control circuit 17a determines whether or not the read data applied from sense amplifier 8a is "1" corresponding to the state where electrons are completely removed from a floating gate.

More specifically, referring to FIG. 4, in the erase verify cycle, data is read from memory array 1a (operation step S5). Then, a determination is made based on the read data as to whether or not data erasing is completed in the memory cell selected at present (operation step S6). If the read data is "0", a determination can be made that the data erasing is incomplete in the presently selected memory cell. In this case, verifying/erasing control circuit 17a generates a data signal ERS of a logical high level so as to set data "1" in latch circuit 300 (see FIG. 2) in erase voltage applying circuit 18a (operation step S7). Verifying/erasing control circuit 17a then supplies as an output a signal for incrementing a count value of address counter 19. Thus, the count value of address counter 19 is incremented, so that an address signal generated from address counter 19 is incremented (operation step S8). If the read data is "1", a determination is made that the data erasing is completed with respect to the presently selected memory cell, so that verifying/erasing control circuit 17a outputs no data signal ERS.

If the count value of address counter 19 is already the maximum value, and hence the count value cannot be incremented more by the increment in operation step S8, a data reading operation in the erase verify cycle ends (operation step S9). If the count value of address counter 19 has not reached the maximum value yet and a determination output of operation step S9 is "No", however, the address signal is updated by this increment. In this case, verifying/erasing control circuit 17a successively controls row decoder 4a and column decoder 5a so as to achieve the data reading from memory array 1a. Accordingly, storage data of a memory cell corresponding to an address indicated by the updated address signal is read out from memory array 1a. Verifying/erasing control circuit 17a determines based on this newly read data whether or not the presently selected memory cell has a defect in data erasing. In response to a result of this determination, the circuit 17a either sets data "1" in latch circuit 300 in erase voltage applying circuit 18a or holds latch circuit 300 in a reset state. That is, a series of circuit operations for erase verifying with respect to the memory cell of the updated address, i.e., operation steps S5–S7 of FIG. 4 are carried out. Thereafter, the address signal generated from address counter 19 is further incremented by verifying/erasing control circuit 17a (operation step S8). If the count value of address counter 19 can further be incremented by this increment, then the circuit operation shown in operation steps S5–S9 is again repeated, so that erase verifying is carried out with respect to the memory cell of the address indicated by the incremented address signal.

As described above, in the erase verify cycle, the circuit operation in which data is read from one address and then the data "1" is set in latch circuit 300 in erase voltage applying circuit 18a only when the read data indicates a defect in data erase is repeated. Verifying/erasing control circuit 17b also performs the same operation as verifying/erasing control circuit 17a. The count value of address counter 19 is reset in response to this flash EEPROM entering in the erase mode (operation step S2 of FIG. 4). If the count value of address counter 19 is kept incremented to the maximum value until the address signal indicates a final address, then a checking of the presence/absence of a data erase defect in all memory cells $MC_a$ and $MC_b$ in memory arrays 1a and 1b is completed.

In the erase verify cycle, when verifying/erasing control circuit 17a detects a memory cell having a data erase defect in memory array 1a, data "1" is set in latch circuit 300 in erase voltage applying circuit 18a at this time. Latch circuit 300 keeps holding applied data as long as no reset signal is externally applied. Thus, if there is even one memory cell with a data erase defect in memory array 1a, latch data of latch circuit 300 in erase voltage applying circuit 18a is "1" at the time when all memory cells $MC_a$ in memory array 1a are already checked. Conversely, if there is no memory cell with a data erase defect in memory array 1a, no signal ERS is output even once from verifying/erasing control circuit 17a in the erase verify cycle. Thus, in this case, the latch data of latch circuit 300 in erase voltage applying circuit 18a remains to be "0" at the time when all memory cells $MC_a$ in memory array 1a have been checked.

Similarly, if there is even one memory cell with a data erase defect in memory array 1b, verifying/erasing control circuit 17b supplies as an output a data signal ERS of a logic high level. Conversely, if there is no memory cell with a data erase defect in memory array 1b, verifying/erasing control circuit 17b generates no signal ERS in the erase verify cycle. Accordingly, at the time when all memory cells $MC_b$ in memory array 1b have already been checked, the latch data of latch circuit 300 in erase voltage applying circuit 18b is "1" when a data-erase defective memory cell exists in memory array 1b and "0" when no data-erase defective memory cell exists therein.

Therefore, if the count value of address counter 19 is incremented to the maximum value, and the circuit operation in operation steps S4–S9 of FIG. 4 is completed, then data "1" is set in only latch circuit 300 in the erase voltage applying circuit corresponding to the memory array, in which the data-erase defective memory cell exists.

When the count value of address counter 19 is incremented to the maximum value, and all memory cells $MC_a$ and $MC_b$ in memory arrays 1a and 1b are all checked, this flash EEPROM moves to the erase cycle. In the erase cycle, verifying/erasing control circuit 17a controls row decoder 4a so that row decoder 4a may supply a ground potential to all word lines 50a in memory array 1a. At the same time, verifying/erasing control circuit 17b also controls row decoder 4b so that row decoder 4b may supply the ground potential to all word lines 50b in memory array 1b. Accordingly, a ground potential of a logic low level is supplied to the control gate of the transistor constituting each of all memory cells $MC_a$ and $MC_b$ in memory arrays 1a and 1b. With reference to FIG. 2, if latch circuit 300 in erase voltage applying circuit 18a is set in the data "1" at this time, an output voltage of latch circuit 300 is at a logic high level. Thus, this logic high level voltage causes transistor 340 in inverter INV1 to be turned on and thus causes the output terminal of inverter INV1 to be of the ground potential. This ground potential causes transistor 350 in inverter INV2 to be turned on and thus causes an output of high voltage pulse source 700 to be transmitted to the output terminal of inverter INV2. Transistor 320 is turned on in response to the potential on the output terminal of inverter INV1 received at its gate, so that a potential on the input terminal of inverter INV1 is fixed at a logical high level in response to the output of high voltage pulse source 700. This insures a supply of the output of high voltage pulse source 700 to the output terminal of inverter INV2. In the erase cycle, high voltage pulse source 700 generates high voltage pulses of a potential $V_{PP}$ much higher than a normal supply voltage 5 V. Therefore, if the data "1" is set in latch circuit 300 in erase voltage applying circuit 18a, a high voltage pulse is applied from inverter INV2 onto source line 80a in memory array 1a in the erase cycle. If the data "1" is not set in latch circuit 300 in erase voltage applying circuit 18a, however, an output voltage of latch circuit 300 remains at a logical low level, so that source line 80a remains to be grounded via transistor 360 in inverter INV2. Thus, the high voltage pulse is applied to source line 80a in memory array 1a in the erase cycle as far as the data "1" is set in latch circuit 300 in erase voltage applying circuit 18a. That is, erase pulses are applied to all memory cells MC$_a$ in memory array 1a as far as a data-erase defective memory cell exists in memory array 1a.

Similarly, if the data "1" is set in latch circuit 300 in erase voltage applying circuit 18b, a high voltage pulse generated from high voltage pulse source 700 is applied to source line 80b in memory array 1b via transistor 350 in erase voltage applying circuit 18b. Conversely, if the data "1" is not set in latch circuit 300 in erase voltage applying circuit 18b, source line 80b in memory array 1b remains to be grounded via transistor 360 in erase voltage applying circuit 18b. Thus, erase pulses are applied from erase voltage applying circuit 18b to all memory cells MC$_b$ in memory array 1b as far as a data-erase defective memory cell exists in memory array 1b.

As described above, when all memory cells MC$_a$ and MC$_b$ in memory arrays 1a and 1b are already checked, erase pulses are selectively applied to memory array 1a dependently on whether or not the data "1" is set in latch circuit 300 in erase voltage applying circuit 18a, and erase pulses are selectively applied to memory array 1b dependently on whether or not the data "1" is set in latch circuit 300 in erase voltage applying circuit 18b (operation steps S10 and S3 in FIG. 4). If the data "1" is set in neither latch circuit 300 in erase voltage applying circuit 18a nor 18b, a determination can be made that a data-erase defective memory cell exists neither memory array 1a nor 1b. Thus, all the operations in the data erase mode of the flash EEPROM are completed when limited in this case.

If the data "1" is set in latch circuit 300 in at least one of erase voltage applying circuits 18a and 18b, so that erase pulses are applied to at least one of memory arrays 1a and 1b (operation step S3), then the flash EEPROM again enters in the erase verify cycle and in the subsequent erase cycle. That is, the circuit operation corresponding to processing steps S3-S9 and S2 in FIG. 4 restarts. Unlike the conventional, however, the erase pulses generated after erase verifying are applied only to the memory array including a data-erase defective memory cell. Thus, since no erase pulses are applied to the memory array including only a memory cell in which a data erase is already completed, the number of memory cells, in which an excess erase is caused by re-application of erase pulses, is reduced to a smaller number than the conventional.

The circuit operation corresponding to operation steps S3-S10 is repeated until a data-erase defective memory cell no longer exists in any of memory arrays 1a and 1b. That is to say, in the final erase verify cycle, the data are read from all the memory cells included in memory arrays 1a and 1b without the data "1" being latched in any latch circuit 300 provided corresponding to any one of memory arrays 1a and 1b (see FIG. 11).

The differences in easiness of data erasing between the memory cells in each memory array become smaller by division of one memory array into two memory arrays 1a and 1b. Thus, the excess erase is less liable to occur in each of memory arrays 1a and 1b. Accordingly, the liability of occurrence of the excess erase in the memory cells in memory arrays 1a and 1b after the completion of the circuit operation in the erase mode of the flash EEPROM is substantially reduced as compared to the conventional.

This flash EEPROM may be set in the erase mode in arbitrary methods. For example, like the case with the conventional flash EEPROM shown in FIG. 24, this flash EEPROM can be set to operate in the erase mode in response to external control signals such as erase enable signal $\overline{EE}$ and the like.

In this embodiment, even if a data-erase defective memory cell is detected in the erase verify cycle, no erase pulses are again applied to the memory arrays before all memory cells MC in the memory cell arrays are checked. Further, in the erase verify cycle after an erase pulse is again applied to the memory arrays, the memory cells of each memory array are again all checked in the order of address. Thus, it takes time that erase pulses are actually applied to a data-erase defective memory cell since this data-erase defective memory cell has been detected. Also, even a memory cell which is already verified that data erasing is completed is again checked. Therefore, a more efficient data erasing is less likely to be achieved.

Figure 5:
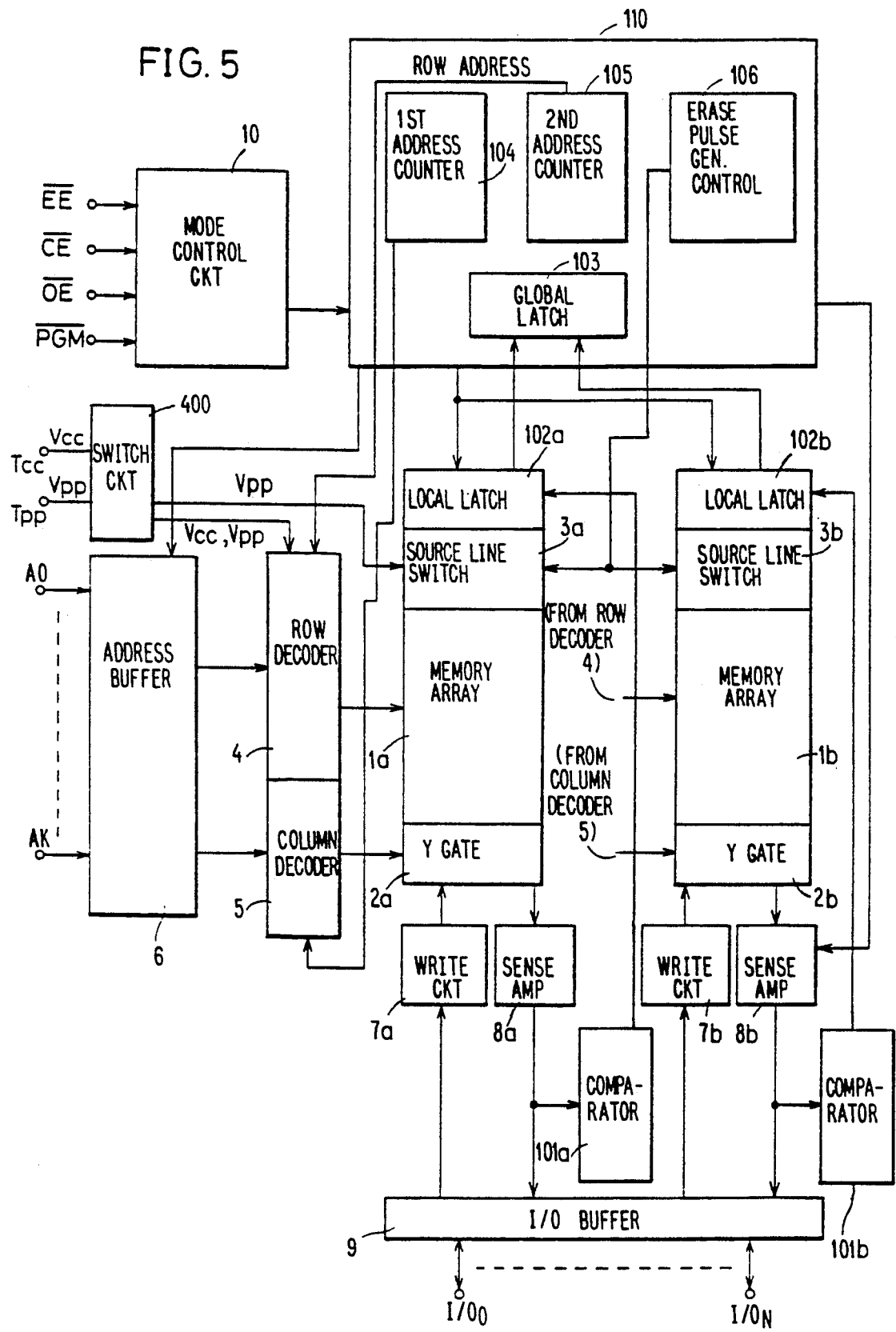
FIG. 5 is a partial schematic block diagram showing structure of a flash EEPROM according to another embodiment of the present invention.
Figure 6:
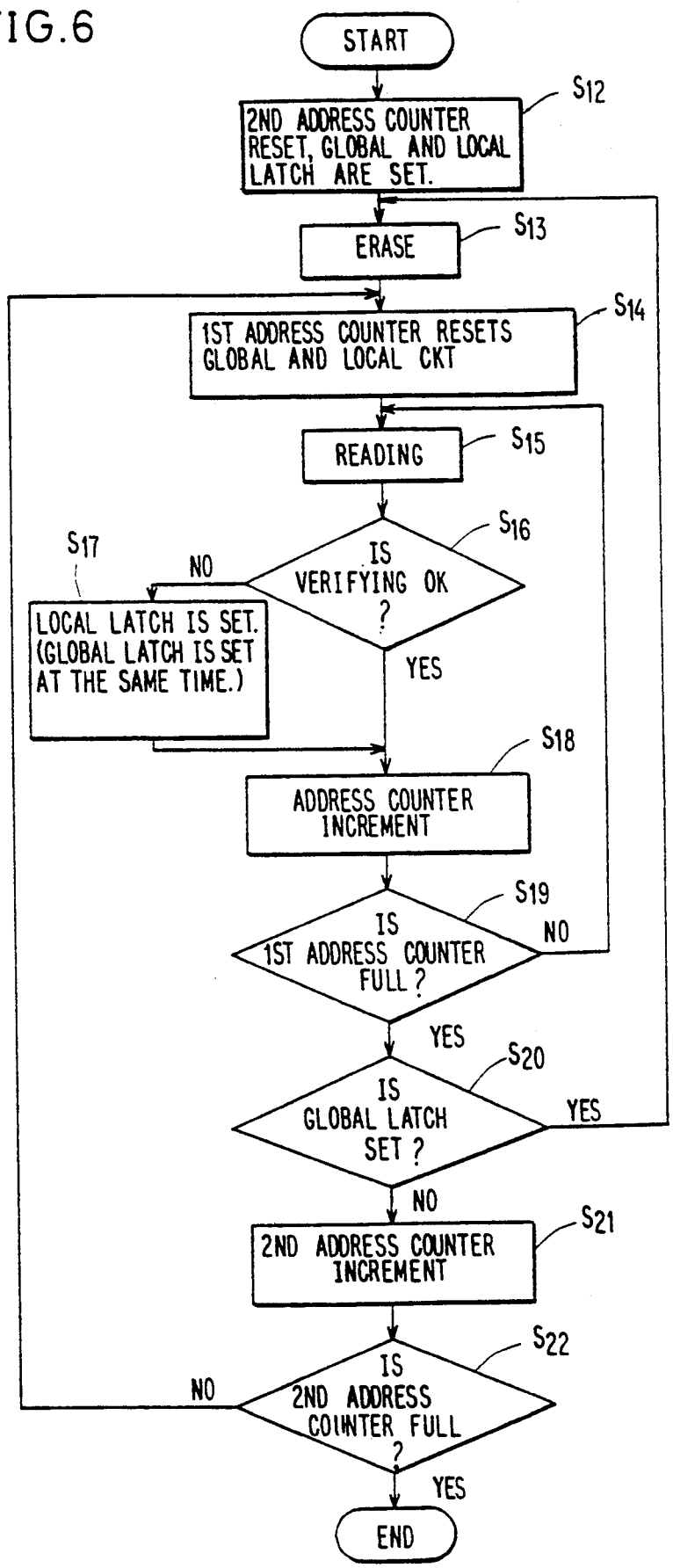
FIG. 6 is an operation flow chart for explaining an operation of the flash EEPROM of FIG. 5 in an erase mode.
Figure 13:
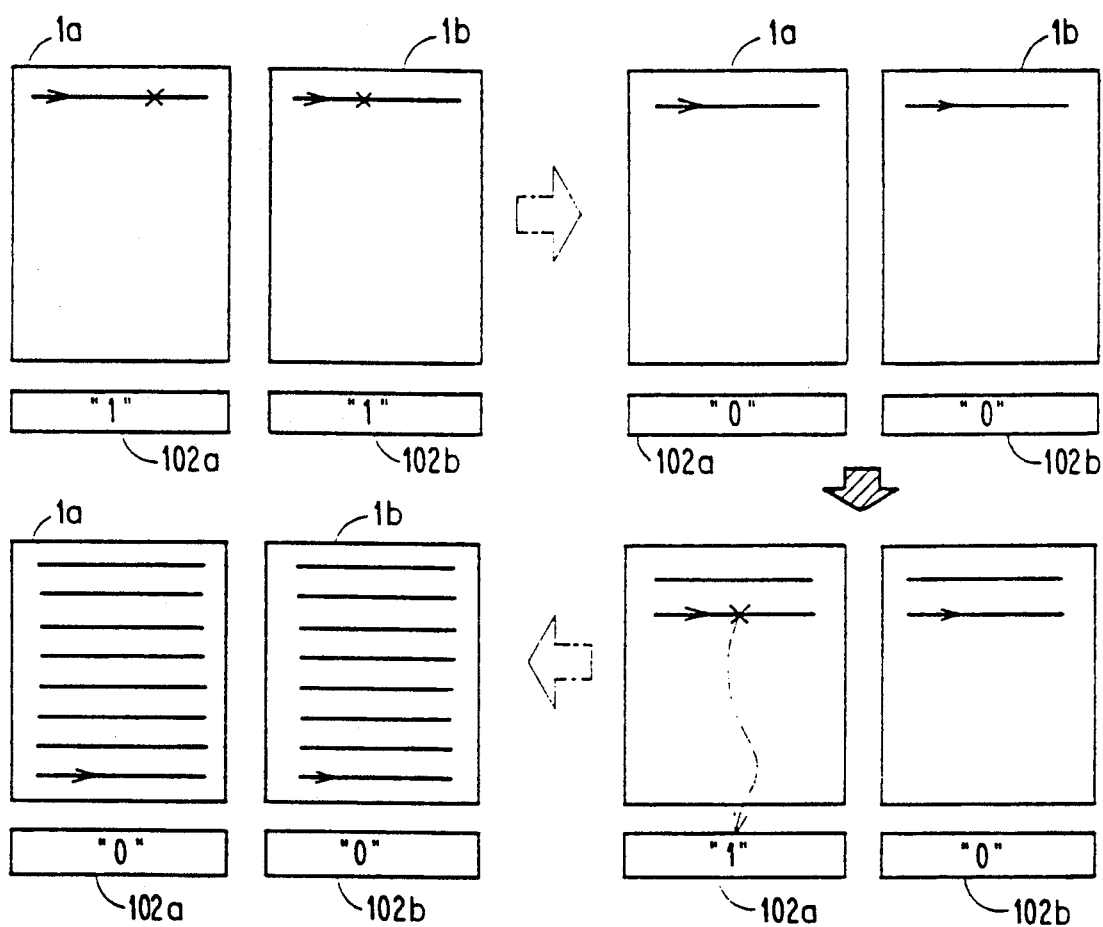
FIG. 13 is a diagram conceptionally showing a data reading method in an erase verify cycle according to the embodiment shown in FIGS. 5 and 6.

FIG. 5 is a partial schematic block diagram showing structure of an improved flash EEPROM which can perform data erasing more efficiently than the flash EEPROM of the foregoing embodiment and shows another embodiment of the present invention. Circuitry relating to data erasing is mainly shown in FIG. 5. FIG. 6 is an operation flow chart showing the flow of operation of the flash EEPROM of FIG. 5 in the data erase mode. FIG. 13 is a diagram conceptionally showing a data reading method in the data erase mode of the flash EEPROM of FIG. 4. A detailed description will now be given on the structure and the operation of the flash EEPROM of FIG. 5 for data erasing, with reference to FIGS. 6 and 13.

Referring to FIG. 5, a memory array is divided into two sub-arrays 1a and 1b in this flash EEPROM as in the case of the former embodiment. A Y gate 2a, a source line switch 3a, a write circuit 7a, a sense amplifier 8a, a comparator 101a and a local latch circuit 102a are provided corresponding to memory array 1a. Similarly, a Y gate 2b, a source line switch 3b, a write circuit 7b, a sense amplifier 8b, a comparator 101b and a local latch circuit 102b are provided corresponding to memory array 1b. The configuration of each of memory arrays 1a and 1b is the same as that in the foregoing embodiment. In this embodiment, a row decoder 4 is commonly provided to both memory arrays 1a and 1b. Similarly, a column decoder 5 is also commonly provided to both Y gates 2a and 2b.

An erase control circuit 110 includes a global latch circuit 103, a first address counter 104, a second address counter 105 and an erase pulse generation control circuit 106. First address counter 104 generates column address signals designating column addresses of memory arrays 1a and 1b. Second address counter 105 generates row address signals designating row addresses of memory arrays 1a and 1b. An address buffer 6 receives external address signals from external address terminals A0-AK, the column address signal generated by first address counter 104 and the row address signal generated by second address counter 105. An input/output buffer 9 is provided between external input/output terminals I/O$_0$-I/O$_N$ and a set of write circuits 7a and 7b and sense amplifiers 8a and 8b. A mode control circuit 10 receives control signals such as an erase enable signal $\overline{EE}$, a chip enable signal $\overline{CE}$, an output enable signal $\overline{OE}$, a program signal $\overline{PGM}$, etc. from external terminals. A switch circuit 107 receives an externally applied high voltage V$_{PP}$ required for data erasing and data writing. It is assumed that when a count value of first address counter 104 indicates the maximum value, a column address signal generated by first address counter 104 indicates final column addresses of memory arrays 1a and 1b. Similarly, it is assumed that when a count value of second address counter 105 indicates the maximum value, a row address signal generated by second address counter 105 indicates final row addresses of memory arrays 1a and 1b.

Also in this embodiment, a circuit operation in the data erase mode includes repetition of an erase cycle in which erase pulses are applied to the memory arrays and an erase verify cycle in which data is read from each of memory cells in the memory arrays, and then a verification is made in response to the read data as to whether or not a data erase is completed. Referring to FIG. 13, according to this embodiment, storage data of memory cells of a single row are read in the order of addresses simultaneously from memory arrays 1a and 1b in a single erase verify cycle. At the time when a memory cell X in which data is unerased is detected by this reading, data "1" indicating that the data-unerased memory cell exists is set in a latch circuit (102a, 102b) corresponding to the memory array including this data-unerased memory cell.

Figure 23:
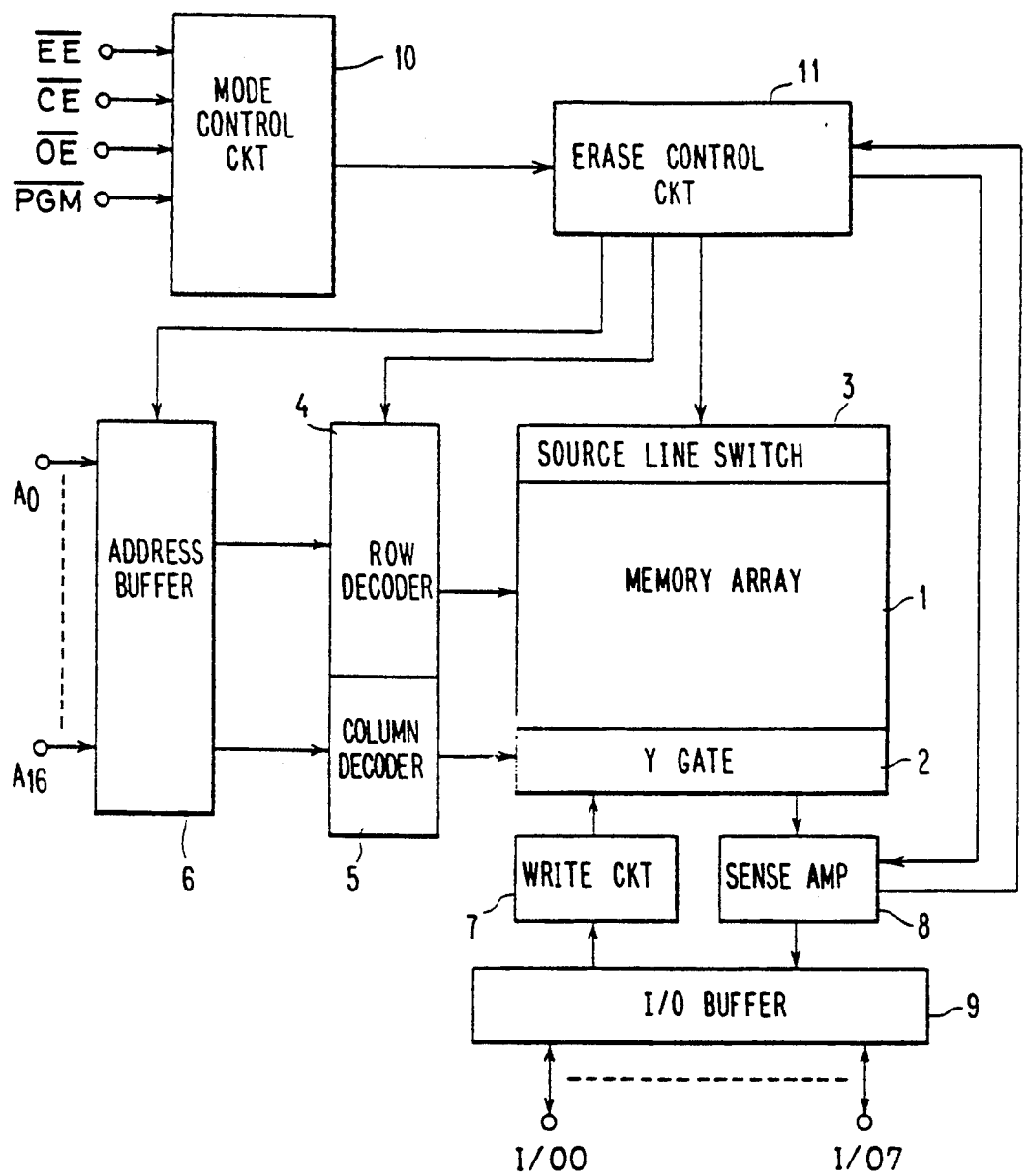
FIG. 23 is a schematic block diagram showing the structure of an improved conventional flash EEPROM.
Figure 24:
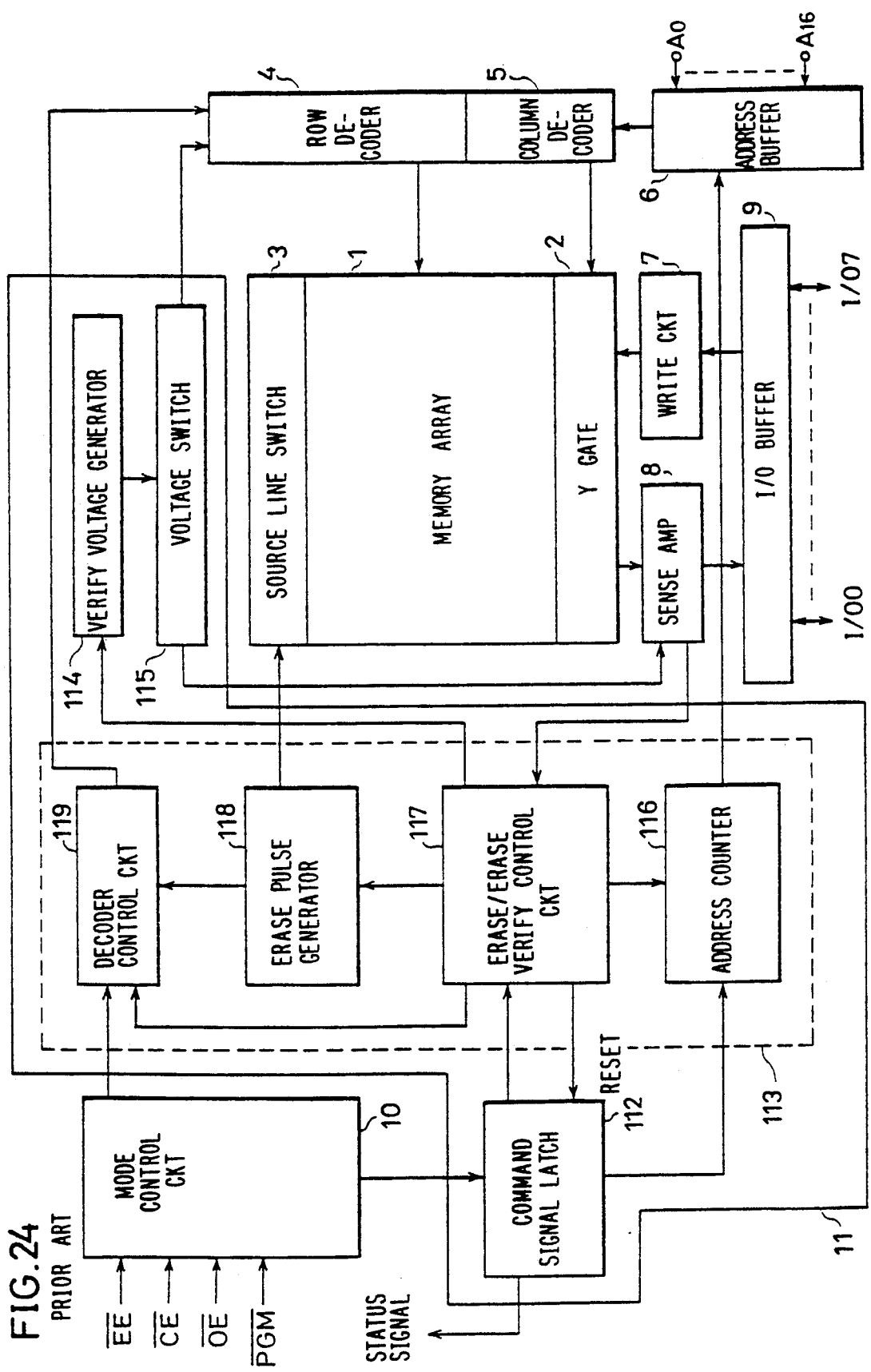
FIG. 24 is a schematic block diagram showing a specific internal configuration of an erase control circuit of FIG. 23.
Figure 25:
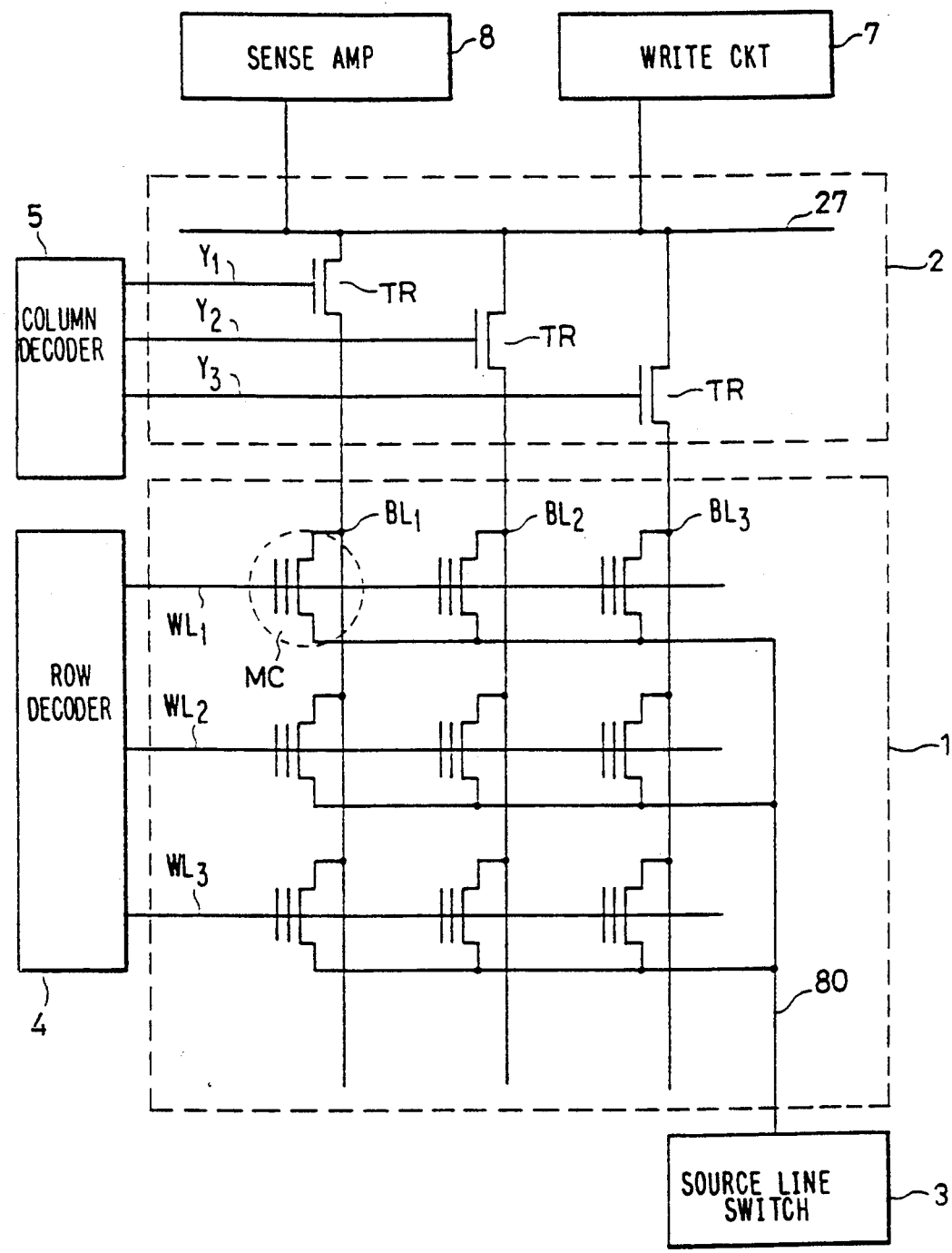
FIG. 25 is a circuit diagram showing the internal configuration of a Y gate and a memory array.
Figure 26:
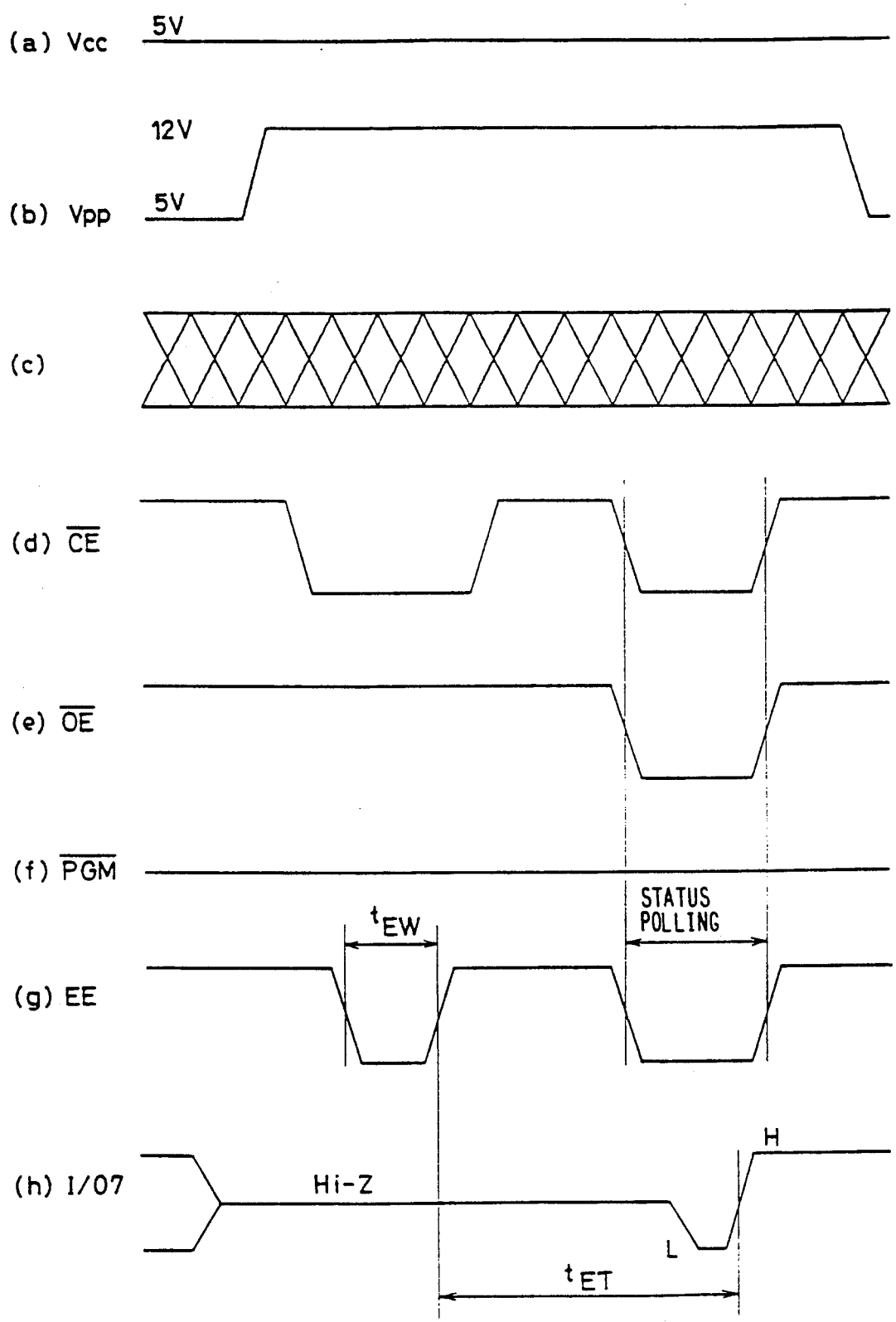
FIG. 26 is a timing chart for explaining the operation of the flash EEPROM shown in FIGS. 23 and 24.

Like the case with the conventional flash EEPROM shown in FIGS. 23 and 24, mode control circuit 10 responds to external control signals $\overline{EE}$, $\overline{CE}$, $\overline{OE}$ and $\overline{PGM}$ to output signals designating operation modes of this flash EEPROM. When mode control circuit 10 outputs the signal designating an erase mode, then in response to this, erase control circuit 110 controls the circuitry relating to a data erase so that the erase cycle and the erase verify cycle may repeat alternately.

In the erase mode, address buffer 6 is deactivated by erase control circuit 11, while first and second address counters 104 and 105 are activated. This enables first and second address counters 104 and 105 to start their counting operations, to generate a column address signal and a row address signal. The column address signal generated by first address counter 104 is applied to column decoder 5. The row address signal generated by second address counter 105 is applied to row decoder 4.

In the erase cycle, a switch circuit 400 supplies an external high voltage $V_{PP}$ to source line switches 3a and 3b. Erase pulse generation control circuit 106 outputs a pulse signal having a definite short pulse width in the erase cycle. Only when the data "1" is latched in local latch circuit 102a, source line switch 3a supplies the high voltage $V_{PP}$ applied from switch circuit 400 to a source line (not shown) in memory array 1a during the period when the pulse signal is being applied from erase pulse generation control circuit 106. Similarly, only when the data "1" is latched in local latch circuit 102b, source line switch 3b supplies the applied high voltage $V_{PP}$ to source line 80b (not shown) in memory array 1b during the period when the pulse signal is being applied from erase pulse generation control circuit 106. In the erase cycle, row decoder 4 supplies the ground potential to all word lines 50a and 50b in memory arrays 1a and 1b. Thus, only when the data "1" is latched in local latch circuit 102a, source line switch 3a applies erase pulses to memory array 1a. Only when the data "1" is latched in local latch circuit 102b, source line switch 3b applies erase pulses to memory array 1b (operation step S13 of FIG. 6).

Local latch circuit 102a and source line switch 3a correspond to erase voltage applying circuit 18a in the previous embodiment, and local latch circuit 102b and source line switch 3b correspond to erase voltage applying circuit 18b in the previous embodiment. Each of source line switches 3a and 3b includes high voltage switch 500 and high voltage pulse source 700, for example, shown in FIG. 2. Both local latch circuits 102a and 102b correspond to, for example, latch circuit 300 of FIG. 2.

After the erase pulses are applied to memory arrays 1a and 1b, this flash EEPROM moves to the erase verify cycle. A description will now be made of a circuit operation in the erase verify cycle.

First, a count value of first address counter 104 is reset at the beginning of the erase verify cycle (operation step S14 of FIG. 6). At the same time, erase control circuit 110 resets latch data of local latch circuits 102a and 102b to "0" (the above operation step S14). Switch circuit 400 supplies a supply voltage $V_{CC}$ to row decoder 4 in the erase verify cycle.

Next, erase control circuit 110 controls row decoder 4, column decoder 5 and sense amplifiers 8a and 8b so as to enable a normal data reading from memory arrays 1a and 1b. Accordingly, row decoder 4 supplies a supply voltage of a logic high level from switch circuit 107 to only a single word line of the word lines in each of memory arrays 1a and 1b, corresponding to a row address signal applied from second address counter 105. Column decoder 5 selects a single bit line, corresponding to a column address signal from first address counter 104, one from the bit lines in memory array 1a and one from the bit lines in memory array 1b. Each of sense amplifiers 8a and 8b determines whether or not there is a current flowing through the bit line selected by column decoder 5 and then outputs a data signal corresponding to a result of this determination. As a result, data of a memory cell located at the position determined by a column address designated by the column address signal generated by first address counter 104 and a row address designated by the row address signal generated by second address counter 105 is read simultaneously from each of memory arrays 1a and 1b (operation step S15 of FIG. 6).

Then, comparator 101a compares output data of sense amplifier 8a, i.e., storage data of the memory cell selected at present in memory array 1a with the data "1" indicating that a data erase is completed (operation step S16 of FIG. 6). If the two data match each other, a determination can be made that the data erase with respect to the memory cell presently selected in memory array 1a is completed, so that comparator 101a holds local latch circuit 102a in a reset state. Conversely, if the two data do not match each other, however, a determination can be made that the data erase with respect to the presently selected memory cell is not completed, so that comparator 101a sets data "1" in local latch circuit 102a (operation step S17 of FIG. 6).

The circuit operation corresponding to the above operation steps S16 and S17 is also carried out in comparator 101b and local latch circuit 102b. More specifically, comparator 101b compares output data of sense amplifier 8b, i.e., storage data of the memory cell presently selected in memory array 1b with the data "1" indicating the completion of the data erase. Then, a determination is made as to whether or not the data erase with respect to the presently selected memory cell is completed (operation step S16). If the compared two data match each other, comparator 101b holds local latch circuit 102b in the reset state. Conversely, if the two data do not match each other, however, comparator 101b sets data "1" in local latch circuit 102b (operation step S17).

In operation step S17, if the data "1" is set in at least one of local latch circuits 102a and 102b, the data "1" is set in global latch circuit 103 in response to latch data of the local latch circuit being in the set state.

When the circuit operations in operation steps S16 and S17 of FIG. 6 are completed, the count value of first address counter 104 is incremented in erase control circuit 110 (operation step S18 of FIG. 6). Then, a determination is made as to whether or not the incremented count value exceeds a value corresponding to a column address signal indicating the final column address operation step S19 of FIG. 6). If the incremented count value does not exceed the value corresponding to the final column address, it is considered that there are bit lines which are unselected yet in the present erase verify cycle in respective memory arrays 1a and 1b. Thus, in this case, data are read from memory arrays 1a and 1b in response to a column address signal generated by first address counter 104 after this increment and a row address signal generated from second address counter 105 (operation steps S19 and S15 of FIG. 5). That is, the circuit operation corresponding to operation steps S15–S19 of FIG. 5 restarts. At this time, since the count value of second address counter 105 is not incremented, storage data of the memory cell arranged at the cross-over point between the same word line as the previously selected word line and the next bit line to the previously selected bit line is read from each of memory arrays 1a and 1b. Then, a determination is made in response to the data read from this memory cell as to whether or not the memory cell selected at this time in each of memory arrays 1a and 1b is a data-erase defective memory cell. In response to a result of this determination, local latch circuits 102a and 102b are set.

Such a circuit operation repeats until the count value of first address counter 104 reaches the maximum value. More specifically, erase verifying is carried out for each of memory cells of one row in memory array 1a, corresponding to the row address signal presently generated from second address counter 105 and for each of memory cells of one row in memory array 1b, corresponding to the row address signal presently generated by second address counter 105. If there is even one data-erase defective memory cell in the one-row memory cells in memory array 1a, the data "1" is set in local latch circuit 102a and global latch circuit 103. Similarly, if there is even one data-erase defective memory cell in the one-row memory cells in memory array 1b, the data "1" is set in local latch circuit 102b and global latch circuit 103. Thus, if there is even one data-erase defective memory cell in the one-row memory cells in each of memory arrays 1a and 1b, the data "1" is set in global latch circuit 103.

Figure 21:
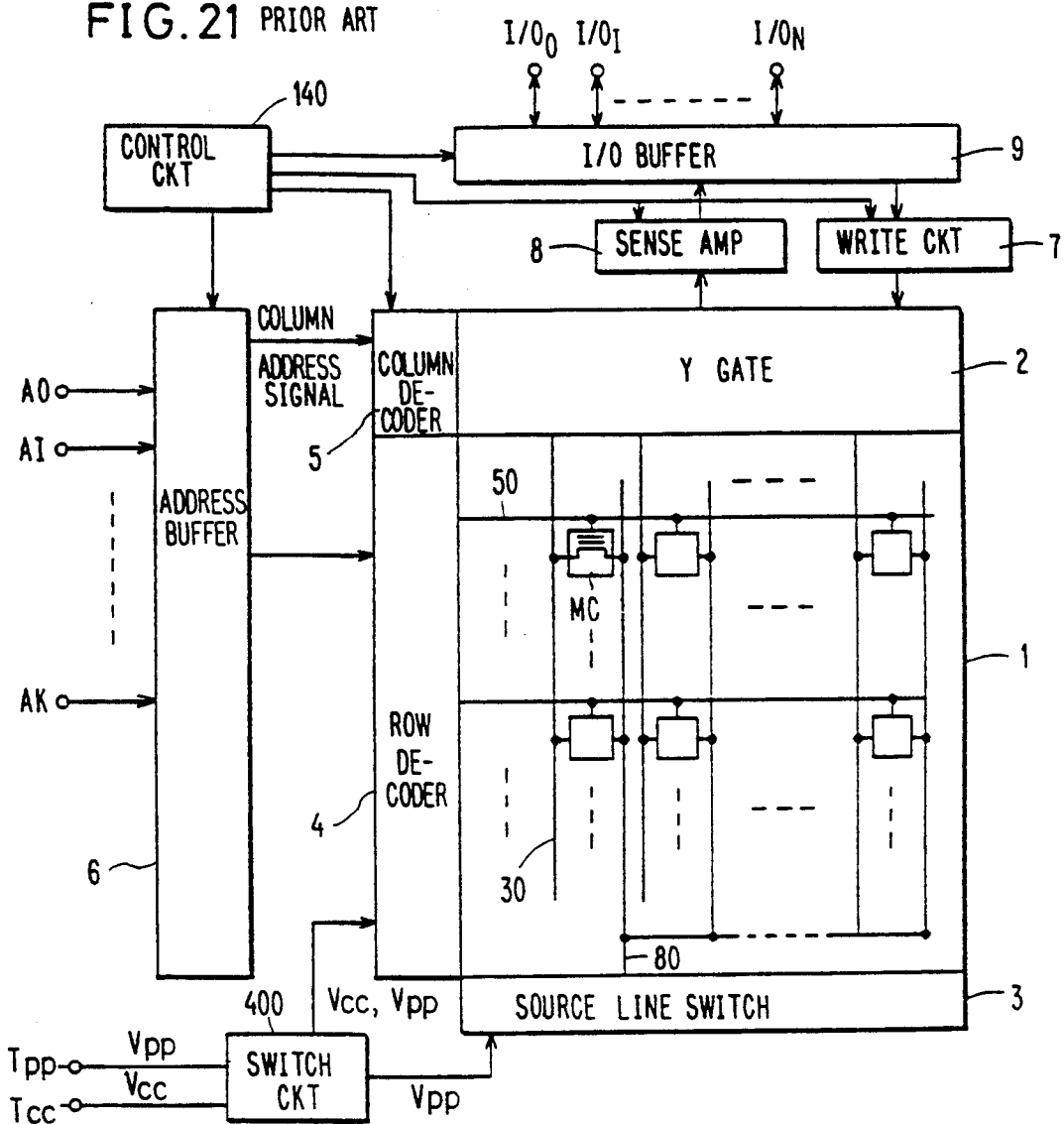
FIG. 21 is a partial schematic block diagram of a conventional flash EEPROM.

When the count value of first address counter 104 reaches the maximum value, and the circuit operation corresponding to operation steps S15–S19 of FIG. 6 is completed with respect to all column addresses, a determination is made as to whether or not the data "1" is set in global latch circuit 103 (operation step S20 of FIG. 6). If the data "1" is set in global latch circuit 103, it is considered that a data-erase defective memory cell exists in either the memory cells of one row in memory array 1a or those of one row in memory array 1b, for which the erase verifying has been carried out in this erase verify cycle. Thus, in case where the data "1" is set in global latch circuit 103, the circuit operation of the flash EEPROM returns to the erase cycle. That is, a series of circuit operations corresponding to operation steps S13–S21 of FIG. 21 restart. If the data "1" is not set in global latch circuit 103, however, it is considered that a data-erase defective memory cell exists in neither the one-row memory cells in memory array 1a nor those in memory array 1b, for which the erase verifying has been carried out in this erase verify cycle. Thus, in this case, the count value of second address counter 105 is incremented in order to check whether or not there is a data-erase defective memory cell in the row corresponding to the next address to the address designated by the row address signal currently generated by second address counter 105 (operation step S21 of FIG. 6).

If the row address signal generated by second address counter 105 is incremented by this increment, there is a row which is not yet erase-verified in each of memory arrays 1a and 1b. In this case, the circuit operation corresponding to operation steps S14–S22 of FIG. 6 is carried out again (operation step S22 of FIG. 6).

As described above, in this embodiment, each time the memory cells of one row are checked with respect to each of memory arrays 1a and 1b, erase pulses are again applied to only the memory array where a data-erase defective memory cell exists in the checked row. If the data-erase defective memory cell no longer exists in this row (if the result of the determination in operation step S20 is "No"), the count value of second address counter 105 is incremented. Therefore, if the row, in which the data-erase defective memory cell exists, is detected, erase pulses are again applied until data of this memory cell is completely erased. Then, if the data of this memory cell is completely erased, the next row undergoes the erase verifying (see FIG. 13). The count value of second address counter 105 is reset in response to entrance of the flash EERPOM into the erase mode (operation step S12 of FIG. 6). Thus, when the count value of second address counter 105 reaches the maximum value, and the data of all the memory cells included in the row corresponding to the final address in each of memory arrays 1a and 1b are completely erased, then the data of the memory cells of all the addresses in memory arrays 1a and 1b are erased to the end. That is to say, in the final erase verify cycle, storage data of all the memory cells arranged in the respective final rows are read from respective memory arrays 1a and 1b without the data "1" being latched in any local latch circuit provided corresponding to any one of memory arrays 1a and 1b (see FIG. 13). Therefore, the flash EEPROM completes the whole operation for data erasing and erase verifying and then departs from the erase mode.

In practice, erase control circuit 110 is incorporated into control circuitry of this flash EEPROM. The increment of the count values of first and second address counters 104 and 105, the determination of the latch data of global latch circuit 103, the operation control of erase pulse generation control circuit 106, and the like are executed by a control operation of this control circuitry.

Like the conventional, each of write circuits 7a and 7b serves as a circuit for writing data into selected memory cells in memory arrays 1a and 1b by supplying a voltage corresponding to data applied from input/output buffer 9 to Y gates 2a and 2b in a data write mode.

As has been described, in this embodiment, the re-application of erase pulses to memory arrays 1a and 1b is carried out every time the memory cells of one row are checked. Thus, in case where there are data-erase defective memory cells in unchecked rows, a data erase is also carried out for the unchecked data-erase defective memory cells by erase pulses generated for the previously detected data-erase defective memory cell. Thus, the erasing of data of all the memory cells in memory arrays 1a and 1b requires shorter time as compared to the previous embodiment.

Figure 7:
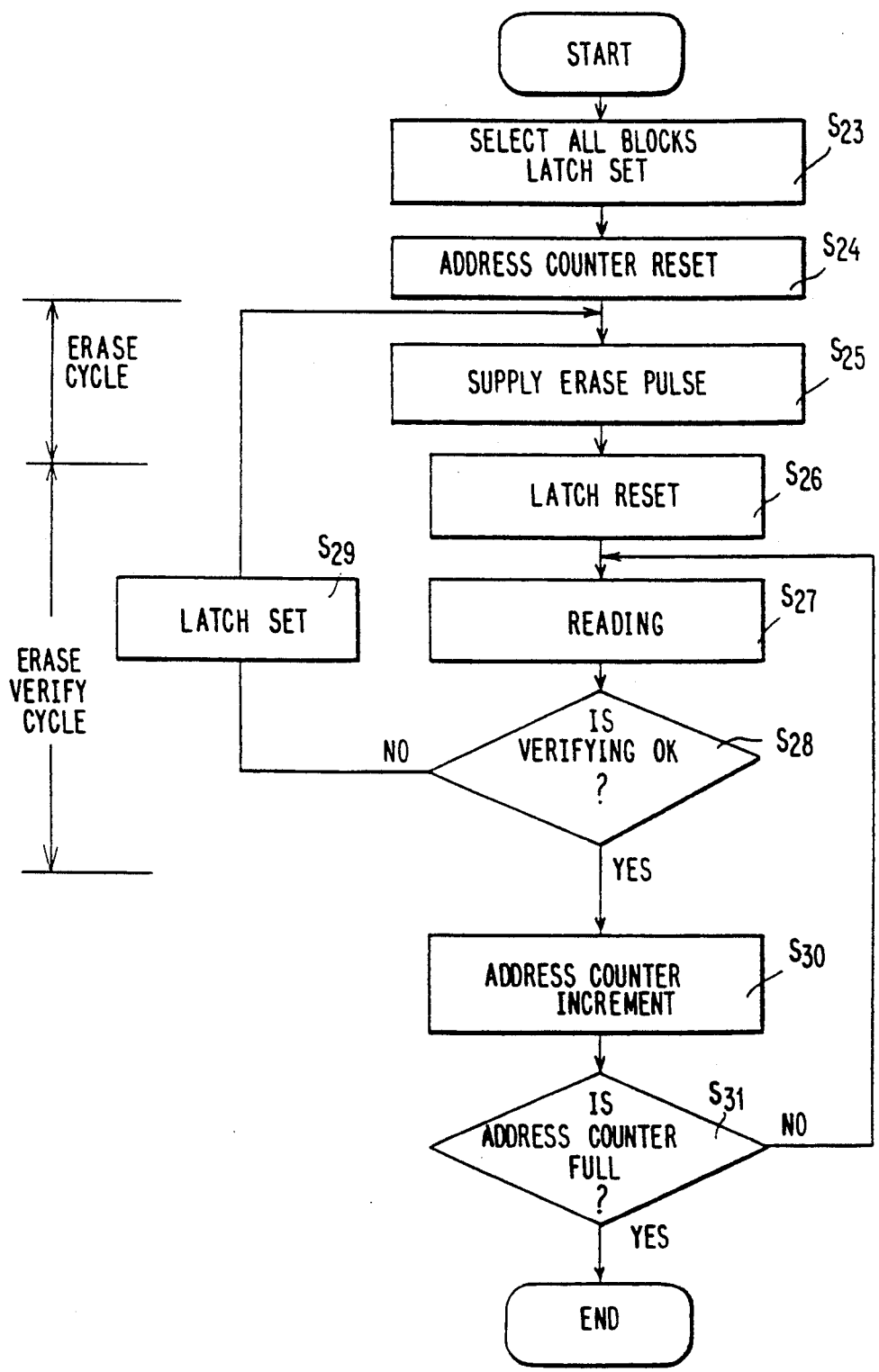
FIG. 7 is an operation flow chart showing a circuit operation of a flash EEPROM according to still another embodiment of the present invention.
Figure 14:
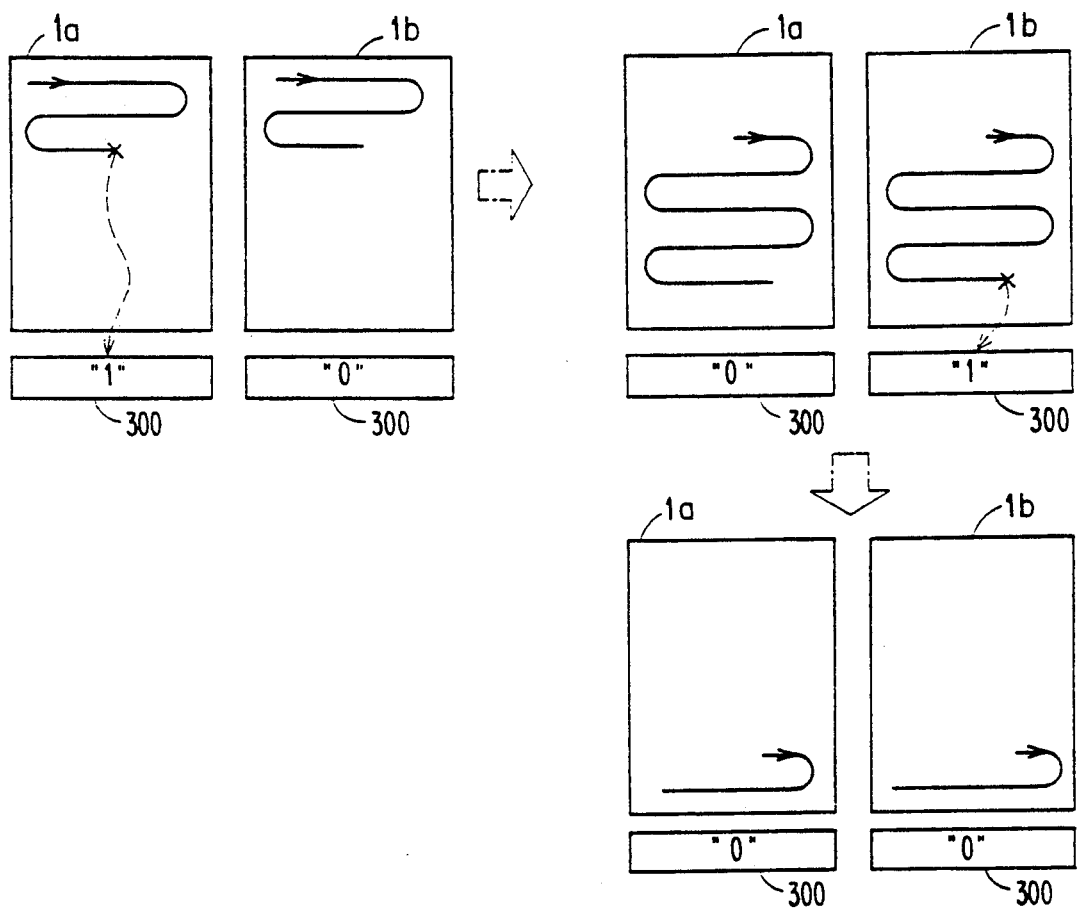
FIG. 14 is a diagram conceptionally showing a data reading method in an erase verify cycle according to the embodiment shown in FIG. 7.

According to the above-described embodiment, in a single erase verify cycle, the storage data of all the memory cells of a single row are read from each memory array independently of the detection of the data-unerased memory cell in the course of the cycle; however, at the time when the data-unerased memory cell is detected in the single erase verify cycle, the circuit operation for data reading may be interrupted so as to start an erase cycle. Such a flash EEPROM is implemented with the structure shown in, for example, FIG. 1. FIG. 7 is an operation flow chart showing the flow of a circuit operation of a flash EEPROM to which erase pulses are applied immediately after a data-unerased memory cell is detected and showing still another embodiment of the present invention. FIG. 14 is a diagram conceptionally representing a data reading method in an erase verify cycle according to the embodiment shown in FIG. 7.

Referring to FIGS. 1, 7 and 14, according to this embodiment, a circuit operation at the beginning of the erase mode (operation steps S23 and S24 of FIG. 7) and a circuit operation in the erase cycle (operation step S25 of FIG. 7) are the same as those in the embodiment of FIGS. 1-4. In the erase verify cycle, however, as shown in FIG. 14, storage data of each memory cell is read in the order of addresses simultaneously from memory arrays 1a and 1b. At the time when the data-unerased memory cell is detected by this reading, data "1" is set in latch circuit 300 provided corresponding to the memory array including this data-unerased memory cell. Immediately after the data "1" is set in latch circuit 300, erase pulses are applied to this memory array. Then, if the data of the detected memory cell is completely erased, simultaneous data reading from memory arrays 1a and 1b restarts. This data reading starts from the next address of the detected memory cell. A series of circuit operations are thereafter repeated as follows: data reading→detection of the data-unerased memory cell→application of erase pulses→verifying that data of the detected memory cell is completely erased→restarting of data reading from the next address of the detected memory cell. Thus, in the final erase verify cycle, storage data of all the remaining memory cells are read in the order of addresses from respective memory arrays 1a and 1b without data "1" being set in latch circuit 300 provided corresponding to any one of memory arrays 1a and 1b. A detailed description will now be given of the circuit operation in the erase verify cycle with reference to FIG. 7.

In the erase verify cycle, the latch circuits in respective erase voltage applying circuits 18a and 18b are first reset (operation step S26). Then, sense amplifiers 8a and 8b read storage data of memory cells provided at the location corresponding to an address signal applied from address counter 19 at that time, simultaneously from respective memory arrays 1a and 1b (operation step S27). Then, verifying/erasing control circuits 17a and 17b determine whether or not the data read by sense amplifiers 8a and 8b indicate that "erasing is complete" (operation step S28). If the result of the determination in verifying/erasing control circuit 17a or that in verifying/erasing control circuit 17b is "No", the circuit operation proceeds to operation step S29. In operation step S29, the verifying/erasing control circuit which determines "No" applies a signal ERS for setting data "1" in latch circuit 300 in a corresponding erase voltage applying circuit. If the data "1" is set in one of latch circuits 300, the flash EEPROM of this embodiment enters in the erase cycle, so that erase pulses are output from high voltage pulse source 700. Consequently, the erase pulses are applied from the corresponding erase voltage applying circuit to ones of memory arrays 1a and 1b, which includes a data-unerased memory cell. Since an address signal provided at this time is the same as the previously mentioned address signal, the data of the same memory cells as the previous ones are thereafter again read from respective memory arrays 1a and 1b. Erase verifying is thus carried out for these same memory cells (operation steps S27 and S28). In operation step S28, if both the data read from memory arrays 1a and 1b indicate that "data erasing is completed", verifying/erasing control circuits 7a and 7b increment the count value of address counter 19 (operation step S30). If the incremented count value does not exceed a value corresponding to the final address of each of memory arrays 1a and 1b, data are read from memory arrays 1a and 1b by sense amplifiers 8a and 8b, respectively (operation steps S27 and S31). At this time, since the count value of address counter 19 is higher by one than the count value obtained in the previous data reading, data are read from a memory cell at the next address of the memory cell from which data is read previously. Thus, erase verifying is carried out for the next memory cell of the memory cell subjected to the previous erase verifying. When data erasing with respect to all the memory cells up to the final address of each of memory arrays 1a and 1b is completed with the circuit operations in operation steps S25-S31 thus repeated, the incremented count value of address counter 19 in operation step S30 exceeds the value corresponding to the final address, i.e., the result of the determination in operation step S31 is "YES". Accordingly, all the circuit operations in the erase mode are completed.

Figure 8:
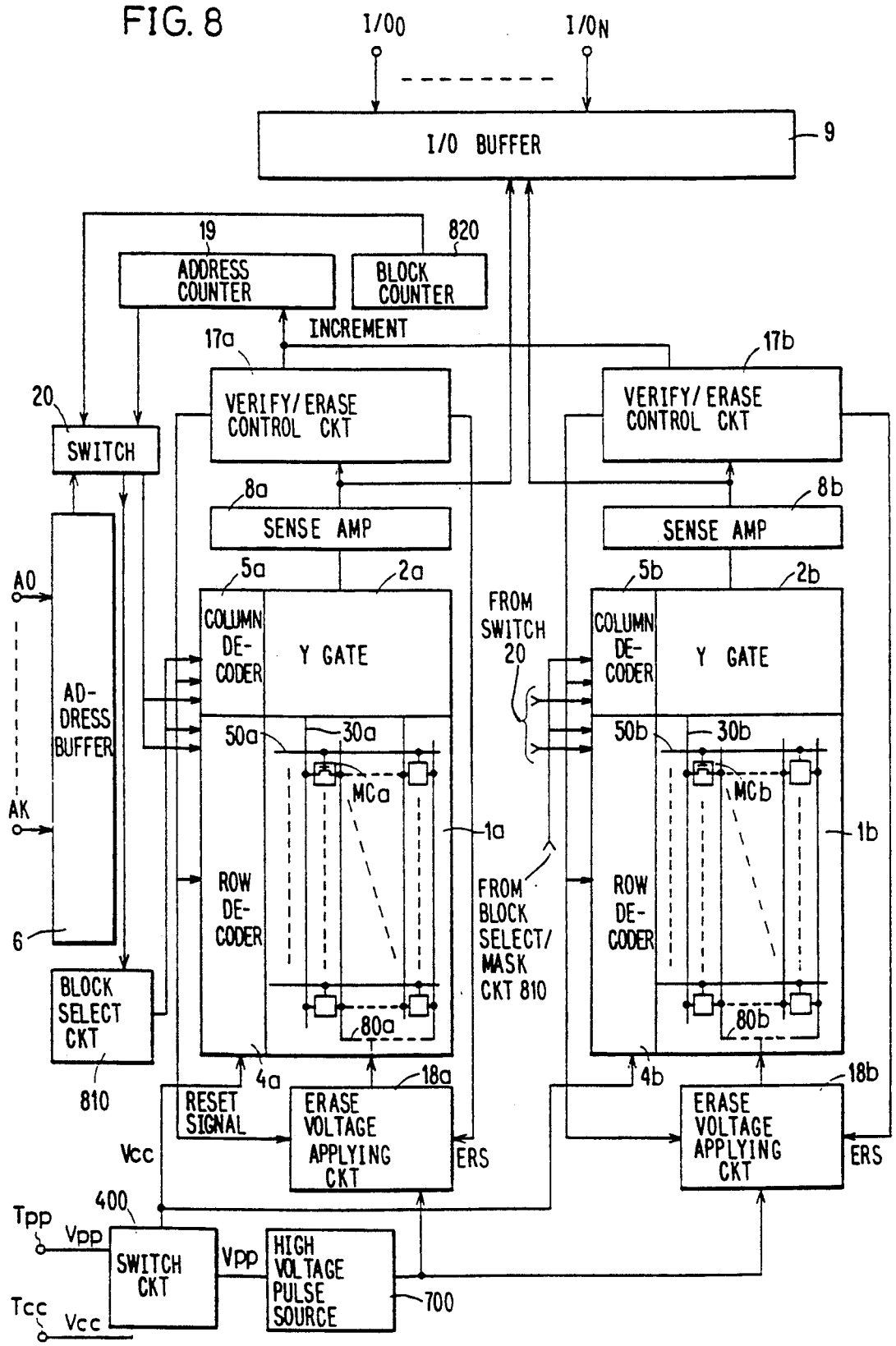
FIG. 8 is an operation flow chart showing a circuit operation of a flash EEPROM according to still another embodiment of the present invention.
Figure 9:
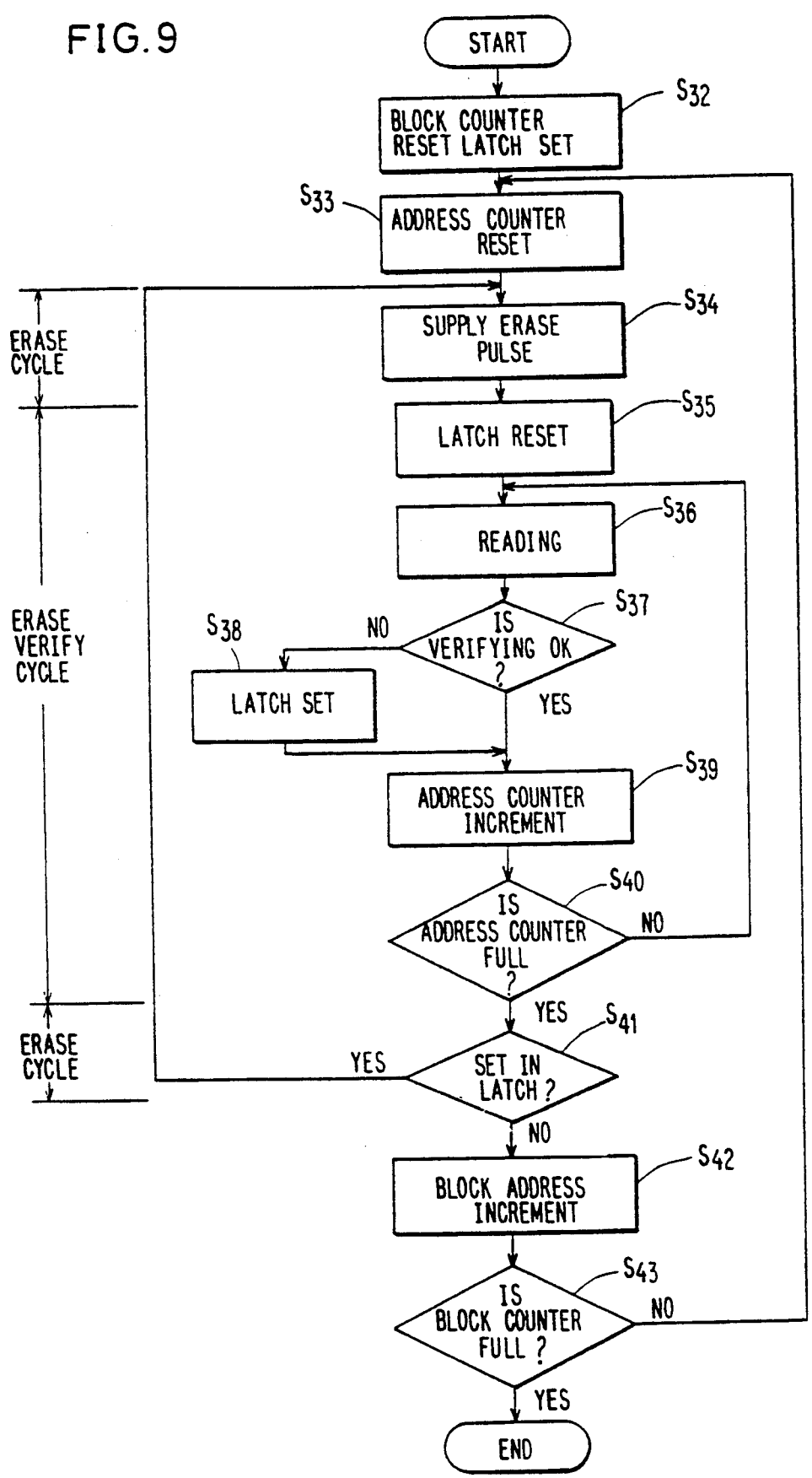
FIGS. 9 and 10 are operation flow charts each showing examples of circuit operations available in the flash EEPROM shown in FIG. 8.
Figure 10:
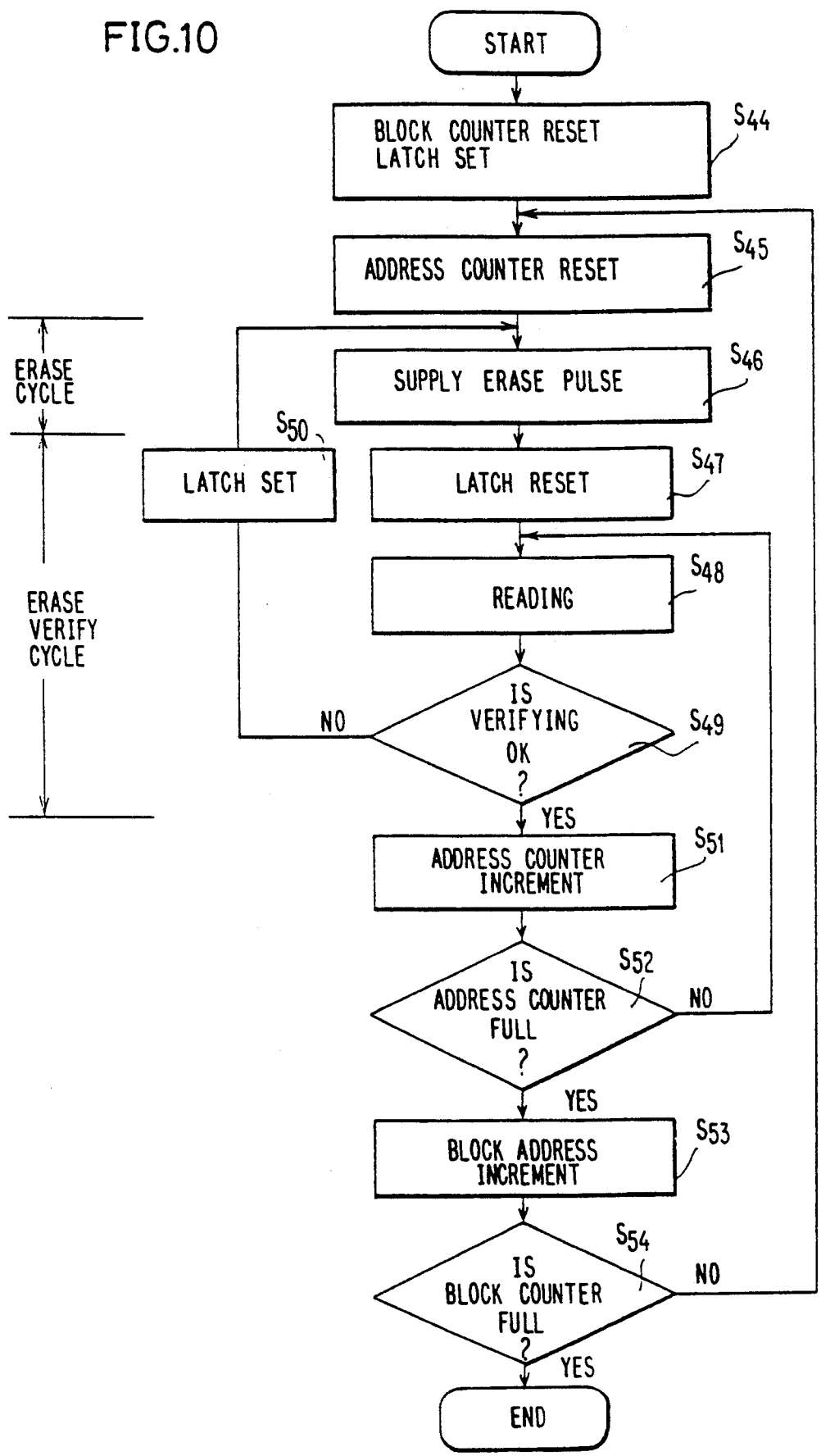
Figure 12:
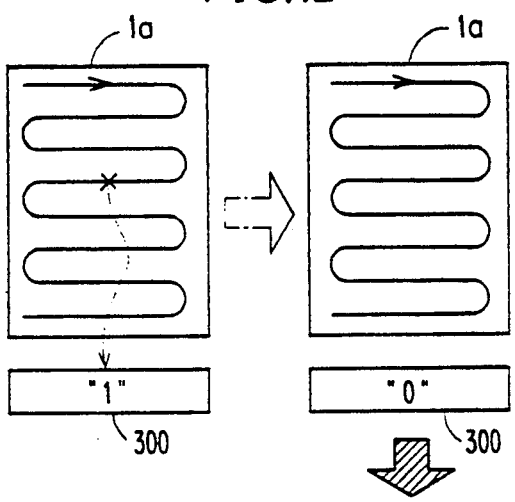
FIG. 12 is a diagram conceptionally showing a data reading method in an erase verify cycle according to the embodiment shown in FIG. 9.
Figure 15:
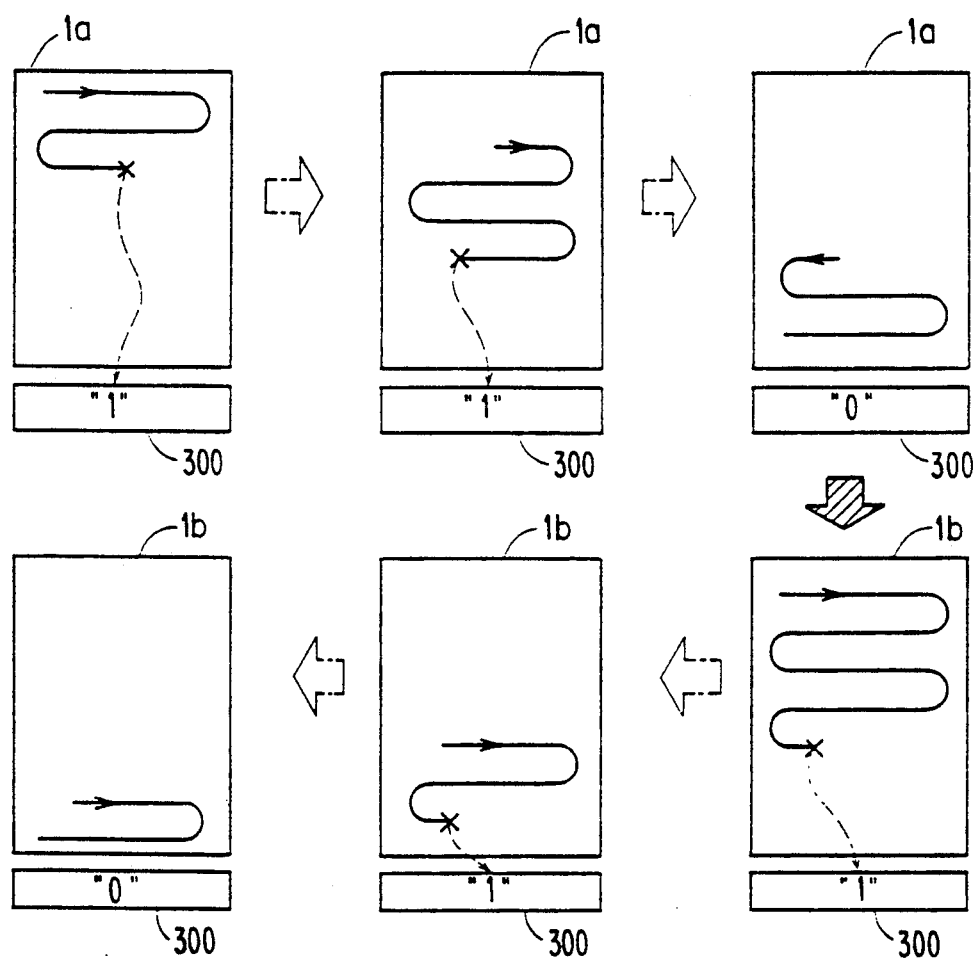
FIG. 15 is a diagram conceptionally showing a data reading method in an erase verify cycle according to the embodiment shown in FIG. 10.

While the erase verifying is simultaneously carried out for memory arrays 1a and 1b in the foregoing embodiments, the erase verifying for memory array 1a and that for memory array 1b may be carried out in time sequence. In this case, since a data erase for one of memory arrays 1a and 1b does not start unless a data erase for the other memory array is completed, data erase time is increased, but power consumption required for the data erase is reduced as compared to the foregoing two embodiments. FIG. 8 is a schematic block diagram showing the configuration of a flash EEPROM in which an erase verifying for memory array 1a and that for memory array 1b can be carried out in time sequence and showing still another embodiment of the present invention. FIGS. 12 and 15 are diagrams each conceptionally showing a data reading method in erase verifying, which is enabled by the configuration of FIG. 8. FIGS. 9 and 10 are flow charts showing the flow of circuit operations of the flash EEPROM of FIG. 8 for realizing the data reading method shown in FIGS. 12 and 15.

Referring to FIG. 8, this flash EEPROM is the same as the one shown in FIG. 1 except for the points that a block counter 820 is provided and that a block select circuit 810 including no mask circuit is provided at a succeeding stage of switch circuit 20.

In the erase mode, block counter 820 generates a block address signal by a counting operation. That is, block counter 820 generates a block address signal indicating the next memory array of a memory array indicated by the block address signal which has been applied so far, every time its count value is incremented by one. In this embodiment, it is assumed that a block address signal provided when the count value is minimum designates memory cell array 1a, while a block address signal provided when the count value is higher by one than this minimum value designates memory cell array 1a. It is also assumed that an address signal output from address counter 19 includes no block address signal.

In the erase mode, switch circuit 20 applies an output of address counter 19 to row decoders 4a and 4b and column decoders 5a and 5b, while it applies an output of block counter 820 to block select circuit 810. Block select circuit 810 activates a column decoder and row decoder provided corresponding to one of memory arrays 1a and 1b which is designated by an address signal from switch circuit 20, whereas it inactivates the other column decoder and the other row decoder provided corresponding to the other memory array.

Referring to FIG. 12, according to the circuit operation shown in FIG. 9, storage data of all memory cells are read in the order of addresses from only one of memory arrays 1a and 1b in a single erase verify cycle. At the time when a data-unerased memory cell is detected by this reading, data "1" is set in latch circuit 300 provided corresponding to a memory array including this data-unerased memory cell. Accordingly, an erase pulse is applied to only this memory array in an erase cycle subsequent to the erase verify cycle. If such data reading and such application of an erase pulse are repeated first with respect to one memory array 1a, data of all memory cells in memory array 1a are completely erased. Thus, in the final erase verify cycle for memory array 1a, storage data of all the memory cells in memory array 1a are read without the data "1" being latched in latch circuit 300 corresponding to memory array 1a. After that, as described above, the reading of storage data from all memory cells in the other memory array 1b and the application of an erase pulse to memory array 1b are repeated until latch data of latch circuit 300 corresponding to memory array 1b in the end of the single erase verify cycle is "0".

A detailed description will now be given of the circuit operation of the flash EEPROM of this embodiment in the erase mode, with reference to FIG. 9.

First, in the beginning of the erase mode, verifying/erasing control circuits 17a and 17b reset both count values of block counter 820 and address counter 19 to a minimum value "0" (operation steps S32 and S33). In the erase verify cycle, verifying/erasing control circuits 17a and 17b first reset respective latch circuits 300 in erase voltage applying circuits 18a and 18b (operation step S35). Then, storage data of a memory cell designated by a row address signal and a column address signal output from address counter 19 at that time is read by a corresponding one of sense amplifiers 18a and 18b from a memory array designated by a block address signal output from block counter 820 (operation step S36). Verifying/erasing control circuit 17a or 17b corresponding to the memory array designated by the block address signal subsequently determines whether or not the read data indicates that "erasing is completed" (operation step S37). If the result of the determination in operation step S37 is "YES", the corresponding verifying/erasing control circuit immediately increments the count value of address counter 19 (operation step S39). However, if the result of the determination in operation step S37 is "NO", the corresponding verifying/erasing control circuit sets the data "1" in latch circuit 300 in corresponding erase voltage applying circuit 18a or 18b (operation step S38), and then increments the count value of address counter 19.

The circuit operations in operation steps S36–S40 are repeated until the count value incremented in operation step S39 exceeds a value indicating the final address in the memory array designated by the block address signal. If the incremented count value exceeds the value indicating the final address, then the circuit operation in the erase cycle (operation steps S34 and S41) is carried out. More specifically, the erase pulse output from high voltage pulse source 700 is applied only from ones of erase voltage applying circuits 18a and 18b which includes latch circuit 300 in which the data "1" is set, to corresponding ones of memory arrays 1a and 1b.

When the storage data of all the memory cells in the memory array designated by the block address signal are completely erased by the repetition of the circuit operations in operation steps S34–S41, a circuit operation in operation steps S42 and S43 is carried out since latch circuit 300 is in a reset state at the end of the erase verify cycle. That is, verifying/erasing control circuits 17a and 17b increment the count value of block counter 820. If this incremented count value does not exceed a value corresponding to the block address signal designating memory array 1b, then circuit operations in operation steps S33–S43 restart. If the data erase for memory arrays 1a and 1b is completed by the repetition of the circuit operations in operation steps S33–S43, then since the incremented count value exceeds the value corresponding to the address signal designating memory array 1b, all the circuit operations in the erase mode are completed.

Referring to FIG. 15, according to the circuit operation shown in FIG. 10, in a single erase verify cycle, data are read in the order of addresses until a data-unerased memory cell X is detected from only one of memory arrays 1a and 1b. At the time when the data-unerased memory cell is detected, data "1" is set in latch circuit 300 provided corresponding to the memory array including this data-unerased memory cell. Accordingly, an erase pulse is applied only to this memory array in the erase cycle subsequent to the erase verify cycle. In the next erase verify cycle subsequent to this erase cycle, data reading starts from the address of the memory cell detected in the previous erase verify cycle. If such data reading and such application of the erase pulse are repeated first with respect to memory array 1a, the data of all the memory cells in memory array 1a are completely erased. Thus, in the final erase verify cycle for memory array 1a, storage data of all the memory cells corresponding to subsequent addresses of the address of the memory cell detected in the previous erase verify cycle are sequentially read from memory array 1a, without the data "1" being set in latch circuit 300 corresponding to memory array 1a. After that, the above-described data reading and application of the erase pulse are repeated for the other memory array 1b until latch data of latch circuit 300 is "0" at the time when storage data of the memory cell of the final address in memory array 1b is read.

A detailed description will now be given of a circuit operation in the erase mode of the flash EEPROM of this embodiment, with reference to FIG. 10.

First, in the beginning of the erase mode, verifying/erasing control circuits 17a and 17b reset respective count values of block counter 820 and address counter 19 to a minimum value "0" (operation steps S44 and S45). In the erase verify cycle, verifying/erasing control circuits 17a and 17b first reset respective latch circuits 300 in erase voltage applying circuits 18a and 18b, respectively (operation step S47). Then, storage data of a memory cell designated by a row address signal and a column address signal output from address counter 19 at that time is read by a corresponding one of sense amplifiers 18a and 18b from a memory array designated by a block address signal output from block counter 820 at that time (operation step S48).

Verifying/erasing control circuit 17a or 17b corresponding to the memory array designated by the block address signal subsequently determines whether or not the read data indicates that "erasing is completed" (operation step S49).

If the result of the determination in operation step S49 is "NO", the corresponding verifying/erasing control circuit sets data "1" in latch circuit 300 in a corresponding one of erase voltage applying circuits 18a and 18b (operation step S50). If the data "1" is set in latch circuit 300, then the circuit operation in the erase cycle is executed (operation step S46). More specifically, an erase pulse is output from high voltage pulse source 700, so that this output erase pulse is applied only from one of erase voltage applying circuits 18a and 18b which includes latch circuit 300 in which the data "1" is set, to a corresponding one of memory array 1a and 1b.

If the result of the determination in operation step S49 is "YES" by the circuit operation in operation steps S46–S49, then verifying/erasing control circuits 17a and 17b increment the count value of address counter 19 (operation step S51).

The circuit operations in operation steps S46–S52 are repeated until the incremented count value exceeds a value indicating the final address in the memory array designated by the block address signal. If the incremented count value exceeds the value indicating the final address, then the count value of block counter 820 is incremented by verifying/erasing control circuits 17a and 17b (operation step S53). If this incremented count value exceeds a value corresponding to an address signal designating memory array 1b, then the circuit operations in operation steps S45–S54 restart (operation step S54). When the data erase for memory arrays 1a and 1b is completed by the repetition of the circuit operations in operation steps S45–S54, then since the incremented count value exceeds the value corresponding to the address signal designating memory array 1b, all the circuit operations in the erase mode are completed.

Also when the data erase for memory arrays 1a and 1b is carried out time-sequentially, it is naturally possible that an erase verify for each of memory arrays 1a and 1b is carried out in a unit of one memory cell row, as in the case of the embodiment described with reference to FIG. 5. In this case, a block counter may be added to, for example, the configuration of FIG. 5.

In the two embodiments as above described, circuitry for erase verifying (verifying/erasing control circuits 17a and 17b of FIG. 1; comparators 101a and 101b of FIG. 5) may be provided one for memory arrays 1a and 1b in common.

Also in any embodiments shown in FIGS. 4, 6, 7, 9 and 10, data "1" is set in any latch circuits 300, 102a, 102b and 103 for permitting/prohibiting the application of erase pulses to memory arrays 1a and 1b before the erase mode starts so that the erase pulses may necessarily be applied to memory arrays 1a and 1b in a single erase mode (operation steps S1, S12, S23, S32 and S44). In addition, in FIGS. 4, 6, 7, 9 and 10, an operation step for data writing prior to data erasing, which is carried out when the erase mode starts, is not represented.

The description has been given on the case where one memory array is divided into two sub-arrays in any of the foregoing embodiments; however, the memory array may be divided into an arbitrary number of sub-arrays of two or more. If the embodiment of FIG. 4 is applied to the case where a memory array is divided into a large number of sub-arrays, the embodiment becomes more effective since the number of all erase pulses, which are applied until the data erase for all the sub-arrays is completed, is reduced, and also the time required for the data erase to be completed is reduced. In addition, the embodiment of FIG. 10 becomes more effective when applied to the case where an erase verify for a plurality of sub-arrays should be carried out time-sequentially since the total time required for the erase verify is reduced.

If an erase/erase verifying is carried out in such methods as shown in FIGS. 11, 13 and 14, i.e., for all sub-arrays at the same time, a total amount of current generated in response to each application of erase pulses by a tunnel phenomenon and an inter-band tunneling phenomenon in memory cells attains a maximum value in the case where data-erase defective memory cells are detected from all the sub-arrays. Thus, if a data erase is carried out in such methods, a maximum value of power consumption in each application of erase pulses is a very high value corresponding to the total amount of current generated by the tunnel phenomenon and the inter-band tunneling phenomenon in all the memory cells in one memory cell array.

Figure 16:
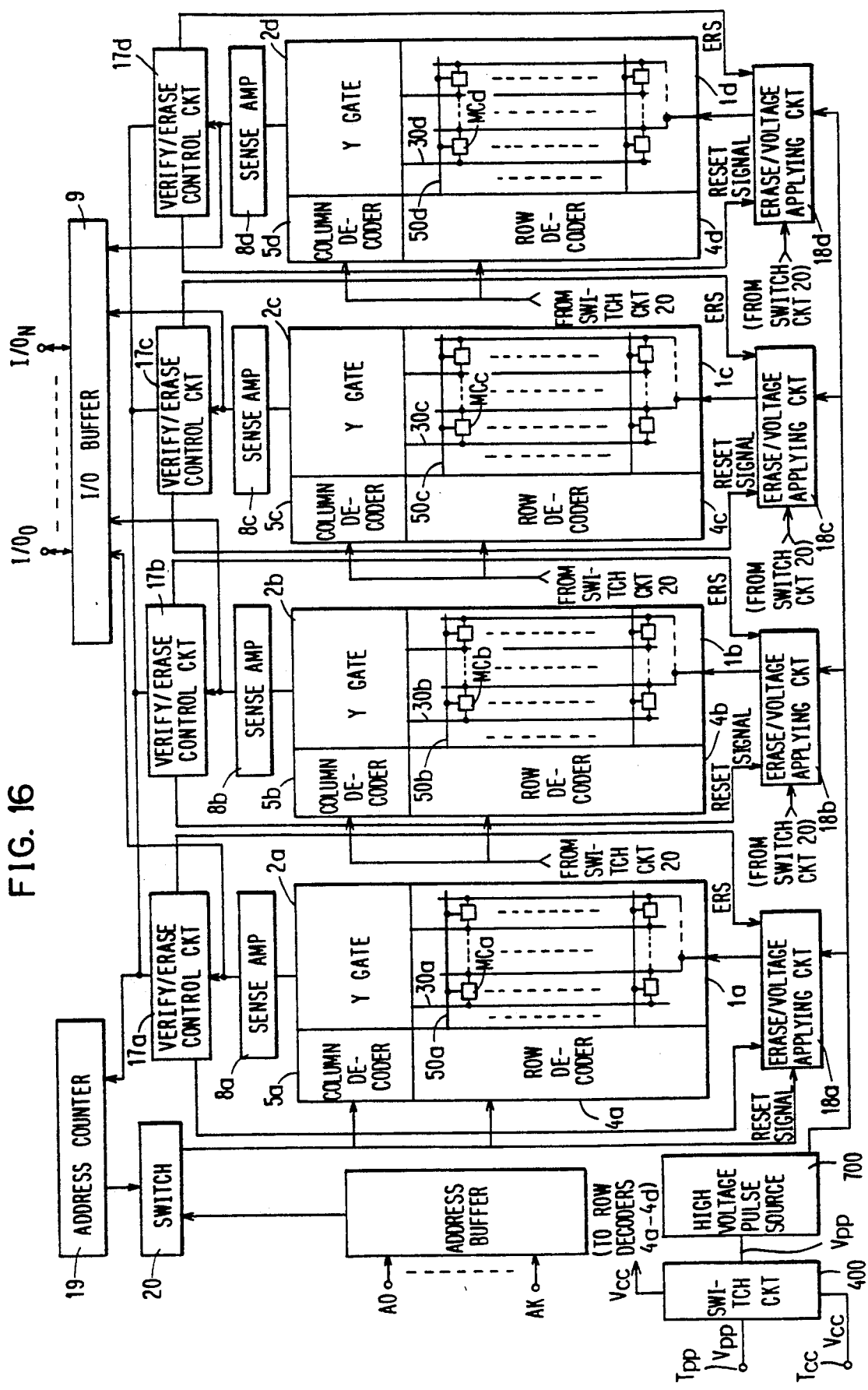
FIG. 16 is a schematic block diagram showing an overall structure of a flash EEPROM according to still another embodiment of the present invention.
Figure 17:
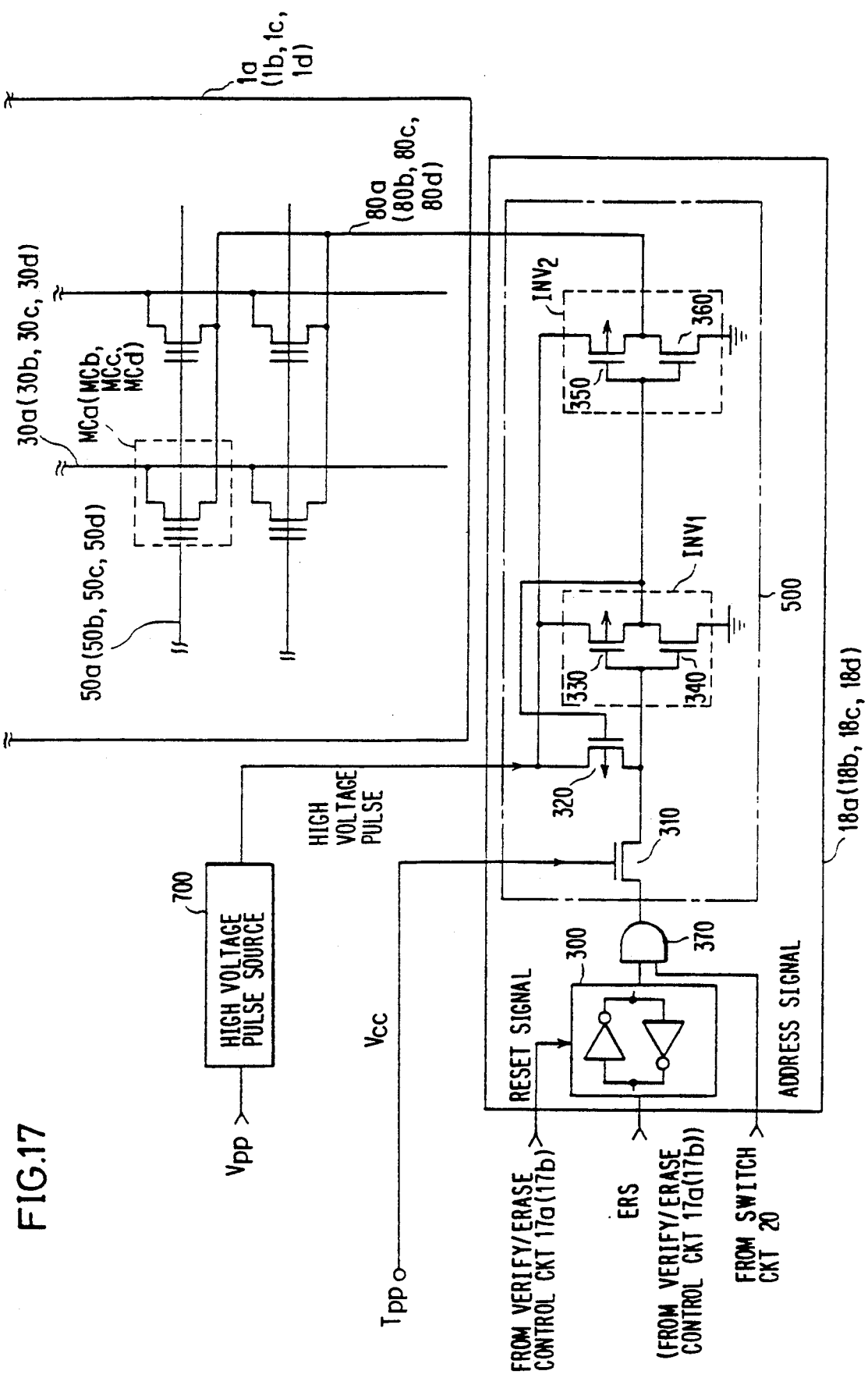
FIG. 17 is a circuit diagram showing a detailed structural example of an erase voltage applying circuit of FIG. 16.

FIG. 16 is a schematic block diagram showing an overall structure of an EEPROM in which the maximum value of power consumption in each erase pulse application can be reduced and showing still another embodiment of the present invention. FIG. 17 is a circuit diagram showing a detailed structural example of erase voltage applying circuits 18a–18d of FIG. 16.

Referring to FIG. 16, in this flash EEPROM, a memory cell array is divided into four sub-arrays 1a–1d. Like the cases of the above-described series of embodiments, respective sub-arrays 1a–1d include word lines 50a–50d, bit lines 30a–30d, memory cells MCa–MCd provided at crossing points of these word lines and bit lines, and source lines 80a–80d to which respective sources of all the memory cells are commonly connected.

Four Y gates 2a–2d, four row decoders 4a–4d, four column decoders 5a–5d, four verifying/erasing control circuits 17a–17d, four sense amplifiers 8a–8d and four erase voltage applying circuits 18a–18d are provided corresponding to those four sub-arrays 1a–1d. The difference between the flash EEPROM of this embodiment and that of FIG. 1 is that in the flash EEPROM of this embodiment, a block select/mask circuit 800 is not provided and an output of switch circuit 20 is applied to erase voltage applying circuits 18a–18d as well as column decoders 5a–5d and row decoders 4a–4d. Since the configuration of and the operation of peripheral circuits of the memory array are identical to those in the case of the flash EEPROM shown in FIG. 1 except for the above-described difference, a description thereof will not be repeated here.

In this embodiment, in an erase mode, an address signal applied from address counter 19 via switch circuit 20 to column decoder 5a and row decoder 4a is identical to an address signal applied from address counter 19 via switch circuit 20 to column decoder 5b and row decoder 4b. Further, in the erase mode, an address signal applied from address counter 19 via switch circuit 20 to column decoder 5c and row decoder 4c is identical to an address signal applied from address counter 19 via switch circuit 20 to column decoder 5d and row decoder 4d.

Thus, in the erase mode, data are simultaneously read from sub-arrays 1a and 1b, and data are also read simultaneously from sub-arrays 1c and 1d. In other words, four sub-arrays 1a-1d are divided into first and second groups. Two out of four sub-arrays 1a-1d are included in the first group, while the other two sub-arrays are included in the second group. An erase verify is carried out in a unit of group.

Specifically, a logic value of a least significant bit of the address signal generated from address counter 19 indicates which one of the first and second groups is selected. If the logic value of the least significant bit is "0", then the first group is selected. If the logic value of the least significant bit is "1", then the second group is selected. More specifically, if the first group includes sub-arrays 1a and 1b and the second group includes sub-arrays 1c and 1d, an address signal in which the least significant bit is in a logic high level is applied to column decoders 5a and 5b and row decoders 4a and 4b when the least significant bit signal is in a logic low level. Conversely, when a most significant bit signal is in a logic high level, an address signal in which the least significant bit is in a logic high level is applied to column decoders 5c and 5d and row decoders 4c and 4d. In response to the address signal in which the least significant bit is in a logic high level, column decoders 5a-5d and row decoders 4a-4d select word lines 50a-50d and bit lines 30a-30d corresponding to combinations of logic values from the first order bit to the most significant bit, respectively.

Erase voltage applying circuits 18a and 18b are each supplied with a least significant bit signal of the address signal applied to column decoders 5a and 5b and row decoders 4a and 4b. Similarly, erase voltage applying circuits 18c and 18d are each supplied with a least significant bit signal of the address signal applied to column decoders 5c and 5d and row decoders 4c and 4d.

Each of erase voltage applying circuits 18a-18d has such a configuration as shown in FIG. 17 that a 2-input AND gate 370 is added to the configuration (FIG. 2) of erase voltage applying circuit 18a (18b) of FIG. 1. AND gate 370 is provided between latch circuit 300 and high voltage switch 500. AND gate 370 receives as inputs, an output of latch circuit 300 and the least significant bit signal of the address signal applied to a corresponding column decoder and a corresponding row decoder.

Accordingly, in the erase cycle, only when data "1" is set in latch circuit 300 and the corresponding least significant bit signal is in a high logic level, erase pulses are applied from high voltage switch 500 to a corresponding one of sub-arrays 1a and 1b. As described above, the address signal applied to erase voltage applying circuits 18a and 18b does not attain a logic high level simultaneously with the address signal applied to erase voltage applying circuits 18c and 18d. Thus, in the erase cycle, sub-arrays 1a and 1b do not receive erase pulses simultaneously with sub-arrays 1c and 1d. Accordingly, the total amount of current generated by the tunnel phenomenon and the inter-band tunneling phenomenon in memory cells is reduced in each application of erase pulses.

For example, even if data-erase defective memory cells are detected from all of four sub-arrays 1a-1d so that data "1" is set in latch circuit 300 of each of erase voltage applying circuits 18a-18d, erase pulses are output only from two erase voltage applying circuits 18a and 18b or the other two erase voltage applying circuits 18c and 18d each including AND gate 370 receiving a logic high level address signal.

Thus, the maximum value of the total amount of current generated by each erase pulse application is a value corresponding to the number of memory cells included in two sub-arrays, which value is substantially lower than the values obtained in the erase/erase verify in the methods shown in FIGS. 11, 13 and 14. Consequently, power consumption in data erase is reduced.

A description will now be made on the actual operation in the erase mode of the flash EEPROM of this embodiment with reference to FIGS. 16-20.

Figure 19:
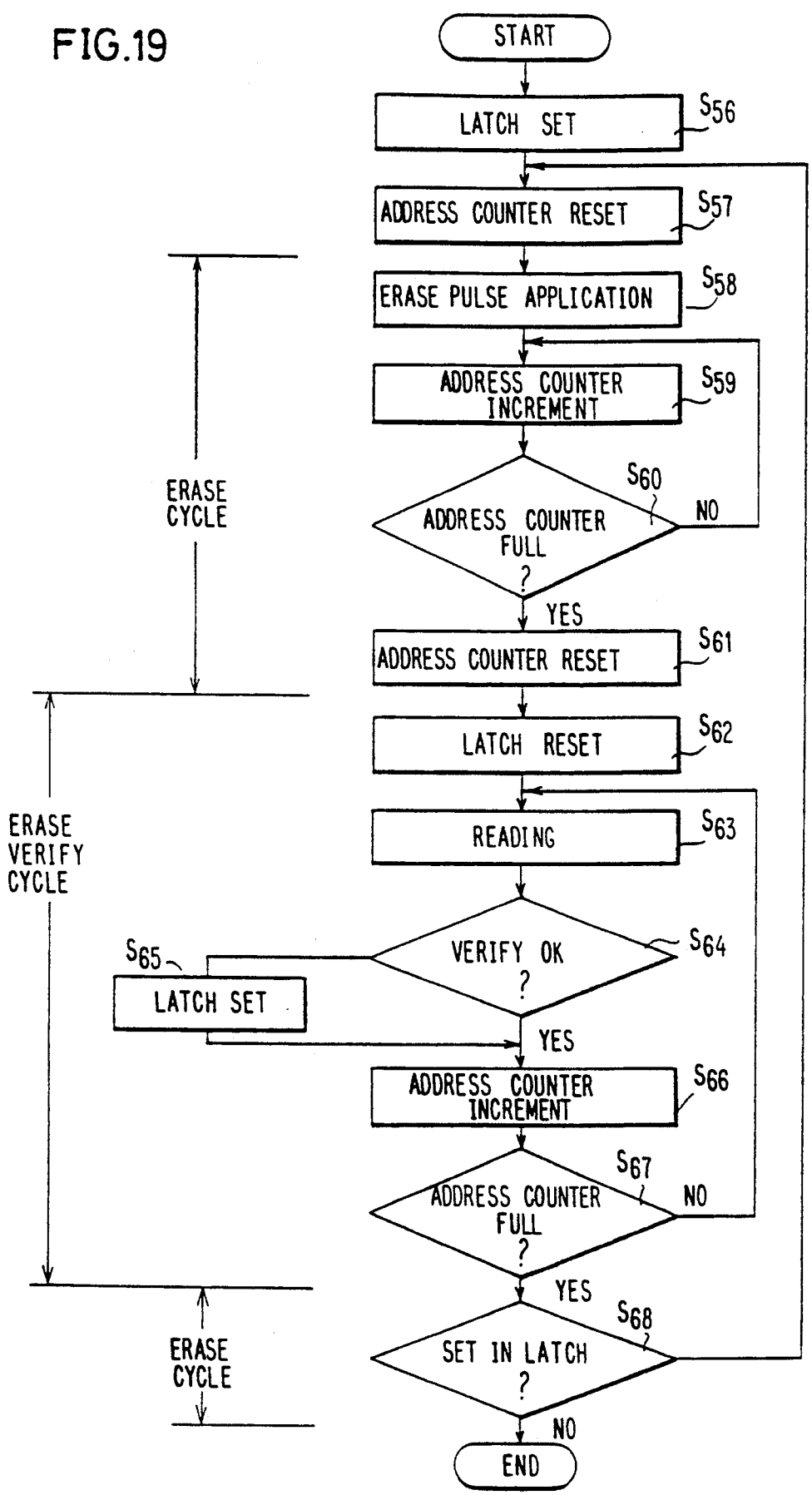
FIG. 19 is an operation flow chart for explaining an operation in an erase mode of the flash EEPROM shown in FIG. 16.
Figure 20:
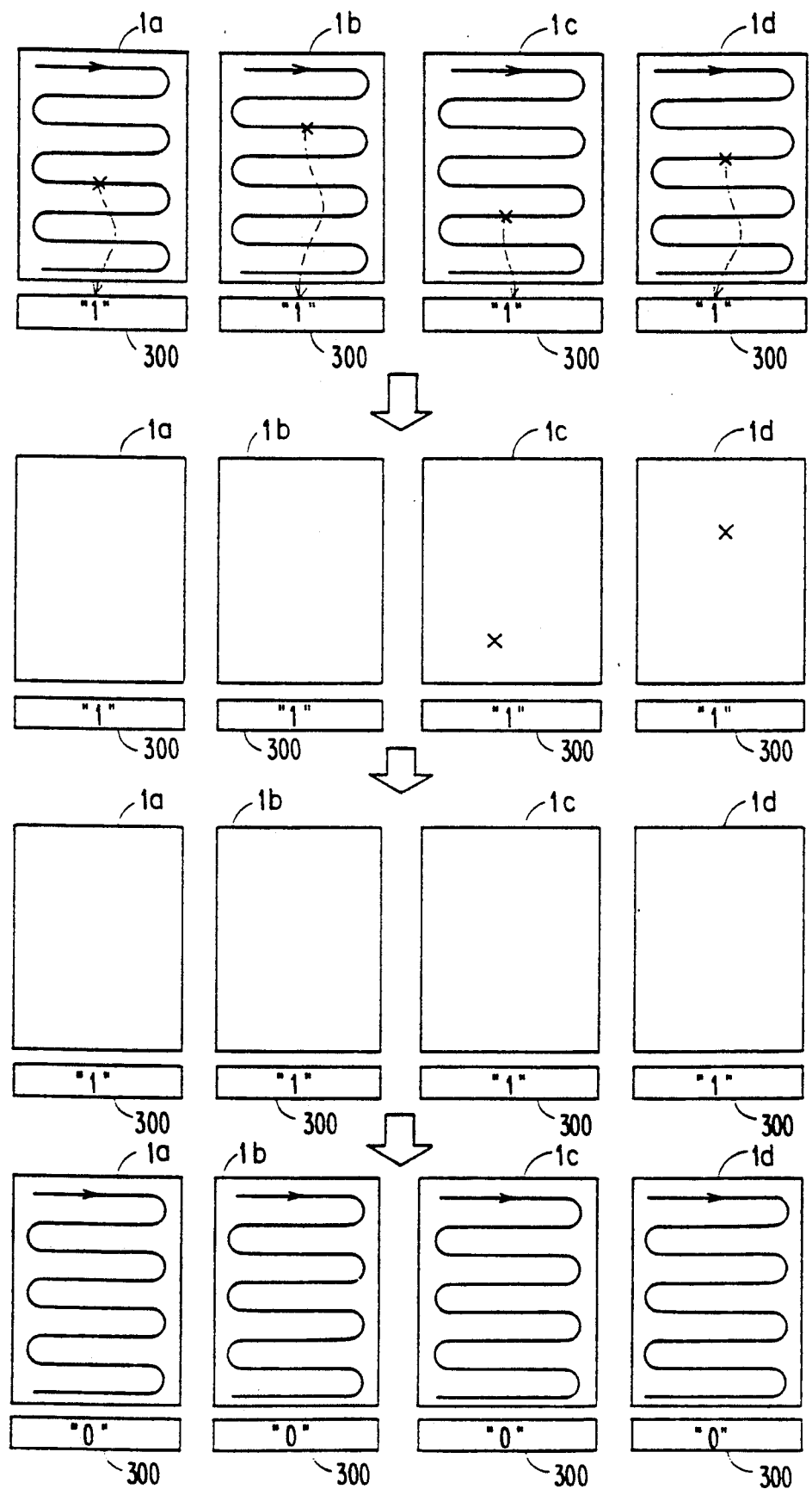
FIG. 20 is a diagram conceptionally showing an erase/erase verifying method implemented in the flash EEPROM of FIG. 16.

FIG. 18 is a timing chart of output signals of high voltage pulse source 700 and erase voltage applying circuits 18a-18d and an address signal. FIG. 19 is an operation flow chart showing the flow of the operation of this flash EEPROM in the erase mode. FIG. 20 is a diagram conceptionally representing an erase/erase verify method realized by this flash EEPROM.

First, in the beginning of the erase mode, like the case of the flash EEPROM shown in FIG. 1, data "1" are set in latch circuits 300 in all erase voltage applying circuits 18a-18d (operation step S56), and the count value of address counter 19 is reset (operation step S57).

In the erase cycle, since high voltage pulse source 700 outputs a high voltage $V_{PP}$ as a one-shot pulse of a predetermined width, erase pulses are applied only from two erase voltage applying circuits 18a and 18b or 18c and 18d including latch circuits 300, in which the data "1" is set, and corresponding to the first group or the second group which corresponds to a logic value of the least significant bit of the address signal generated by address counter 19 at that time (operation step S58). Then, verifying/erasing control circuits 17a-17d instruct address counter 19 to increment a count value (operation step S59). Accordingly, the logic value of the least significant bit of the address signal generated by address counter 19 is inverted.

The circuit operations in operation steps S58 and S59 are repeated until the values of bits associated with the group selection out of the count value of address counter 19 become maximal (until the logic value of the least significant bit is "1" in this embodiment) (operation step S60). Thus, in each erase cycle, erase pulses are applied simultaneously to one or both of two sub-arrays 1a and 1b in the first group, and then applied simultaneously to one or both of two sub-arrays 1c and 1d in the second group.

As the result of the above-described circuit operations in each erase cycle, high voltage $V_{PP}$ pulses are twice continuously output from high voltage pulse source 700 as shown in FIG. 18(a). The least significant bit signal of the address signal generated by address counter 19 is, as shown in FIG. 18(b), in a logic low level during a period when a first pulse is output, while the signal is in a logic high level during a period when a second pulse is output. Thus, erase pulses applied to one or both of sub-arrays 1a and 1b are generated in the first half of each erase cycle as shown in FIG. 18(c), while those applied to one or both of sub-arrays 1c and 1d are generated in the latter half of each erase cycle as shown in FIG. 18(d).

When the value of bits associated with the group selection is maximal, the count value of address counter 19 is reset by the verifying/erasing control circuits (operation step S61), so that a circuit operation for the erase verify cycle starts.

The circuit operations (operation steps S62-S67) of this flash EEPROM in the erase verify cycle are identical to those (operation steps S4-S9 in FIG. 4) of the flash EEPROM shown in FIG. 1. Thus, in each erase verify cycle, data of all the memory cells are read from sub-arrays 1a-1d. Thus, when each erase verify cycle is completed, data corresponding to the presence/absence of a data-erase defective memory cell in respective ones of sub arrays 1a-1d are latched in respective latch circuits 300 of four erase voltage applying circuits 18a-18d. Consequently, in an erase cycle subsequent to an arbitrary erase verify cycle, erase pulses are applied only to any of four sub-arrays 1a-1d which includes the data-erase defective memory cell.

The circuit operations in operation steps S57-S67 are repeated until data "1" is no longer set in any latch circuits 300 of four erase voltage applying circuits 18a-18d when the erase verify cycle is completed (operation step S68).

As the result of the foregoing circuit operations, in the erase mode, as shown in FIG. 20, for example, the erase verify is carried out in the order of addresses for all the memory cells in all sub-arrays 1a-1d. After that, first, data of data-erase defective memory cells (denoted with X in the figure) detected in sub-arrays 1a and 1b are completely erased. Then, data of data-erase defective memory cells detected in sub-arrays 1c and 1d are completely erased. Accordingly, at the time when the erase verify is completed for all the memory cells in all sub-arrays 1a-1d, since the data "1" are not latched in any latch circuits 300, the data erase for all sub-arrays 1a-1d is completed. As a matter of course, if the data of the detected data-erase defective memory cells are not completely erased by a single re-application of erase pulses, the steps of data reading from all the sub-arrays and applying the erase pulses to every two sub-arrays are executed again.

As has been described heretofore, a method in which sub-arrays are divided into a plurality of groups and erase pulses are then applied time-sequentially to each group can be applied also to the case where data is read only from some memory cells in each sub-array in each erase verify cycle.

While such a case that one group includes two sub-arrays has been described in this embodiment, the number of sub-arrays included in one group may be an arbitrary number not less than 2.

The description has been made on the case where the data erase is carried out by the application of high voltage pulses to the sources of the memory cells in any of the foregoing embodiments; however, the present invention is, of course, applicable to a flash EEPROM employing other data erasing methods, for example, in which a memory cell is formed in a P well, and high voltage pulses are applied to the P well, to perform a data erase and in which high voltage pulses are applied to a control gate and a drain, to perform the data erase.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a memory cell array including a plurality of memory cells,
      said memory cell array divided into first and second blocks,
      each of said memory cells including a field effect semiconductor element enabling both data writing and data erasing electrically;
   first high voltage applying means for collectively applying high voltages to said memory cells included in said first block for the data erasing;
   second high voltage applying means for collectively applying high voltages to said memory cells included in said second block for said data erasing;
   reading means for reading storage data of said memory cells included in said first and second blocks to detect incomplete data erasing; and
   control means for selectively enabling said first and second high voltage applying means in response to the data read by said reading means.

2. The nonvolatile semiconductor memory device according to claim 1, wherein
   said reading means comprises
   first reading means responsive to completion of the application of the high voltages from said first high voltage applying means to said all memory cells included in said first block for individually reading data from said memory cells included in said first block, and
   second reading means responsive to completion of the application of the high voltages from said second high voltage applying means to said memory cells included in said second block for individually reading data from said all memory cells included in said second block.

3. The nonvolatile semiconductor memory device according to claim 2, wherein
   said control means comprises
   first control means for selectively enabling said first high voltage means responsive to the data read from said memory cells included in said first block by said first reading means, and
   second control means for selectively enabling said second high voltage means responsive to the data read from said memory cells included in said second block by said second reading means.

4. A nonvolatile semiconductor memory device comprising:
   a memory cell array including a plurality of memory cells,
   said memory cell array divided into first and second blocks,
   each of said memory cells including a field effect semiconductor element enabling both data writing and data erasing electrically;
   first high voltage applying means for collectively applying high voltages to said memory cells included in said first block for the data erasing;

second high voltage applying means for collectively applying high voltages to said memory cells included in said second block for said data erasing;

reading means for reading storage data of said memory cells included in said first and second blocks to detect incomplete data erasing; and control means for selectively enabling said first and second high voltage applying means in response to the data read by said reading means, wherein said reading means comprises first reading means responsive to completion of the application of the high voltages from said first high voltage applying means to said all memory cells included in said first block for individually reading data from said memory cells included in said first block, and second reading means responsive to completion of the application of the high voltages from said second high voltage applying means to said memory cells included in said second block for individually reading data from said all memory cells included in said second block;

said control means comprises first control means for selectively enabling said first high voltage means responsive to the data read from said memory cells included in said first block by said first reading means, and second control means for selectively enabling said second high voltage means responsive to the data read from said memory cells included in said second block by said second reading means;

said first high voltage applying means comprises high voltage pulse generating means for generating said high voltages for a predetermined short period in response to each of the completion of the data reading from said memory cells in said first block by said first reading means and the completion of the data reading from said memory cells in said second block by said second reading means, and first electric path means for transmitting an output of said high voltage pulse generating means to said memory cells included in said first block; and said second high voltage applying means comprises said high voltage pulse generating means, and second electric path means for transmitting the output of said high voltage pulse generating means to said memory cells included in said second block.

5. The nonvolatile semiconductor memory device according to claim 4, wherein said first control means comprises first enable signal generating means responsive to the data read from each of said memory cells in said first block by said first reading means for detecting that a data erase is incomplete with respect to each said memory cell, to generate a first enable signal for enabling said first high voltage applying means, first storage means for storing said first enable signal generated by said first enable signal generating means until said first reading means reads data from said all memory cells in said first block, and first activating means for activating said first electric path means in response to said first enable signal stored in said first storage means and said high voltages generated by said high voltage pulse generating means; and said second control means comprises second enable signal generating means responsive to the data read from each of said memory cells in said second block by said second reading means for detecting that a data erase is incomplete with respect to each said memory cell, to generate a second enable signal for enabling said second high voltage applying means, second storage means for storing said second enable signal generated by said second enable signal generating means until said second reading means reads data from said all memory cells in said second block, and second activating means for activating said second electric path means in response to said second enable signal stored in said second storage means and said high voltages generated by said high voltage pulse generating means.

6. The nonvolatile semiconductor memory device according to claim 5, wherein each of said first and second storage means includes a latch circuit including two inverters connected in reverse parallel.

7. The nonvolatile semiconductor memory device according to claim 6, wherein said first activating means comprises first inverter means for receiving as an input an output of said first storage means and provided between the output of said high voltage pulse generating means and ground;

said second activating means comprises second inverter means for receiving as an input an output of said second storage means and provided between the output of said high voltage pulse generating means and ground;

said first electric path means comprises a first switching element having a conduction state thereof controlled in response to an output of said first inverter means and provided between the output of said high voltage pulse generating means and said all memory cells in said first block; and said second electric path means comprises a second switching element having a conduction state thereof controlled in response to an output of said second inverter means and provided between the output of said high voltage pulse generating means and said all memory cells in said second block.

8. The nonvolatile semiconductor memory device according to claim 2, wherein timing of reading data from said memory cells in said first block by said first reading means coincides with timing of reading data from said memory cells in said second block by said second reading means.

9. A nonvolatile semiconductor memory device comprising:

a memory cell array including a plurality of memory cells, said memory cell array divided into first and second blocks, each of said memory cells including a field effect semiconductor element enabling both data writing and data erasing electrically;

first high voltage applying means for collectively applying high voltages to said memory cells included in said first block for the data erasing;

second high voltage applying means for collectively applying high voltages to said memory cells included in said second block for said data erasing;

reading means for reading storage data of said memory cells included in said first and second blocks to detect incomplete data erasing; and control means for selectively enabling said first and second high voltage applying means in response to the data read by said reading means, wherein said reading means comprises first reading means responsive to completion of the application of the high voltages from said first high voltage applying means to said all memory cells included in said first block for individually reading data from said memory cells included in said first block, and second reading means responsive to completion of the application of the high voltages from said second high voltage applying means to said memory cells included in said second block for individually reading data from said all memory cells included in said second block;

said control means comprises first control means for selectively enabling said first high voltage means responsive to the data read from said memory cells included in said first block by said first reading means, and second control means for selectively enabling said second high voltage means responsive to the data read from said memory cells included in said second block by said second reading means;

timing of reading data from said memory cells in said first block by said first reading means does not coincide with timing of reading data from said memory cells in said second block by said second reading means.

10. The nonvolatile semiconductor memory device according to claim 1, wherein said memory cells are arranged in a plurality of rows in said first block;

said memory cells are arranged in a plurality of rows in said second block; and said reading means comprises first reading means responsive to completion of the application of the high voltages from said first high voltage applying means to all of said memory cells included in said first block for individually reading data from the memory cells of one row in said first block, and second reading means responsive to completion of the application of the high voltages from said second high voltage applying means to all of said memory cells included in said second block for individually reading data from the memory cells of one row in said second block.

11. The nonvolatile semiconductor memory device according to claim 10, wherein said first high voltage applying means comprises high voltage pulse generating means for generating said high voltages for a predetermined short period, and first electric path means for transmitting an output of said high voltage pulse generating means to said all memory cells included in said first block; and said second high voltage applying means comprises said high voltage pulse generating means, and second electric path means for transmitting the output of said high voltage pulse generating means to said all memory cells included in said second block.

12. A nonvolatile semiconductor memory device comprising:

a memory cell array including a plurality of memory cells, said memory cell array divided into first and second blocks, each of said memory cells including a field effect semiconductor element enabling both data writing and data erasing electrically;

first high voltage applying means for collectively applying high voltages to said memory cells included in said first block for the data erasing;

second high voltage applying means for collectively applying high voltages to said memory cells included in said second block for said data erasing;

reading means for reading storage data of said memory cells included in said first and second blocks to detect incomplete data erasing; and control means for selectively enabling said first and second high voltage applying means in response to the data read by said reading means, wherein said reading means comprises first reading means responsive to completion of the application of the high voltages from said first high voltage applying means to said all memory cells included in said first block for individually reading data from said memory cells included in said first block; and second reading means responsive to completion of the application of the high voltages from said second high voltage applying means to said memory cells included in said second block for individually reading data from said all memory cells included in said second block;

said control means comprises first control means for selectively enabling said first high voltage means responsive to the data read from said memory cells included in said first block by said first reading means, and second control means for selectively enabling said second high voltage means responsive to the data read from said memory cells included in said second block by said second reading means;

said control means comprises first control means responsive to the data read from all of said memory cells of one row in said first block by said first reading means for controlling said first high voltage applying means to enable or disable said first high voltage applying means, second control means responsive to the data read from all of said memory cells of one row in said second block by said second reading means for controlling said second high voltage applying means to enable or disable said second high voltage applying means, and third control means responsive to the data read by said first reading means and the data read by said second reading means for controlling said high voltage pulse generating means to enable or disable said high voltage pulse generating means.

13. The nonvolatile semiconductor memory device according to claim 12, wherein said first control means comprises first determining means responsive to the data read from each of said memory cells of one row in said first block by said first reading means for determining whether or not a data erase is completed with respect to each said memory cell, and first storage means responsive to a determination output of said first determining means indicating that the data erase is incomplete for storing a first enable signal for enabling said first high voltage applying means until said first reading means reads data from all of said memory cells of one row in said first block, wherein said first electric path means is activated in response to a high voltage generated by said high voltage pulse generating means and said first enable signal stored in said first storage means; and said second control means comprises second determining means responsive to the data read from each of said memory cells of one row in said second block by said second reading means for determining whether or not a data erase is completed with respect to each said memory cell, and second storage means responsive to a determination output of said second determining means indicating that the data erase is incomplete for storing a second enable signal for enabling said second high voltage applying means until said second reading means reads data from all of said memory cells of one row in said second block, wherein said second electric path means is activated in response to the high voltage generated by said high voltage pulse generating means and said second enable signal stored in said second storage means.

14. The nonvolatile semiconductor memory device according to claim 13, wherein said third control means comprises third storage means responsive to each of the determination output of said first determining means indicating that the data erase is incomplete and the determination output of said second determining means indicating that the data erase is incomplete for storing a third enable signal for enabling said high voltage pulse generating means until the data reading from said all memory cells of one row in said first block by said first reading means is completed and until the data reading from said all memory cells of one row in said second block by said second reading means is completed; and said high voltage pulse generating means is enabled in response to said third enable signal stored in said third storage means at each of the time when the data reading from said all memory cells of one row in said first block by said first reading means is completed and the time when the data reading from said all memory cells of one row in said second block by said second reading means is completed.

15. The nonvolatile semiconductor memory device according to claim 5, wherein said reading means comprises means for generating an internal address signal for selecting a memory cell from which data is to be read from each of said first and second blocks independently of an external address signal, and means responsive to said internal address signal generated by said internal address generating means for selecting one memory cell from each of said first and second blocks.

16. The nonvolatile semiconductor memory device according to claim 15, wherein said first control means further comprises first internal address controlling means responsive to a storage signal of said first storage means, latched upon the completion of the data reading from said all memory cells in said first block by said reading means, being not said first enable signal for controlling said internal address generating means so as to update said internal address signal; and said second control means further comprises second internal address controlling means responsive to a storage signal of said second storage means, latched upon the completion of the data reading from said all memory cells in said second block by said reading means, being not said second enable signal for controlling said internal address generating means so as to update said internal address signal.

17. The nonvolatile semiconductor memory device according to claim 14, wherein said reading means comprises means for generating an internal row address signal for selecting one of said rows from each of said first and second blocks independently of an external address signal, means for generating an internal column address signal for sequentially selecting one by one said memory cells arranged in the row corresponding to said internal row address signal independently of said external address signal, and means responsive to said internal row address signal generated by said internal row address generating means and said internal column address signal generated by said internal column address generating means for selecting one memory cell from each of said first and second blocks.

18. The nonvolatile semiconductor memory device according to claim 17, wherein said third control means further comprises means for controlling said internal row address generating means to update said internal row address signal in response to the storage signal of said third storage means, latched at each of the time when the data reading from said all memory cells of one row in said first block by said reading means is completed and the time when the data reading from said all memory cells of one row in said second block by said reading means, being not said third enable signal.

19. A nonvolatile semiconductor memory fabricated on a single chip, comprising:

first and second arrays of memory cells, each of said memory cells for storing data therein;

addressing means operable in a verification mode for serially selecting said memory cells;

erase error detecting means for detecting a nonerasure of ones of said memory cells serially selected by said addressing means operated in said verification mode and in response to detecting a nonerasure of one of said memory cells of said first array setting a first flag and in response to detecting a nonerasure of one of said memory cells of said second array setting a second flag; and erasing means responsive to said flags for respectively erasing data stored in memory cells of said first array and memory cells of said second array.

20. The nonvolatile semiconductor memory according to claim 19, further comprising control means and wherein said addressing means and erasing means are responsive to respective control signals supplied by said control means, said control means supplying an initial erase signal to said erasing means for erasing all of said memory cells and supplying a verification initiation signal to said addressing means for operating said addressing means in said verification mode.

21. A nonvolatile semiconductor memory fabricated on a single chip, comprising:

first and second arrays of memory cells, each of said memory cells for storing data therein;

first and second addressing means operable in a verification mode for serially selecting said memory cells in respective ones of said first and second arrays;

first erase error detecting means for detecting a nonerasure of ones of said memory cells of said first array serially selected by said first addressing means operated in said verification mode and, in response, supplying a first erase signal;

second erase error detecting means for detecting a nonerasure of ones of said memory cells of said second array serially selected by said second addressing means operated in said verification mode and, in response, supplying a second erase signal;

first erasing means for erasing data stored in said first memory cell array in response to said first erase signal; and second erasing means for erasing data stored in said second memory cell array in response to said second erase signal.

22. A nonvolatile semiconductor memory fabricated on a single chip, comprising:

first and second arrays of memory cells, each of said memory cells for storing data therein;

addressing means operable in a verification mode for supplying an address signal for serially selecting said memory cells;

erase error detecting means for detecting a nonerasure of ones of said memory cells serially selected by said addressing means operated in said verification mode and, in response to detecting a nonerasure of one of said memory cells, supplying an erase signal; and erasing means responsive to said erase signal for selectively erasing data stored in memory cells of said first array and memory cells of said second array.

23. The nonvolatile semiconductor memory according to claim 22, wherein said addressing means includes an address register and means responsive to an address increment signal for incrementing address data stored in said address register; and wherein said erase error detecting means supplies said address increment signal to said addressing means in response to detecting an erasure of one of said memory cells.

24. The nonvolatile semiconductor memory according to claim 22, wherein said addressing means supplies an address limit signal to said erasing means, said erasing means responsive to said address limit signal for selectively erasing data stored in memory cells of said first array and memory cells of said second array and, in response to erasing data, providing an address reset signal to said addressing means for resetting said addressing means to select a first memory cell of one of said memory cell arrays.

25. The nonvolatile semiconductor memory according to claim 22, further including means for storing a predetermined logic level in said memory cells of said first and second arrays.

26. The nonvolatile semiconductor memory device according to claim 1, wherein storage data of said memory cells can be erased in block or collectively.

27. The nonvolatile semiconductor memory device according to claim 26, wherein each said field effect semiconductor element enables data writing by utilizing avalanche breakdown and data erasing by utilizing a tunnel phenomenon.

28. The nonvolatile semiconductor memory device according to claim 27, wherein each said field effect semiconductor element has a stacked gate metal oxide semiconductor structure.

29. The nonvolatile semiconductor memory according to claim 19, wherein each of said memory cells includes a field effect semiconductor element enabling both data writing and data erasing electrically.

30. The nonvolatile semiconductor memory according to claim 29, wherein each said field effect semiconductor element enables data writing by utilizing avalanche breakdown and data erasing by utilizing a tunnel phenomenon.

31. The nonvolatile semiconductor memory according to claim 30, wherein each said field effect semiconductor element has a stacked gate metal oxide semiconductor structure.

32. The nonvolatile semiconductor memory according to claim 21, wherein each of said memory cells includes a field effect semiconductor element enabling both data writing and data erasing electrically.

33. The nonvolatile semiconductor memory according to claim 32, wherein each said field effect semiconductor element enables data writing by utilizing avalanche breakdown and data erasing by utilizing a tunnel phenomenon.

34. The nonvolatile semiconductor memory according to claim 33, wherein each said field effect semiconductor element has a stacked gate metal oxide semiconductor structure.

35. The nonvolatile semiconductor memory according to claim 22, wherein each of said memory cells includes a field effect semiconductor element enabling both data writing and data erasing electrically.

36. The nonvolatile semiconductor memory according to claim 33, wherein each said field effect semiconductor element enables data writing by utilizing avalanche breakdown and data erasing by utilizing a tunnel phenomenon.

37. The nonvolatile semiconductor memory according to claim 34, wherein each said field effect semiconductor element has a stacked gate metal oxide semiconductor structure.

38. A data erasing method of a nonvolatile semiconductor memory device comprising a memory cell array including a plurality of memory cells, said memory cell array divided into at least a first block and a second block, each of said memory cells including a field effect semiconductor element enabling data writing by utilizing avalanche breakdown and enabling data erasing by utilizing a tunnel phenomenon, said method comprising the steps of:

collectively applying high voltages for causing said tunnel phenomenon to all of said memory cells included in said first block for data erasing;

collectively applying high voltages for causing said tunnel phenomenon to all of said memory cells included in said second block for said data erasing;

reading storage data of said memory cells included in said first block in response to the application of said high voltages to said first block;

reading storage data of said memory cells included in said second block in response to the application of said high voltages to said second block; and individually and selectively applying said high voltages for causing said tunnel phenomenon to said all memory cells included in said first block and said all memory cells included in said second block in response to the data read by said reading.

39. The method of claim 38, wherein
said storage data reading step comprises
the step of individually reading data from said all memory cells in said first block, and
the step of individually reading data from said all memory cells in said second block.

40. The method of claim 38, wherein
said storage data reading step comprises
the step of individually reading data from ones of said memory cells in said first block, and
the step of individually reading data from ones of said memory cells in said second block.

41. A data erasing method for a nonvolatile semiconductor memory fabricated on a single chip including first and second arrays of memory cells, each of said memory cells for storing data therein, comprising the steps of:

serially selecting said memory cells;

detecting a nonerasure of ones of said serially selected memory cells; and respectively erasing data stored in memory cells of said first array and memory cells of said second array in response to said detecting step detecting a nonerasure in said respective arrays.

42. The data erasing method according to claim 41, further comprising the steps of:

initializing an address register;

detecting an erasure of a selected one of said memory cells;

incrementing said address register in response to said step of detecting an erasure of a selected one of said memory cells, wherein said step of serially selecting said memory cells is responsive to address data stored in said address register.

43. The data erasing method of claim 41 further comprising
an initial step of storing a predetermined logic level signal in said memory cells of both said arrays.

44. The data erasing method of claim 41 further comprising
an initial step of erasing said memory cells of both said arrays.

45. A data erasing method for a nonvolatile semiconductor memory fabricated on a single chip including first and second arrays of memory cells, each of said memory cells for storing data therein, comprising the steps of:

serially selecting said memory cells of said first array;

detecting a nonerasure of ones of said serially selected memory cells;

erasing data stored in memory cells of said first array in response to detection of a nonerasure in said first array in said detecting step;

serially selecting said memory cells of said second array in response to detection of a nonerasure of ones of said serially selected memory cells;

detecting a nonerasure of ones of said serially selected memory cells of said second array; and erasing data stored in memory cells of said second array in response to detection of a nonerasure in said second array in said detecting step.

46. The data erasing method of claim 45, further comprising
an initial step of storing a predetermined logic level signal in said memory cells of both said arrays.

47. The data erasing method of claim 45, further comprising
an initial step of erasing said memory cells of both said arrays.

48. A nonvolatile semiconductor memory device comprising:

a memory cell array including a plurality of memory cells, said memory cell array divided into first, second, third and fourth blocks, each of said memory cells including a field effect semiconductor element enabling both data writing and data erasing electrically;

first high voltage applying means for collectively applying high voltages to said memory cells included in said first block for said data erasing;

second high voltage applying means for collectively applying high voltages to said memory cells included in said second block for said data erasing;

third high voltage applying means for collectively applying high voltages to said memory cells included in said third block for said data erasing;

fourth high voltage applying means for collectively applying high voltages to said memory cells included in said fourth block for said data erasing;

reading means for reading storage data of said memory cells included in said first, second, third and fourth blocks to detect incomplete data erasing;

designating means for designating one set out of a first set of said first and second blocks and a second set of said third and fourth blocks;

first control means responsive to said designating means designating said first set for selectively enabling said first and second high voltage applying means in response to the data read by said reading means; and second control means responsive to said designating means designating said second set for selectively enabling said third and fourth high voltage applying means in response to the data read by said reading means.

49. The nonvolatile semiconductor memory device according to claim 48, wherein
said reading means comprises
first reading means responsive to completion of the application of the high voltages from said first high voltage applying means to all said memory cells included in said first block for individually reading data from said memory cells included in said first block, second reading means responsive to completion of the application of the high voltages from said second high voltage applying means to all said memory cells included in said second block for individually reading data from said memory cells included in said second block, third reading means responsive to completion of the application of the high voltages from said third high voltage applying means to all said memory cells included in said third block for individually reading data from said memory cells included in said third block, and fourth reading means responsive to completion of the application of the high voltages from said fourth high voltage applying means to all said memory cells included in said fourth block for individually reading data from said memory cells included in said fourth block.

50. The nonvolatile semiconductor memory device according to claim 48, wherein said first control means comprises
first enabling means responsive to said designating means designating said first set for selectively enabling said first high voltage applying means in response to the data read from said memory cells included in said first block by said first reading means, and second enabling means responsive to said designating means designating said first set for selectively enabling said second high voltage applying means in response to the data read from said memory cells included in said second block by said first reading means; and said second control means comprises
third enabling means responsive to said designating means designating said second set for selectively enabling said third high voltage applying means in response to the data read from said memory cells included in said third block by said third reading means, and fourth enabling means responsive to said designating means designating said second set for selectively enabling said fourth high voltage applying means in response to the data read from said memory cells included in said fourth block by said fourth reading means.

51. The nonvolatile semiconductor memory device according to claim 50, wherein said designating means comprises
designate signal generating means for sequentially generating a first designate signal for designating said first set and a second designate signal for designating said second set;

said first high voltage applying means comprises
high voltage pulse generating means for sequentially generating first and second pulses of said high voltages in response to the completion of the data reading from said memory cells in said first, second, third and fourth blocks by said first, second, third and fourth reading means, and first electric path means for transmitting an output of said high voltage pulse generating means to said memory cells included in said first block;

said second high voltage applying means comprises
said high voltage pulse generating means, and second electric path means for transmitting the output of said high voltage pulse generating means to said memory cells included in said second block;

said third high voltage applying means comprises
said high voltage pulse generating means, and third electric path means for transmitting the output of said high voltage pulse generating means to said memory cells included in said third block;

said fourth high voltage applying means comprises
said high voltage generating means, and fourth electric path means for transmitting the output of said high voltage pulse generating means to said memory cells included in said fourth block;

said first enabling means comprises
first enable signal generating means responsive to the data read from each of said memory cells in said first block by said first reading means for detecting that a data erasure is incomplete with respect to each said memory cell, to generate a first enable signal for enabling said first high voltage applying means, first storage means for storing said first enable signal generated by said first enable signal generating means until said first, second, third and fourth reading means read data from said memory cells in said first, second, third and fourth blocks, respectively, and first activating means for activating said first electric path means in response to said first enable signal stored in said first storage means and said first designate signal generated by said designating means;

said second enabling means comprises
second enable signal generating means responsive to the data read from each of said memory cells in said second block by said second reading means for detecting that a data erasure is incomplete with respect to each said memory cell, to generate a second enable signal for enabling said second high voltage applying means, second storage means for storing said second enable signal generated by said second enable signal generating means until said first, second, third and fourth reading means read data from said memory cells in said first, second, third and fourth blocks, respectively, and second activating means for activating said second electric path means in response to said second enable signal stored in said second storage means and said first designate signal generated by said designating means;

said third enabling means comprises
third enable signal generating means responsive to the data read from each of said memory cells in said third block by said third reading means for detecting that a data erasure is incomplete with respect to each said memory cell, to generate a third enable signal for enabling said third high voltage applying means, third storage means for storing said third enable signal generated by said third enable signal generating means until said first, second, third and fourth reading means read data from said memory cells in said first, second, third and fourth blocks, respectively, and third activating means for activating said third electric path means in response to said third enable signal stored in said third storage means and said second designate signal generated by said designating means; and said fourth enabling means comprises fourth enable signal generating means responsive to the data read from each of said memory cells in said first block by said fourth reading means for detecting that a data erasure is incomplete with respect to each said memory cell, to generate a fourth enable signal for enabling said fourth high voltage applying means, fourth storage means for storing said fourth enable signal generated by said fourth enable signal generating means until said first, second, third and fourth reading means read data from said memory cells in said first, second, third and fourth blocks, respectively, and fourth activating means for activating said fourth electric path means in response to said fourth enable signal stored in said fourth storage means and said second designate signal generated by said designating means.

52. The nonvolatile semiconductor memory device according to claim 51, wherein each of said first, second, third and fourth storage means includes a latch circuit including two inverters connected in reverse parallel;

said first activating means comprises a first logic circuit for receiving as inputs an output of said latch circuit in said first storage means and said first designate signal generated by said designate signal generating means, and first inverter means provided between the output of said high voltage pulse generating means and ground for receiving as an input an output of said first logic circuit;

said first electric path means comprises a first switching element controlled in response to an output of said first inverter means and provided between the output of said high voltage pulse generating means and said all memory cells in said first block;

said second activating means comprises a second logic circuit for receiving as inputs an output of said latch circuit in said second storage means and said first designate signal generated by said designate signal generating means, and second inverter means provided between the output of said high voltage pulse generating means and ground for receiving as an input an output of said second logic circuit;

said second electric path means comprises a second switching element controlled in response to an output of said second inverter means and provided between the output of said high voltage pulse generating means and said all memory cells in said second block;

said third activating means comprises a third logic circuit for receiving as inputs an output of said latch circuit in said third storage means and said second designate signal generated by said designate signal generating means, and third inverter means provided between the output of said high voltage pulse generating means and ground for receiving as an input an output of said third logic circuit;

said third electric path means comprises a third switching element controlled in response to an output of said third inverter means and provided between the output of said high voltage pulse generating means and said all memory cells in said third block;

said fourth activating means comprises a fourth logic circuit for receiving as inputs an output of said latch circuit in said fourth storage means and said second designate signal generated by said designate signal generating means, and fourth inverter means provided between the output of said high voltage pulse generating means and ground for receiving as an input an output of said fourth logic circuit; and said fourth electric path means comprises a fourth switching element controlled in response to an output of said fourth inverter means and provided between the output of said high voltage pulse generating means and said all memory cells in said fourth block.

53. The nonvolatile semiconductor memory device according to claim 52, wherein each of said first, second, third and fourth logic circuits comprises a two-input AND gate.

54. A data erasing method for a nonvolatile semiconductor memory fabricated on a single chip including first, second, third and fourth arrays of memory cells, each of said memory cells for storing data therein, comprising the steps of:

serially selecting said memory cells of said first array to detect a nonerasure of ones of the memory cells;

serially selecting said memory cells of said second array to detect a nonerasure of ones of the memory cells;

serially selecting said memory cells of said third array to detect a nonerasure of ones of the memory cells;

serially selecting said memory cells of said fourth array to detect a nonerasure of ones of the memory cells;

simultaneously selecting said first and second arrays;

erasing data stored in memory cells of said simultaneously selected first and second arrays in response to the detection of the nonerasure in said first and second arrays;

simultaneously selecting said third and fourth arrays; and erasing data stored in memory cells of said simultaneously selected third and fourth arrays in response to the detection of the nonerasure in said third and fourth arrays.

55. A non-volatile semiconductor memory device comprising:

a memory cell array (1a, 1b; 1a, 1b, 1c, 1d) having a plurality of memory cells (MCa, MCb; MCa, MCb, MCc, MCd) each comprising a field effect semiconductor element enabling both data writing and data erasing electrically, said memory cell array being divided into first and second blocks (1a), (1b); (1a), (1b), (1d), each including a high-voltage applying means for supplying a high-voltage to all memory cells in the corresponding block for erasing data stored therein;

reading means for reading data of said memory cells in said blocks to detect incomplete data erasing in a memory cell;

and control means for selectively activating said high-voltage applying means in response to the data read indicating incomplete data erasing.

* * * * *